(12) United States Patent
Huang et al.

(10) Patent No.: US 11,038,095 B2
(45) Date of Patent: Jun. 15, 2021

(54) SYSTEMS AND METHODS FOR FABRICATION OF SUPERCONDUCTING INTEGRATED CIRCUITS

(71) Applicant: D-WAVE SYSTEMS INC., Burnaby (CA)

(72) Inventors: Shuiyuan Huang, Eagan, MN (US); Byong H. Oh, San Jose, CA (US); Douglas P. Stadtler, Morgan Hill, CA (US); Edward G. Sterpka, Brentwood, CA (US); Paul I. Bunyk, New Westminster (CA); Jed D. Whittaker, Vancouver (CA); Fabio Altomare, North Vancouver (CA); Richard G. Harris, North Vancouver (CA); Colin C. Enderud, Vancouver (CA); Loren J. Swenson, San Jose, CA (US); Nicolas C. Ladizinsky, Burnaby (CA); Jason J. Yao, San Ramon, CA (US); Eric G. Ladizinsky, Manhattan Beach, CA (US)

(73) Assignee: D-WAVE SYSTEMS INC., Burnaby (CA)

( * ) Notice: Subject to any disclaimer, the term of this patent is extended or adjusted under 35 U.S.C. 154(b) by 0 days.

(21) Appl. No.: 16/481,788

(22) PCT Filed: Jan. 31, 2018

(86) PCT No.: PCT/US2018/016237
§ 371 (c)(1),
(2) Date: Jul. 29, 2019

(87) PCT Pub. No.: WO2018/144601
PCT Pub. Date: Aug. 9, 2018

(65) Prior Publication Data
US 2020/0144476 A1     May 7, 2020

Related U.S. Application Data
(60) Provisional application No. 62/453,358, filed on Feb. 1, 2017.

(51) Int. Cl.
*H01L 27/18* (2006.01)
*H01L 39/24* (2006.01)
(Continued)

(52) U.S. Cl.
CPC .... *H01L 39/2406* (2013.01); *H01L 21/76891* (2013.01); *H01L 23/528* (2013.01);
(Continued)

(58) Field of Classification Search
CPC ............. H01L 39/2406; H01L 27/18; H01L 21/76891; H01L 23/5223; H01L 23/53257; H01L 23/53285
See application file for complete search history.

(56) References Cited

U.S. PATENT DOCUMENTS

| | | | |
|---|---|---|---|
| 6,362,638 B1 | 3/2002 | Ashton et al. | |
| 8,437,818 B1 * | 5/2013 | Tolpygo | H01L 23/48 505/190 |

(Continued)

FOREIGN PATENT DOCUMENTS

| | | | | |
|---|---|---|---|---|
| WO | 2016/183213 A1 | 11/2016 | | |
| WO | WO-2016183213 A1 * | 11/2016 | ........... | H03B 15/003 |

OTHER PUBLICATIONS

Lomatch et al., "Multilayer Josephson Junction Flux Quantum Devices", Jun. 2, 1995, IEEE Trans. Appl. Superconductivity, vol. 5 No. 2 (Year: 1995).*

(Continued)

*Primary Examiner* — Thomas L Dickey
(74) *Attorney, Agent, or Firm* — Cozen O'Connor

(57) ABSTRACT

Various techniques and apparatus permit fabrication of superconductive circuits. A superconducting integrated cir-
(Continued)

cuit comprising a superconducting stud via, a kinetic inductor, and a capacitor may be formed. Forming a superconducting stud via in a superconducting integrated circuit may include masking with a hard mask and masking with a soft mask. Forming a superconducting stud via in a superconducting integrated circuit may include depositing a dielectric etch stop layer. Interlayer misalignment in the fabrication of a superconducting integrated circuit may be measured by an electrical vernier. Interlayer misalignment in the fabrication of a superconducting integrated circuit may be measured by a chain of electrical verniers and a Wheatstone bridge. A superconducting integrated circuit with three or more metal layers may include an enclosed, matched, on-chip transmission line. A metal wiring layer in a superconducting integrated circuit may be encapsulated.

25 Claims, 32 Drawing Sheets

(51) Int. Cl.
  H01L 21/768  (2006.01)
  H01L 23/522  (2006.01)
  H01L 23/528  (2006.01)
  H01L 23/532  (2006.01)
  H01L 39/12   (2006.01)
(52) U.S. Cl.
  CPC ...... H01L 23/5223 (2013.01); H01L 23/5226 (2013.01); H01L 23/5227 (2013.01); H01L 23/53257 (2013.01); H01L 23/53285 (2013.01); H01L 27/18 (2013.01); H01L 39/12 (2013.01)

(56) References Cited

U.S. PATENT DOCUMENTS

| | | | |
|---|---|---|---|
| 9,520,180 | B1 | 12/2016 | Mukhanov et al. |
| 9,971,970 | B1* | 5/2018 | Rigetti ............... H01L 39/045 |
| 2002/0017906 | A1 | 2/2002 | Ho et al. |
| 2002/0190381 | A1* | 12/2002 | Herr .................. H01L 27/18 257/758 |
| 2003/0089987 | A1 | 5/2003 | Parikh |
| 2004/0155237 | A1 | 8/2004 | Kerber |
| 2004/0266209 | A1 | 12/2004 | Hinode et al. |
| 2008/0001699 | A1* | 1/2008 | Gardner .............. H01L 23/5227 336/200 |
| 2011/0089405 | A1 | 4/2011 | Ladizinsky et al. |
| 2014/0111242 | A1 | 4/2014 | Xie et al. |
| 2015/0119253 | A1* | 4/2015 | Yohannes ........... H01L 39/2493 505/190 |
| 2015/0236235 | A1 | 8/2015 | Ladizinsky et al. |
| 2019/0288176 | A1* | 9/2019 | Yoscovits ........... H01L 39/2493 |

OTHER PUBLICATIONS

Tolpygo et al., "Deep sub-micron stud-via technology of superconductor VLSI circuits," *Supercond. Sci. Technol.* 27:1-9, Jan. 14, 2014.
Tolpygo et al., "Advanced Fabrication Processes for Superconducting Very Large Scale Integrated Circuits," *IEEE Transactions on Applied Superconductivity* 26(3):1-10, Jan. 19, 2016.
International Search Report for PCT/US2018/016237, dated Jul. 2, 2018, 6 pages.
Written Opinion for PCT/US2018/016237, dated Jul. 2, 2018, 30 pages.
Extended European Search Report for EP 18747998.5, dated Sep. 3, 2020, 8 pages.

* cited by examiner

SYSTEMS AND METHODS FOR FABRICATION OF SUPERCONDUCTING INTEGRATED CIRCUITS

BACKGROUND

Field

The present systems and methods relate to the fabrication of integrated circuits for superconducting applications.

Description of the Related Art

Approaches to Quantum Computation

There are several general approaches to the design and operation of quantum computers. One such approach is the "circuit" or "gate" model of quantum computation. In this approach, qubits are acted upon by sequences of logical gates that are the compiled representation of an algorithm. Much research has been focused on developing qubits with sufficient coherence to form the basic elements of circuit model quantum computers.

Another approach to quantum computation involves using the natural physical evolution of a system of coupled quantum devices as a computational system. This approach may not make use of quantum gates and circuits. Instead, the computational system may start from a known initial Hamiltonian with an easily accessible ground state and be controllably guided to a final Hamiltonian whose ground state represents the answer to a problem. This approach does not typically require long qubit coherence times and may be more robust than the circuit model. Examples of this type of approach include adiabatic quantum computation and quantum annealing.

Quantum Processor

Quantum computations may be performed using a quantum processor, such as a superconducting quantum processor. A superconducting quantum processor may comprise a superconducting integrated circuit including a number of qubits and associated local bias devices, for instance two or more superconducting qubits. Further details on systems and methods of exemplary superconducting quantum processors that may be fabricated according to the present systems and methods are described in U.S. Pat. Nos. 7,135,701, 7,418, 283, 7,533,068, 7,619,437, 7,639,035, 7,898,282, 8,008,942, 8,190,548, 8,195,596, 8,283,943, and US Patent Application Publication 2011-0022820, each of which is incorporated herein by reference in its entirety.

Superconducting Qubits

Superconducting qubits are a type of superconducting quantum device that can be included in a superconducting integrated circuit. Superconducting qubits can be separated into several categories depending on the physical property used to encode information. For example, they may be separated into charge, flux and phase devices. Charge devices store and manipulate information in the charge states of the device. Flux devices store and manipulate information in a variable related to the magnetic flux through some part of the device. Phase devices store and manipulate information in a variable related to the difference in superconducting phase between two regions of the device. Recently, hybrid devices using two or more of charge, flux and phase degrees of freedom have been developed.

Superconducting integrated circuits may include single flux quantum (SFQ) devices. The integration of SFQ devices with superconducting qubits is discussed in, for example, U.S. Pat. Nos. 7,876,248, 8,035,540, 8,098,179, and US Patent Publication Number 2011-0065586, each of which is incorporated herein by reference in its entirety.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use in fabricating both superconducting quantum processors and superconducting classical processors.

Integrated Circuit Fabrication

Traditionally, the fabrication of superconducting integrated circuits has not been performed at state-of-the-art semiconductor fabrication facilities. This may be due to the fact that some of the materials used in superconducting integrated circuits can contaminate the semiconductor facilities. For instance, gold may be used as a resistor in superconducting circuits, but gold can contaminate a fabrication tool used to produce CMOS wafers in a semiconductor facility. Consequently, superconducting integrated circuits containing gold are typically not processed by tools which also process CMOS wafers.

Superconductor fabrication has typically been performed in research environments where standard industry practices could be optimized for superconducting circuit production. Superconducting integrated circuits are often fabricated with tools that are similar to those traditionally used to fabricate semiconductor chips or integrated circuits. Due to issues unique to superconducting circuits, not all semiconductor processes and techniques are necessarily transferable to superconductor chip manufacture. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Any impurities within superconducting chips may result in noise which can compromise or degrade the functionality of the individual devices, such as superconducting qubits, and of the superconducting chip as a whole. Since noise is a serious concern to the operation of quantum computers, measures should be taken to reduce dielectric noise wherever possible.

The art of integrated circuit fabrication typically involves multiple processes that may be sequenced and/or combined to produce a desired effect. Exemplary systems and methods for superconducting integrated circuit fabrication that may be combined, in whole or in part, with at least some embodiments of the present systems and methods are described in US Patent Publication Number 2011-0089405, and US Patent Publication Number 2015-0119252 which are incorporated herein by reference in their entirety.

Etching

Etching removes layers of, for example, substrates, dielectric layers, oxide layers, electrically insulating layers and/or metal layers according to desired patterns delineated by photoresists or other masking techniques. Two exemplary etching techniques are wet chemical etching and dry chemical etching.

Wet chemical etching or "wet etching" is typically accomplished by submerging a wafer in a corrosive bath such as an acid bath. In general, etching solutions are housed in polypropylene, temperature-controlled baths. The baths are usually equipped with either a ring-type plenum exhaust ventilation or a slotted exhaust at the rear of the etch station. Vertical laminar-flow hoods are typically used to supply uniformly-filtered, particulate-free air to the top surface of the etch baths.

Dry chemical etching or "dry etching" is commonly employed due to its ability to better control the etching process and reduce contamination levels. Dry etching effectively etches desired layers through the use of gases, either by chemical reaction such as using a chemically reactive gas or through physical bombardment, such as plasma etching, using, for example, argon atoms.

Plasma etching systems have been developed that can effectively etch, for example, silicon, silicon dioxide, silicon nitride, aluminum, tantalum, tantalum compounds, chromium, tungsten, gold, and many other materials. Two types of plasma etching reactor systems are in common use—the barrel reactor system and the parallel plate reactor system. Both reactor types operate on the same principles and vary primarily in configuration only. The typical reactor consists of a vacuum reactor chamber made usually of aluminum, glass, or quartz. A radiofrequency or microwave energy source (referred to collectively as RF energy source) is used to activate fluorine-based or chlorine-based gases which act as etchants. Wafers are loaded into the chamber, a pump evacuates the chamber, and the reagent gas is introduced. The RF energy ionizes the gas and forms the etching plasma, which reacts with the wafers to form volatile products which are pumped away.

Physical etching processes employ physical bombardment. For instance, argon gas atoms may be used to physically bombard a layer to be etched, and a vacuum pump system is used to remove dislocated material. Sputter etching is one physical technique involving ion impact and energy transfer. The wafer to be etched is attached to a negative electrode, or "target," in a glow-discharge circuit. Positive argon ions bombard the wafer surface, resulting in the dislocation of the surface atoms. Power is provided by an RF energy source. Ion beam etching and milling are physical etching processes which use a beam of low-energy ions to dislodge material. The ion beam is extracted from an ionized gas (e.g., argon or argon/oxygen) or plasma, created by an electrical discharge.

Reactive ion etching (RIE) is a combination of chemical and physical etching. During RIE, a wafer is placed in a chamber with an atmosphere of chemically reactive gas (e.g., $CF_4$, $CCl_4$, $CHF_3$, and many other gases) at a low pressure. An electrical discharge creates an ion plasma with an energy of a few hundred electron volts. The ions strike the wafer surface vertically, where they react to form volatile species that are removed by the low pressure in-line vacuum system.

BRIEF SUMMARY

A method for fabricating a superconducting integrated circuit may be summarized as including depositing a first superconducting metal layer on a substrate, the first superconducting metal layer which is superconductive in a respective range of temperatures; patterning the first superconducting metal layer to form a first wiring layer, the first wiring layer including a first set of one or more superconducting traces; depositing a second superconducting metal layer to overlie at least a portion of the first wiring layer, the second superconducting metal layer which is superconductive in a respective range of temperatures; patterning the second superconducting metal layer to form a first plurality of superconducting stud vias in the second superconducting metal layer, each superconducting stud via of the first plurality of superconducting stud vias electrically coupled to at least one of the traces in the first set of one or more superconducting traces; and depositing a kinetic inductance layer to overlie at least one of the plurality of superconducting stud vias, wherein the kinetic inductance layer includes a material superconductive in a respective range of temperatures, the material which causes a larger proportion of energy stored in the kinetic inductance layer to be stored as kinetic inductance than magnetic inductance. Depositing a first superconducting metal layer on a substrate may include depositing a first superconducting metal layer on a substrate including silicon. Depositing a first superconducting metal layer may include depositing a first superconducting metal layer including at least one of niobium and aluminum. Depositing a first superconducting metal layer may include depositing a first superconducting metal layer consisting of niobium. Depositing a second superconducting metal layer may include depositing a second superconducting metal layer including at least one of aluminum and niobium. Depositing a kinetic inductance layer may include depositing a kinetic inductance layer comprising at least one of titanium nitride (TiN), niobium nitride (NbN), niobium titanium nitride (NbTiN), molybdenum nitride (MoN), and tungsten silicide (WSi). Depositing a kinetic inductance layer including at least one of titanium nitride (TiN), niobium nitride (NbN), niobium titanium nitride (NbTiN), molybdenum nitride (MoN), and tungsten silicide (WSi) may include depositing a kinetic inductance layer with a thickness in the range of 25 nm to 100 nm. Depositing a kinetic inductance layer may include depositing a kinetic inductance layer consisting of titanium nitride (TiN).

Depositing a kinetic inductance layer to overlie at least one superconducting stud via of the plurality of superconducting stud vias may include depositing a kinetic inductance layer to overlie at least two of the plurality of superconducting vias, and the method may further include patterning the kinetic inductance layer to form a kinetic inductor comprising two electrodes, each electrode formed by a respective superconducting stud via of the first plurality of superconducting stud vias, and each electrode electrically coupled to at least one of the traces in the first set of one or more superconducting traces.

The method may further include depositing a first passivation layer to overlie at least a portion of the kinetic inductor. Depositing a first passivation layer may include depositing an insulating layer comprising SiN. Depositing a first passivation layer may include depositing a first passivation layer comprising silicon nitride (SiN).

The method may further include depositing a third superconducting metal layer to overlie at least a portion of the first passivation layer, the third superconducting metal layer which is superconductive in a respective range of temperatures; and patterning the third superconducting metal layer to form a second wiring layer, the second wiring layer comprising a second set of one or more superconducting traces. Depositing a third superconducting metal layer may include depositing a third superconducting metal layer comprising niobium. Patterning the third superconducting metal layer may include patterning the third superconducting metal layer to electrically couple at least one of the traces in the second set of one or more superconducting traces to at least one of the traces in the first set of one or more superconducting traces by a respective superconducting stud via of the first plurality of stud vias. Patterning the third superconducting metal layer may include patterning the third superconducting metal layer to form a capacitor, the capacitor including a first electrode formed by a superconducting stud via of the first plurality of superconducting stud vias; and a second electrode formed by at least a portion of one of the traces in the second set of one or more superconducting traces, wherein the first and the second electrodes are separated by at least a portion of the first passivation layer, and by at least a portion of the kinetic inductance layer.

The method may further include depositing a fourth superconducting metal layer to overlie at least a portion of the second wiring layer, the fourth superconducting metal layer which is superconductive in a respective range of temperatures; and patterning the fourth superconducting metal layer to form a second plurality of superconducting stud vias, each superconducting stud via of the second plurality of superconducting stud vias electrically coupled to at least one of the traces in the second set of one or more superconducting traces.

The method may further include depositing a second passivation layer to overlie at least a portion of the fourth superconducting metal layer, either with or without an intermediary layer; depositing a fifth superconducting metal layer to overlie at least a portion of the second passivation layer, the fifth superconducting metal layer which is superconductive in a respective range of temperatures; and patterning the fifth superconducting metal layer to form a third wiring layer, the third wiring layer comprising a third set of one or more superconducting traces. Depositing a fifth superconducting metal layer may include depositing a fifth superconducting metal layer comprising at least one of niobium and aluminum. Patterning the fifth superconducting metal layer may include patterning the fifth superconducting metal layer to electrically couple at least one of the traces in the third set of one or more superconducting traces to at least one of the traces in the second set of one or more superconducting traces by a respective superconducting stud via of the second plurality of stud vias.

Patterning the fifth superconducting metal layer may include patterning the fifth superconducting metal layer to form a capacitor, the capacitor including a first electrode formed by at least a portion of one of the traces in the third set of one or more superconducting traces; and a second electrode formed by a superconducting stud via of the second plurality of superconducting vias, wherein the first and the second electrodes are separated by at least a portion of the second passivation layer.

A superconducting integrated circuit may be summarized as including a first wiring layer comprising a first set of one or more superconducting traces overlying a substrate, the first wiring layer which is superconductive in a respective range of temperatures; a first plurality of superconducting stud vias, the superconducting stud vias which are superconductive in a respective range of temperatures, each superconducting stud via of the first plurality of superconducting stud vias electrically coupled to one or more superconducting traces in the first set of one or more superconducting traces; and a kinetic inductance layer overlying at least one of the plurality of superconducting stud vias, wherein the kinetic inductance layer comprises a material superconductive in a respective range of temperatures, the material which causes a larger proportion of energy stored in the kinetic inductance layer to be stored as kinetic inductance than magnetic inductance. The substrate may include silicon. The first wiring layer may include niobium. The first wiring layer may include of niobium. The superconducting stud vias may include at least one of niobium and aluminum. The kinetic inductance layer may include titanium nitride (TiN). The kinetic inductance layer may have a thickness in the range of 25 nm to 100 nm.

The kinetic inductance layer may overlay at least two of the plurality of superconducting stud vias, and the superconducting integrated circuit may further include a passivation layer overlying at least a portion of the kinetic inductance layer, to form a kinetic inductor, the kinetic inductor comprising at least two electrodes, each electrode electrically coupled to at least one of the traces in the first set of one or more superconducting traces by a respective superconducting stud via of the first plurality of superconducting stud vias. The passivation layer may include silicon nitride (SiN).

The superconducting integrated circuit may further include a second wiring layer, the second wiring layer comprising a second set of one or more superconducting traces, the one or more superconducting traces of the second wiring layer which are superconductive in a respective range of temperatures. The second wiring layer may include niobium. At least one of the superconducting traces in the second set of one or more superconducting traces may be electrically coupled to at least one of the superconducting traces in the first set of one or more superconducting traces by at least one of the superconducting stud vias of the first plurality of superconducting stud vias.

The superconducting integrated circuit may further include a capacitor, the capacitor including a first electrode formed by at least a portion of one of the traces in the first set of one or more superconducting traces; and a second electrode formed by at least a portion of one of the traces in the second set of one or more superconducting traces, wherein the first and the second electrodes are separated by at least a portion of the passivation layer. The passivation layer may include an insulating layer. The insulating layer may include SiN.

The superconducting integrated circuit may further include a second plurality of superconducting stud vias which overlie at least a portion of the second wiring layer, each superconducting stud via of the second plurality of superconducting stud vias electrically coupled to at least one of the traces in the second set of one or more superconducting traces.

A method for fabricating a superconducting integrated circuit may be summarized as including depositing a first superconducting metal layer on a substrate, the first superconducting metal layer which is superconductive in a respective range of temperatures; patterning the first superconducting metal layer to form a wiring layer, the wiring layer comprising a set of one or more superconducting traces; depositing an etch stop layer to overlie at least a portion of the wiring layer, the etch stop layer which is superconductive in a respective range of temperatures; depositing a second superconducting metal layer to overlie at least a portion of the etch stop layer, the second superconducting metal layer which is superconductive in a respective range of temperatures; depositing a hard mask to overlie at least a first portion of the second superconducting metal layer; depositing a soft mask to overlie the first portion of the second superconducting metal layer and at least a second portion of the second superconducting metal layer, the second portion different to the first portion, the soft mask enclosing an upper surface and at least one lateral surface of the hard mask; etching at least a third portion of the second superconducting metal layer, the third portion different to the first and the second portions, which first and second portions are protected by the soft mask; and forming at least one superconducting stud via from the second superconducting metal layer, the superconducting stud via electrically coupled to at least one trace in the set of one or more superconducting traces. Forming at least one superconducting stud via from the second superconducting metal layer may include stripping the soft mask, and etching the second superconducting metal layer and the etch stop layer.

Depositing a first superconducting metal layer on a substrate may include depositing a first superconducting metal layer on a substrate comprising silicon. Depositing a first superconducting metal layer may include depositing a first superconducting metal layer consisting of niobium. Depositing a first superconducting metal layer may include depositing a first superconducting metal layer comprising niobium. Depositing an etch stop layer may include depositing a thin layer of aluminum. Depositing a second superconducting metal layer may include depositing a second superconducting metal layer comprising at least one of aluminum or niobium. Depositing a hard mask may include depositing a mask of silicon dioxide. Depositing a soft mask may include depositing a mask of photoresist.

A superconducting integrated circuit may be summarized as including a first metal layer comprising a first set of one or more superconducting traces overlying a substrate, the first metal layer which is superconductive in a respective range of temperatures; and a first plurality of superconducting stud vias electrically coupled to one or more of the superconducting traces in the first set of one or more superconducting traces, each of the superconducting stud vias comprising an etch stop layer and a second metal layer, the etch stop layer which overlies the wiring layer and which is superconductive in a respective range of temperatures, and the second metal layer which overlies the etch stop layer and which is superconductive in a respective range of temperatures. The substrate may include silicon. The first metal layer may consist niobium. The first metal layer may consist of niobium. The etch stop layer of the superconducting stud vias may include aluminum. The etch stop layer of the superconducting stud vias may include aluminum and the second metal layer of the superconducting stud vias may include at least one of niobium and aluminum.

The superconducting integrated circuit may further include a passivation layer of silicon nitride (SiN) that overlies the second metal layer of the superconducting stud vias.

The superconducting integrated circuit may further include a hard mask that temporarily overlies at least a first portion of the second metal layer during fabrication, and a soft mask that temporarily overlies the first portion of the second metal layer during fabrication and at least a second portion of the second metal layer, the second portion different to the first portion, the soft mask temporarily enclosing an upper surface and at least one lateral surface of the hard mask during fabrication of the superconducting integrated circuit.

A method for fabricating a superconducting integrated circuit may be summarized as including depositing a first superconducting metal layer on a substrate, the first superconducting metal layer which is superconductive in a respective range of temperatures; patterning the first superconducting metal layer to form a wiring layer comprising a first set of one or more superconducting traces; depositing a first dielectric layer to overlie at least a portion of the patterned first superconducting metal layer; polishing the first dielectric layer back to the patterned first superconducting metal layer; depositing a second dielectric layer to overlie at least a portion of a structure resulting from the polishing of the first dielectric layer back to the patterned first superconducting metal layer; masking the second dielectric layer; etching the masked second dielectric layer; depositing a second superconducting metal layer to overlie at least a portion of a structure resulting from the masking and the etching of the second dielectric layer, the second superconducting metal layer which is superconductive over a respective range of temperatures; patterning the second superconducting metal layer to form a first plurality of superconducting stud vias, each superconducting stud via of the first plurality of superconducting stud vias electrically coupled to at least one of the traces in the first set of one or more superconducting traces in the wiring layer; depositing a third dielectric layer to overlie at least a portion of the wiring layer; and polishing the third dielectric layer back to at least one superconducting via in the first plurality of superconducting stud vias.

Depositing a first superconducting metal layer on a substrate may include depositing a first superconducting metal layer on a substrate including silicon. Depositing a first superconducting metal layer may include depositing a first superconducting metal layer including at least one of niobium and aluminum. Depositing a first superconducting metal layer may include depositing a first superconducting metal layer consisting of niobium. Depositing a first dielectric layer may include depositing a first dielectric layer including silicon dioxide and polishing the first dielectric layer back to the patterned first superconducting metal layer includes chemical mechanical planarizing the first dielectric layer back to an upper surface of the first superconducting metal layer. Depositing a second dielectric layer may include depositing a layer of silicon dioxide. Depositing a second superconducting metal layer may include depositing a second superconducting metal layer including at least one of aluminum or niobium. Depositing a third dielectric layer may include depositing a layer of silicon dioxide and polishing the third dielectric layer back to the patterned superconducting studs may include chemical mechanical planarizing the third dielectric layer back to an upper surface of the patterned second superconducting metal layer.

The method may further include depositing a fourth dielectric layer to overlie at least a portion of a structure resulting from the polished third dielectric layer; masking the fourth dielectric layer; and etching the masked fourth dielectric layer.

The method may further include depositing a third superconducting metal layer to overlie at least a portion of the masked and etched fourth dielectric layer; and patterning the third superconducting metal layer to form a second set of one or more superconducting traces, the third superconducting metal layer electrically coupled to the first superconducting metal layer by at least one superconducting via of the first plurality of superconducting vias. Depositing a third superconducting metal layer may include depositing a third superconducting metal layer including niobium. Patterning the third superconducting metal layer may include patterning the third superconducting metal layer to electrically couple at least one of the traces in the second set of one or more superconducting traces to at least one of the traces in the first set of one or more superconducting traces by at least one superconducting via of the first plurality of superconducting vias.

Depositing a first superconducting metal layer on a substrate may include depositing a first primary superconducting metal layer; and depositing a first polish stop layer to overlie at least a portion of the first primary superconducting metal layer. Depositing a first primary superconducting metal layer may include depositing a layer of aluminum. Depositing a first polish stop layer may include depositing a layer of niobium. Polishing the first dielectric layer back to the patterned first superconducting metal layer may include polishing the first dielectric layer back to the first polish stop layer. Patterning the first superconducting metal layer to form a wiring layer including a first set of one or more superconducting traces may include patterning the first polish stop layer, and the first superconducting metal layer.

Depositing a second superconducting metal layer on a substrate may include depositing a second primary superconducting metal layer; and depositing a second polish stop layer to overlie at least a portion of the second primary superconducting metal layer. Depositing a second primary superconducting metal layer may include depositing a layer of aluminum. Depositing a second polish stop layer may include depositing a layer of niobium. Polishing the third dielectric layer back to the patterned second superconducting metal layer may include polishing the third dielectric layer back to the second polish stop layer. Patterning the second superconducting metal layer to form a first plurality of superconducting stud vias may include patterning the first polish stop layer, the second superconducting metal layer, and the second polish stop layer.

A superconducting integrated circuit may be summarized as including a substrate; a first set of one or more superconducting traces carried by the substrate; a first dielectric that resides in a plane with the one or more superconducting traces; a second dielectric that overlies at least a portion of a structure comprising the superconducting traces of the first set of one or more superconducting traces and the first dielectric; a first plurality of superconducting studs vias in a second superconducting metal layer, each superconducting stud via of the first plurality of superconducting stud vias electrically coupled to at least one of the traces in the first set of one or more superconducting traces; and a third dielectric that resides in a plane with the first plurality of superconducting stud vias. The substrate may be silicon. The superconducting traces of the first set of one or more superconducting traces may include niobium. The superconducting traces of the first set of one or more superconducting traces may consist of niobium. The first dielectric may include silicon dioxide. The second dielectric may include silicon dioxide. The first plurality of superconducting stud vias may include at least one of aluminum or niobium. The third dielectric may include silicon dioxide.

The superconducting integrated circuit may further include a fourth dielectric that overlies at least a portion of the third dielectric.

The superconducting integrated circuit may further include a second set of one or more superconducting traces, the second set of one or more superconducting traces electrically coupled to the first superconducting metal layer by at least one of superconducting stud via of the first plurality of superconducting stud vias. The one or more superconducting traces of the second set of one or more superconducting traces may include niobium.

An integrated circuit structure may be summarized as including a first wiring layer that comprises an electrically conductive material and which resides in a first plane, the first wiring layer comprising a first mark, the first mark having a first set of nominal dimensions and a first resistance specified at least in part by the first set of nominal dimensions; a second wiring layer that comprises an electrically conductive material and which resides in a second plane which at least partially overlies the first plane, the second wiring layer comprising a second mark, the second mark having second set of nominal dimensions and a second resistance specified at least in part by the second set of nominal dimensions, the second mark having a nominal position along at least one coordinate axis with respect to the first mark; and a first stud via that comprises an electrically conductive material and which resides in between the first and the second planes, the first stud via having a third set of nominal dimensions and a third resistance specified at least in part by the third set of nominal dimensions, the first stud via which provides a signal path between the first mark and the second mark, the second mark which overlaps the stud via in a first resistive overlap region defined by an orthogonal projection of the second mark on the stud via, the first resistance overlap region having a resistance that is larger than a cumulative resistance of the first mark, the second mark and the stud via at least at temperatures above a critical temperature.

The first resistance overlap region may have a resistance that is at least an order of magnitude larger than a cumulative resistance of the first mark, the second mark and the stud via at least at temperatures above the critical temperature. The stud via may include a material that is superconductive at least below a critical temperature, the stud via which provides a superconductive signal path between the first mark and the second mark. The stud via may include niobium. The first wiring layer may include at least one of niobium and aluminum. The second wiring layer may include at least one of niobium and aluminum.

The integrated circuit structure may further include a first pair of leads electrically coupled to the first mark; and a second pair of leads electrically coupled to the second mark, where the first and the second pair of leads allow a Wheatstone bridge circuit to be electrically coupled to the first and the second marks to determine an amount of offset, if any, of the second mark from the nominal position along at least one coordinate axis with respect to the first mark. The first mark may have a first width $W_1$, a first length which may include a portion $L_1$ that does not overlap the stud via and a portion $L_2$ that may overlap the stud via and a first thickness $t_{wire1}$, the second mark may have a second width $W_2$, second length which may include a portion $L_2$ that does not overlap the stud via and a portion d that may overlap the stud via, and second thickness $t_{wire2}$, the stud via may have a third width $W_3$ and a third length $L_3$, and the second mark may be laterally offset from the first mark by a distance ε along at least one coordinate axis. The first mark, the second mark and the stud via may form a first vernier.

The first wiring layer may include a plurality of additional marks, the additional marks of the first wiring layer having a first set of nominal dimensions and a first resistance specified at least in part by the first set of nominal dimensions of the first mark, the second wiring layer may include a plurality of additional marks, the additional marks of the second wiring layer having a second set of nominal dimensions and a second resistance specified at least in part by the first set of nominal dimensions of the second mark, and the integrated circuit structure may further include a plurality of additional stud vias that electrically couple respective ones of the additional marks of the second wiring layer with respective ones of the additional marks of the first wiring layer, to form a set of respective additional verniers. The first vernier and the set of additional verniers may be electrically coupled as a chain of verniers. The chain of verniers may include from 1,000 to 3,200 verniers electrically coupled together in series.

A method for fabricating a superconducting integrated circuit may be summarized as including determining a target resolution of interlayer misalignment to be electrically detectable in the superconducting integrated circuit via a measurement of resistance of portions of the superconducting integrated circuit; determining a set of dimensions for each of a number of verniers to be formed in the superconducting integrated circuit based at least in part on the determined target resolution of interlayer misalignment to be electrically detectable in the superconducting integrated circuit via a measurement of resistance of portions of the superconducting integrated circuit; fabricating the superconducting integrated circuit; and measuring a resistance of portions of the fabricated superconducting integrated circuit. Determining a set of dimensions for each of a number of verniers to be formed in the superconducting integrated circuit based at least in part on the determined target resolution of interlayer misalignment to be electrically detectable in the superconducting integrated circuit via a measurement of resistance of portions of the superconducting integrated circuit may include determining a length, a width and a thickness of a first mark in a first wiring layer, determining a length, a width and a thickness of a second mark in a second wiring layer, determining a length, a width and a thickness of a stud via that electrically couples the first and the second marks, and determining a length and a width a first resistive overlap region defined by an orthogonal projection of the second mark on the stud via, such that the first resistance overlap region has a resistance that is larger than a cumulative resistance of the first mark, the second mark and the stud via at least at temperatures above a critical temperature.

The method may further include prior to fabricating the superconducting integrated circuit, determining a total number of the verniers to be formed in the superconducting integrated circuit based at least in part on the determined target resolution of interlayer misalignment to be electrically detectable in the superconducting integrated circuit via a measurement of resistance of portions of the superconducting integrated circuit.

The method may further include prior to fabricating the superconducting integrated circuit, determining a total number of the verniers in each of a plurality of chains of verniers to be formed in the superconducting integrated circuit based at least in part on the determined target resolution of interlayer misalignment to be electrically detectable in the superconducting integrated circuit via a measurement of resistance of portions of the superconducting integrated circuit.

The method may further include determining an amount of interlayer offset along at least one coordinate axis based at least in part of the measured resistance of the portions of the fabricated superconducting integrated circuit.

The method may further include determining whether the determined amount of interlayer offset along at least one coordinate axis is within a threshold tolerance; and destroying the fabricated superconducting integrated circuit in response to determining that the determined amount of interlayer offset along at least one coordinate axis is not within the threshold tolerance. Measuring a resistance of portions of the fabricated superconducting integrated circuit may include measuring a resistance of chains of verniers of the fabricated superconducting integrated circuit. Measuring a resistance of portions of the fabricated superconducting integrated circuit may include measuring a resistance of chains of verniers of the fabricated superconducting integrated circuit via a probe card and at least one Wheatstone bridge circuit.

A method for fabricating a superconducting integrated circuit may be summarized as including depositing a first superconducting metal layer to overlie at least a portion of a substrate; depositing a first dielectric layer to overlie at least a portion of the first superconducting metal layer; and depositing a kinetic inductance layer to overlie at least a portion of the first dielectric layer, wherein the kinetic inductance layer forms a center conductor for an on-chip transmission line.

The method may further include depositing a passivation layer to overlie at least a portion of the kinetic inductance layer. Depositing a first superconducting metal layer may include depositing a first superconducting metal layer including niobium.

The method may further include patterning the first superconducting metal layer to form at least one superconductive trace.

The method may further include patterning the kinetic inductance layer to form at least one kinetic inductor. Depositing a kinetic inductance layer may include depositing a layer of at least one of titanium nitride (TiN), niobium nitride (NbN), niobium titanium nitride (NbTiN), molybdenum nitride (MoN), or tungsten silicide (WSi). Depositing a passivation layer to overlie at least a portion of the high kinetic inductance layer may include depositing a layer of silicon nitride (SiN). Depositing a layer of at least one of TiN, NbN, NbTiN, MoN, or WSi may include depositing a layer of at least one of TiN, NbN, NbTiN, MoN, or WSi having a thickness in the range 25 nm to 100 nm, and depositing a layer of SiN may include depositing a layer of SiN having a thickness in the range 25 nm to 100 nm.

The method may further include depositing a second superconducting metal layer to overlie at least a portion of the passivation layer; depositing a second dielectric layer to overlie at least a portion of the second superconducting metal layer; and depositing a third superconducting metal layer to overlie at least a portion of the second dielectric layer, wherein the first and the third superconducting metal layers form an outer conductor of the on-chip transmission line.

The method may further include depositing a second dielectric layer to overlie at least a portion of the passivation layer; and depositing a second superconducting metal layer to overlie at least a portion of the second dielectric layer, wherein the first and the second superconducting metal layers form an outer conductor of the on-chip transmission line.

A superconducting integrated circuit may be summarized as including a substrate; a first superconducting metal layer that overlies at least a portion of the substrate; a first dielectric layer that overlies at least a portion of the first superconducting metal layer; and a kinetic inductance layer that overlies at least a portion of the first dielectric layer, wherein the kinetic inductance layer forms a center conductor for an on-chip transmission line.

The superconducting integrated circuit may further include a passivation layer that overlies at least a portion of the kinetic inductance layer. The kinetic inductance layer may include a material superconductive in a respective range of temperatures, the material selected to cause a larger proportion of energy stored in the kinetic inductance layer to be stored as kinetic inductance than magnetic inductance. The first superconducting metal layer may include niobium. The kinetic inductance layer may include at least one of TiN, NbN, NbTiN, MoN, or WSi. The passivation layer may include silicon nitride (SiN). The kinetic inductance layer may include a layer of at least one of TiN, NbN, NbTiN, MoN, or WSi having a thickness in the range 25 nm to 100 nm, and the passivation layer may include a layer of SiN having a thickness in the range 25 nm to 100 nm.

The superconducting integrated circuit may further include a second superconducting metal layer that overlies at least a portion of the kinetic inductance layer; a second dielectric layer that overlies at least a portion of the second superconducting metal layer; and a third superconducting metal layer that overlies at least a portion of the second dielectric layer, wherein the first and the third superconducting metal layers form an outer conductor of the on-chip transmission line.

The superconducting integrated circuit may further include a second dielectric layer that overlies at least a portion of the kinetic inductance layer; and a second superconducting metal layer that overlies at least a portion of the second dielectric layer, wherein the first and the second superconducting metal layers form an outer conductor of the on-chip transmission line.

A method for fabricating a superconducting integrated circuit comprising an encapsulated wiring layer may be summarized as including depositing a first encapsulation layer to overlie at least a portion of a substrate; depositing a first superconducting metal wiring layer to overlie at least a portion of the first encapsulation layer; depositing a second encapsulation layer to overlie at least a portion of the first superconducting metal wiring layer; depositing a first dielectric layer to overlie at least a portion of the second encapsulation layer; forming a pillar by masking and etching the first encapsulation layer, the first superconducting metal wiring layer, the second encapsulation layer, and the first dielectric layer; depositing a third encapsulation layer to overlie and enclose the pillar; depositing a second dielectric layer to overlie at least a portion of the third encapsulation layer and to enclose the pillar; performing a blank anisotropic etch of the second dielectric layer; and performing an etch of the second encapsulation layer. Depositing a first encapsulation layer to overlie at least a portion of a substrate may include depositing a first encapsulation layer to overlie at least a portion of a third dielectric layer. Depositing the first encapsulation layer to overlie at least a portion of a third dielectric layer may include depositing the first encapsulation layer to overlie at least a portion of a silicon dioxide layer. At least one of depositing the first or the second encapsulation layers may include depositing titanium nitride (TiN). At least on of depositing the first or the second encapsulation layers may include depositing aluminum. Depositing a first superconducting metal wiring layer may include depositing niobium. Performing a blank anisotropic etch of the second dielectric layer may include performing a blank anisotropic etch of the second dielectric layer to expose at least a portion of the third encapsulation layer. Performing an etch of the second encapsulation layer may include performing an etch of the second encapsulation layer to expose the first dielectric layer.

A superconducting integrated circuit may be summarized as including a substrate; and at least a first pillar that extends perpendicularly from the substrate, the first pillar having a central stack and a surrounding structure that surrounds a periphery of the central stack, the central stack comprising, in order from the substrate and extending perpendicularly upward, a first encapsulation layer, a first superconducting metal wiring layer that overlies the first encapsulation layer, a second encapsulation layer that overlies the first superconducting metal wiring layer, and a first dielectric layer that overlies the second encapsulation layer, the surrounding structure comprising, in order from an interior and extending radially outward a third encapsulation layer and a second dielectric layer, where the second dielectric layer is exposed beyond the surrounding structure. The first encapsulation layer may include a third dielectric layer. The third dielectric layer may include a silicon dioxide layer. At least one of the first or the second encapsulation layers may include titanium nitride (TiN). At least one of the first or the second encapsulation layers may include aluminum. The first superconducting metal wiring layer may include niobium. The third encapsulation layer and the second dielectric layer may be each circumferentially disposed about the central stack and each may have an exposed upper edge that tapers downwardly as the first pillar is traversed from an interior thereof toward and an exterior thereof. The first dielectric layer may have an upper surface that is parallel to a plane of the substrate.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn, are not necessarily intended to convey any information regarding the actual shape of the particular elements, and have been solely selected for ease of recognition in the drawings.

DETAILED DESCRIPTION

Figure 1:
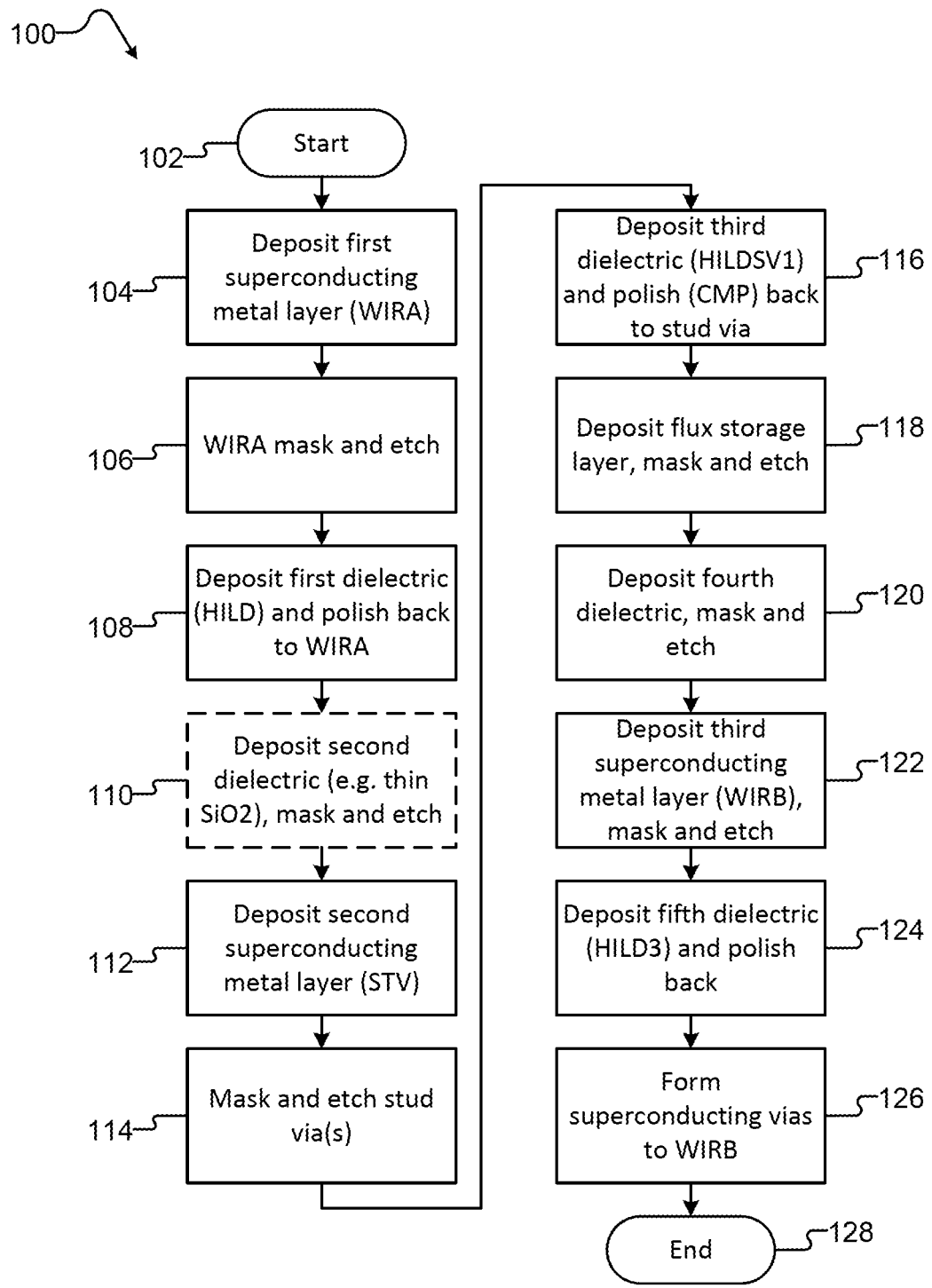
FIG. 1 is a flowchart illustrating a method for fabricating a portion of a superconducting integrated circuit, in accordance with the present systems and methods.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with superconductive circuits or structures, quantum computer circuits or structures and/or cryogenic cooling systems such as dilution refrigerators have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in this specification and the appended claims the terms "carried by," "carried on," or variants thereof, and similarly the terms "over" and "above," mean that one structure is directly or indirectly supported in at least some instances by another structure, for example directly on a surface thereof, spaced above or below a surface thereof by one or more intervening layers or structures or located therein.

The headings and Abstract of the Disclosure provided herein are for convenience only and do not interpret the scope or meaning of the embodiments.

Unless the specific context requires otherwise, throughout this specification the terms "deposit," "deposited," "deposition," and the like are generally used to encompass any method of material deposition, including but not limited to physical vapor deposition (PVD), chemical vapor deposition (CVD), plasma-enhanced PVD, plasma-enhanced CVD, and atomic layer deposition (ALD).

Unless the specific context requires otherwise, throughout this specification the terms "overlie" or "overlies" are generally used to describe at least a portion of one layer at least partially in registration with at least a portion of another layer, either with or without one or more intermediary layers therebetween.

The various embodiments described herein provide systems and methods for fabricating superconducting integrated circuits. As previously described, in the art superconducting integrated circuits tend to be fabricated in research environments outside of state-of-the-art semiconductor fabrication facilities, even though superconducting integrated circuits are typically fabricated using many of the same types of tools and techniques that are traditionally used in the semiconductor fabrication industry. Due to issues unique to superconducting circuits, semiconductor processes and techniques generally need to be modified for use in superconductor chip and circuit fabrication. Such modifications typically are not obvious and may require some experimentation.

Integrated Process for Fabricating a Kinetic Inductor and a Capacitor

An integrated process for fabricating a high kinetic inductance layer (also referred to in the present description as a kinetic inductor) and a capacitor is illustrated in FIG. 1 and FIGS. 2A to 2J. In some implementations of a superconducting integrated circuit, a high kinetic inductance layer is used for DAC (digital to analog converter) storage. Systems and methods related to DACs in superconducting integrated circuits are described in U.S. Pat. Nos. 8,098,179, 8,786,476, 7,876,248, 8,035,540, 8,604,944, and U.S. patent application 62/405,027 "Quantum Flux Parametron Based Structures (e.g., Muxes, Demuxes, Shift Registers), Addressing Lines And Related Methods", each of which is incorporated herein by reference in its entirety.

In some implementations of a superconducting integrated circuit, a capacitor is used for FMRR (frequency multiplexed resonant readout). Systems and methods related to FMRR are described in International PCT patent application US2016/31885 "Frequency Multiplexed Resonator Input And/or Output For A Superconducting Device" which was filed 11 May 2016 and is incorporated herein by reference in its entirety.

In some implementations, a superconducting integrated circuit can include a kinetic inductor and a capacitor.

FIG. 1 is a flowchart illustrating a method 100 for fabricating a portion of a superconducting integrated circuit, according to one illustrated embodiment of the present disclosure. Method 100 includes acts 102-128, though those of skill in the art will appreciate that in alternative embodiments certain acts may be omitted and/or additional acts may be added. Those of skill in the art will appreciate that the illustrated order of the acts is shown for exemplary purposes only and may change in alterative embodiments.

Method 100 starts at 102, for example in response to an initiation of the fabrication process. At 104, a first superconducting metal layer (WIRA) is deposited to overlie a substrate. The first superconducting metal layer is superconducting in a range of temperatures. In one implementation, the first superconducting metal layer includes niobium. At 106, WIRA is patterned by masking and etching at least a portion of WIRA to form a first wiring layer that includes one or more traces. At 108, a first dielectric (HILD) is deposited to overlie at least a portion of WIRA, and the dielectric is polished back to WIRA. In some implementations, the first dielectric is a high-loss dielectric such as silicon dioxide. In some implementations, polishing the first dielectric includes Chemical Mechanical Planarization (CMP).

At 110, in an optional act, a second dielectric layer is deposited, and then patterned by masking and etching. In one implementation, the second dielectric layer is a thin layer of silicon dioxide intended to protect WIRA.

At 112, a second layer of superconducting metal (STV1) is deposited to overlie at least portions of WIRA and HILD. In one implementation, STV1 includes aluminum. In another implementation, STV1 includes niobium. At 114, STV1 is patterned by masking and etching to form a first set of superconducting stud vias. The superconducting vias in the first set of superconducting vias are superconducting in a range of temperatures.

At 116, a third dielectric (HILDSV1) is deposited to overlie a) the layer of superconducting metal that forms the first set of superconducting vias, and b) the previously-deposited dielectric, and HILDSV1 is polished back to the upper surface of at least some of the first set of superconducting stud via(s). In some implementations, HILDSV1 is a high-loss dielectric. In some implementations, the polishing includes CMP.

At 118, a high kinetic inductance layer is deposited, and patterned by masking and etching. In the present description, the high kinetic inductance layer is also referred to as a flux storage layer.

Kinetic inductance refers to the equivalent series inductance of mobile charge carriers in alternating electric fields, and is typically observed in high carrier mobility conductors such as superconductors. The high kinetic inductance layer can comprise a superconducting material selected for its high carrier mobility. The high kinetic inductance layer can be selected to provide an equivalent series inductance suitable for operation of circuit 200j of FIG. 2J, for example.

The kinetic inductance of a superconducting wire is proportional to its length, and inversely proportional to its cross-sectional area, and inversely proportional to the density of Cooper pairs. The London penetration depth is an inherent property of a superconductor, and characterizes the distance to which a magnetic field penetrates into a superconductor. Typically, a superconductor having a larger London penetration depth has larger kinetic inductance for the same physical dimensions. In some implementations, high kinetic inductance layer 118 comprises a material that has a penetration depth at least three times the penetration depth of the superconducting metal forming first superconducting metal layer 104, or second layer of superconducting metal 112.

The penetration depth is related to the density of Cooper pairs. For the same current, Cooper pairs in a superconductor having a lower density of Cooper pairs travel faster and hence have greater kinetic energy, i.e., a larger proportion of energy is stored in the kinetic energy (kinetic inductance) than in the magnetic field (magnetic inductance) than for a superconductor with a higher density of Cooper pairs.

In some implementations, the flux storage layer is a layer of titanium nitride (TiN). In other implementations, the flux storage layer is a layer of niobium nitride (NbN). In other implementations, the flux storage layer is a layer of one of niobium titanium nitride (NbTiN), molybdenum nitride (MoN), or tungsten silicide (WSi). At 120, a fourth dielectric layer is deposited and patterned by masking and etching. In some implementations, the fourth dielectric layer is a high-quality dielectric such as SiN.

At 122, a third superconducting metal layer (WIRB) is deposited to overlie at least a portion of the fourth dielectric layer, and is patterned by masking and etching to form a second wiring layer that includes one or more traces. The second superconducting metal layer is superconducting in a range of temperatures. In one implementation, the second superconducting metal layer includes niobium. At 124, a fifth dielectric (HILD3) is deposited to overlie at least a portion of WIRB, and is polished back to WIRB. In some implementations, HILD3 is a high-loss dielectric such as silicon dioxide. In some implementations, polishing the fifth dielectric includes Chemical Mechanical Planarization (CMP).

At 126, a second set of superconducting vias are formed, where at least some of the second set of superconducting vias provide a superconducting electrical coupling to WIRB. The second set of superconducting vias can be formed, for example by drilling holes in HILD3 through to an upper surface of WIRB, and filling the holes with a fourth superconducting metal layer that is superconducting in a range of temperatures. In some implementations, the fourth superconducting metal layer includes niobium. At 128, method 100 ends.

FIGS. 2A to 2J show a sectional view of a portion of a superconducting circuit fabricated at successive stages of fabrication, according to method 100 of FIG. 1.

Figure 2A:
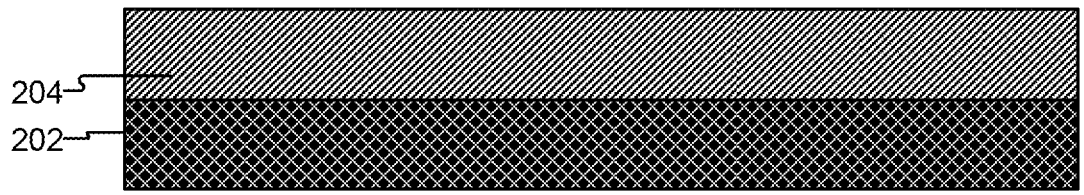
FIGS. 2A to 2J are sectional views of a portion of an exemplary superconducting integrated circuit which includes a kinetic inductor and a capacitor, at various stages of its fabrication, in accordance with the present systems and methods.

FIG. 2A is a sectional view of a portion of a superconducting integrated circuit 200a at a first stage of a fabrication process described by method 100 of FIG. 1. Circuit 200a comprises a substrate 202 and a first superconducting metal layer 204 (WIRA). In some implementations, substrate 202 is a silicon substrate. In some implementations, first superconducting metal layer 204 includes niobium.

Figure 2B:
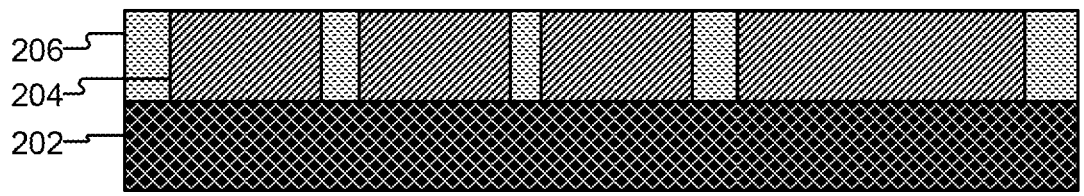

FIG. 2B is a sectional view of a portion of a superconducting integrated circuit 200b at a subsequent stage of the fabrication process. Superconducting integrated circuit 200b can be formed from circuit 200a of FIG. 2A by patterning first superconducting metal layer 204 (WIRA) to form a first wiring layer that includes one or more traces, and by depositing a first dielectric layer 206 (HILD) and polishing first dielectric layer 206 back to the upper surface of first superconducting metal layer 204. Patterning of first superconducting metal layer 204 can include masking and etching at least a portion of first superconducting metal layer 204. Polishing first dielectric layer 206 can include CMP.

An optional second layer of dielectric (not shown in FIGS. 2A to 2J) can be deposited before depositing superconducting metal layer 208. The second layer of dielectric, for example, can be a thin layer of silicon dioxide intended to provide protection to the surface of WIRA.

Figure 2C:
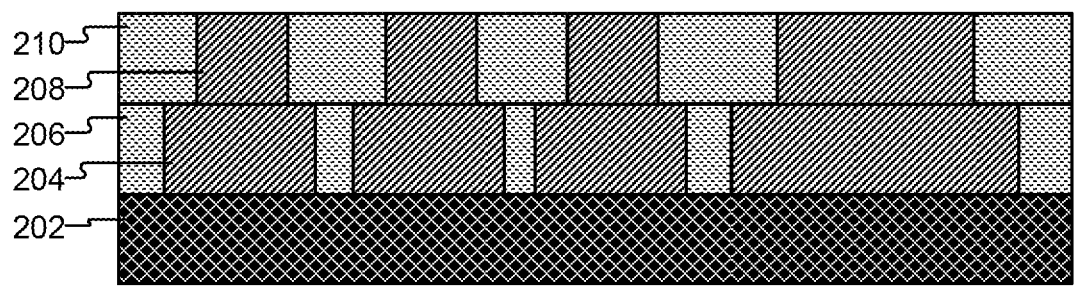

FIG. 2C is a sectional view of a portion of a superconducting circuit 200c at a subsequent stage of the fabrication process. Superconducting integrated circuit 200c can be formed from circuit 200b of FIG. 2B by a) depositing a second superconducting metal layer 208, b) patterning second superconducting metal layer 208 to form a first set of superconducting stud vias, c) depositing a third dielectric layer 210 (HILDSV1), and d) polishing third dielectric layer 210 back to an upper surface of second superconducting metal layer 208. In some implementations, second superconducting metal layer 208 includes aluminum. In other implementations, second superconducting metal layer 208 includes niobium. Patterning second superconducting metal layer 208 can include masking and etching at least a portion of second superconducting metal layer 208. Polishing third dielectric layer 210 can include CMP.

Figure 2D:
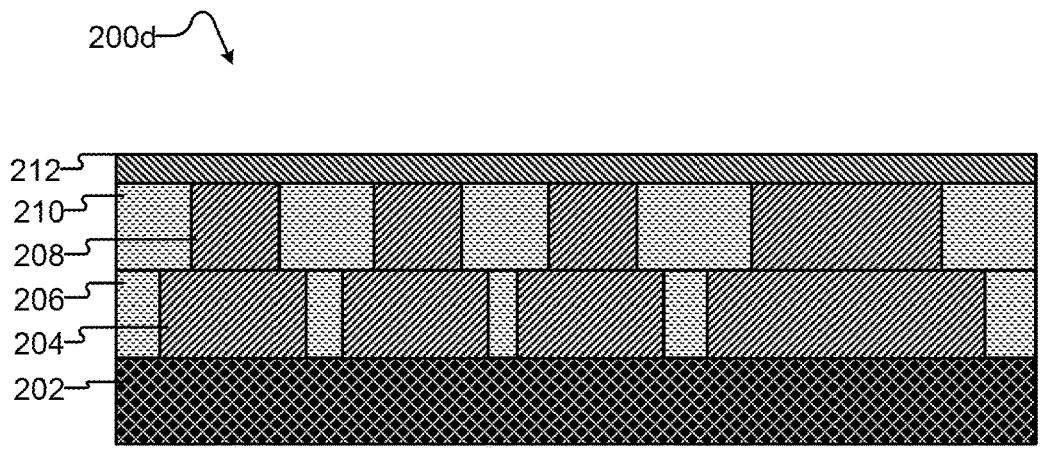

FIG. 2D is a sectional view of a portion of a superconducting circuit 200d at a subsequent stage of the fabrication process. Superconducting integrated circuit 200d can be formed from circuit 200c of FIG. 2C by depositing a high kinetic inductance layer 212 to overlie second superconducting metal layer 208 and third dielectric layer 210. High kinetic inductance layer 212 is also referred to in the present application as flux storage layer 212. In some implementations flux storage layer 212 includes TiN.

Figure 2E:
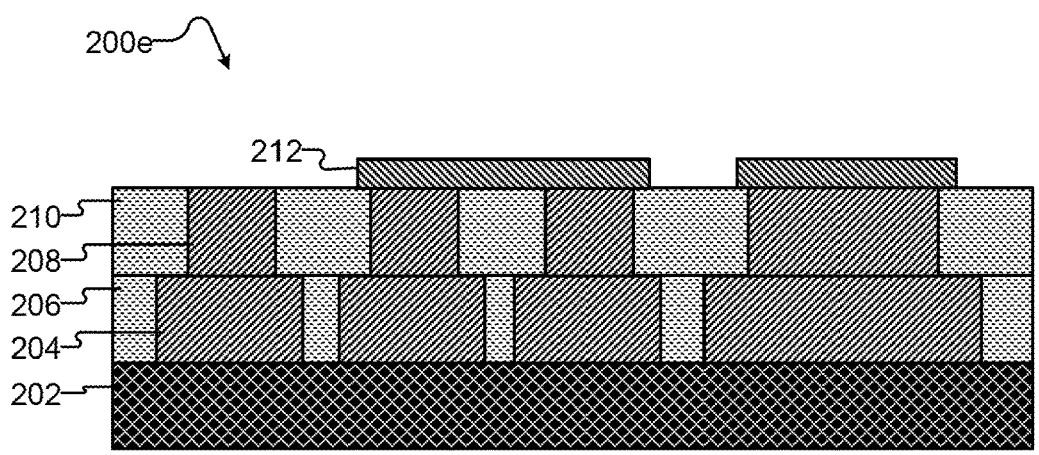

FIG. 2E is a sectional view of a portion of a superconducting circuit 200e at a subsequent stage of the fabrication process. Superconducting integrated circuit 200e can be formed from circuit 200d of FIG. 2D by patterning flux storage layer 212. Patterning of flux storage layer 212 can include masking and etching at least a portion of flux storage layer 212. A first portion of flux storage layer 212 can form an element of a kinetic inductor. A second portion of flux storage layer 212 can form an element of a capacitor. In some implementations, flux storage layer 212 can have a thickness of approximately 50 nm.

In some implementations, patterning of flux storage layer 212 includes masking and etching at least a first portion of flux storage layer 212 to form an element of a kinetic inductor, and does not include masking and etching at least a second portion of flux storage layer 212 to form an element of a capacitor. Including at least a portion of flux storage layer 212 in a capacitor formed by the systems and methods of the present application is optional.

Figure 2F:
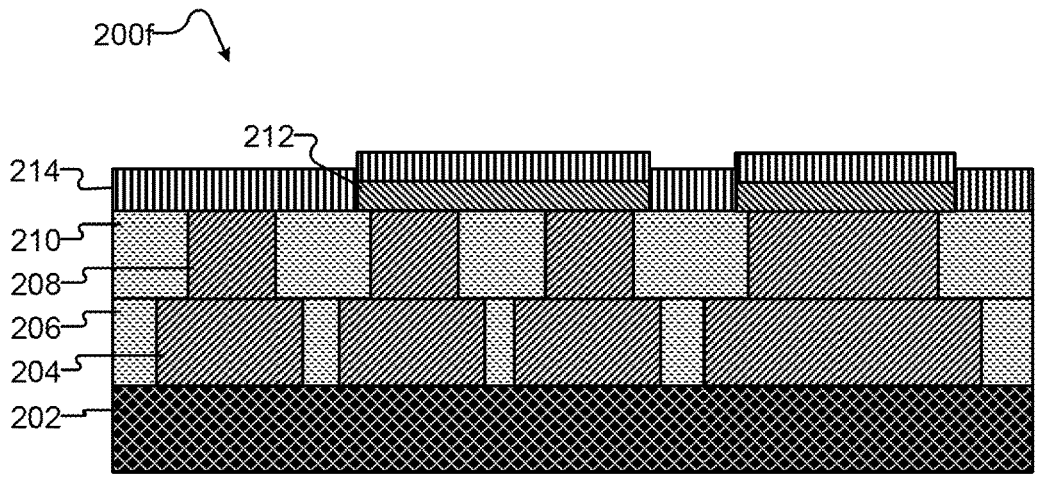

FIG. 2F is a sectional view of a portion of a superconducting circuit 200f at a subsequent stage of the fabrication process. Superconducting integrated circuit 200f can be formed from circuit 200e of FIG. 2E by depositing a fourth dielectric layer 214 to overlie at least a portion of flux storage layer 212. In some embodiments, fourth dielectric layer 214 is a high-quality dielectric such as SiN.

Figure 2G:
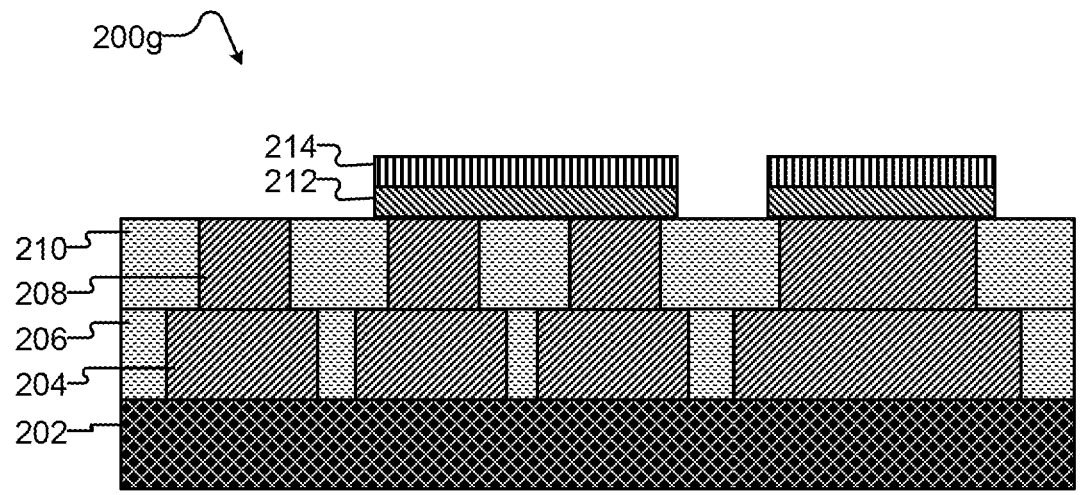

FIG. 2G is a sectional view of a portion of a superconducting circuit 200f at a subsequent stage of the fabrication process. Superconducting integrated circuit 200g can be formed from circuit 200f of FIG. 2F by patterning fourth dielectric layer 214. Patterning of fourth dielectric layer 214 can include masking and etching at least a portion of fourth dielectric layer 214. A first portion of fourth dielectric layer 214 can form a passivation insulating layer that can, for example, protect an element of a kinetic inductor. A second portion of fourth dielectric layer 214 can form a dielectric layer of a capacitor. In some implementations, fourth dielectric layer 214 can be a thin layer, for example fourth dielectric layer 214 can have a thickness of approximately 50 nm.

Figure 2H:
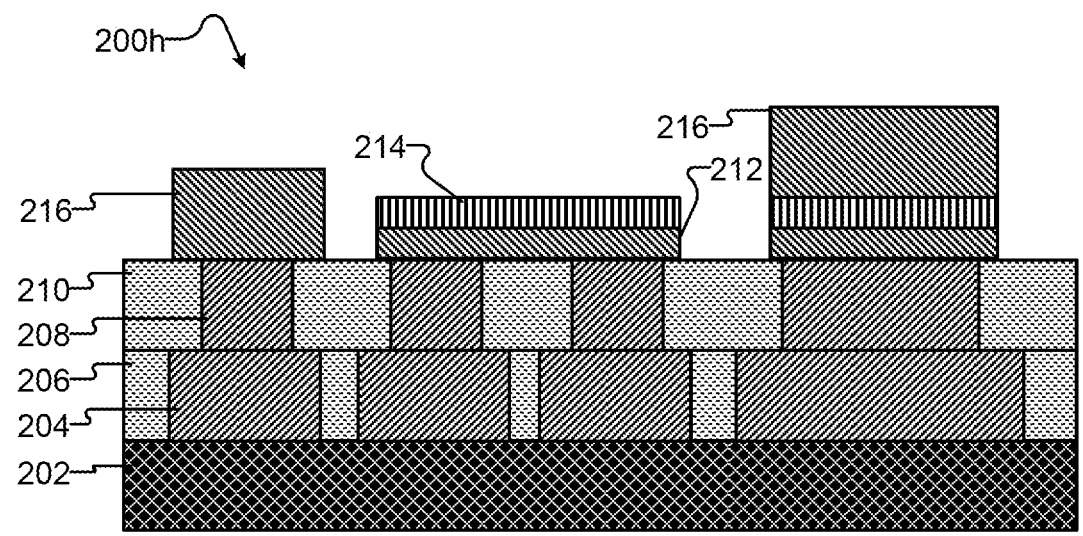

FIG. 2H is a sectional view of a portion of a superconducting circuit 200f at a subsequent stage of the fabrication process. Superconducting integrated circuit 200h can be formed from circuit 200g of FIG. 2G by depositing a third superconducting metal layer 216, and patterning third superconducting metal layer 216 to form a second wiring layer that includes one or more traces. Patterning third superconducting metal layer 216 can include masking and etching at least a portion of third superconducting metal layer 216. In some implementations, third superconducting metal layer 216 includes niobium.

Figure 2I:
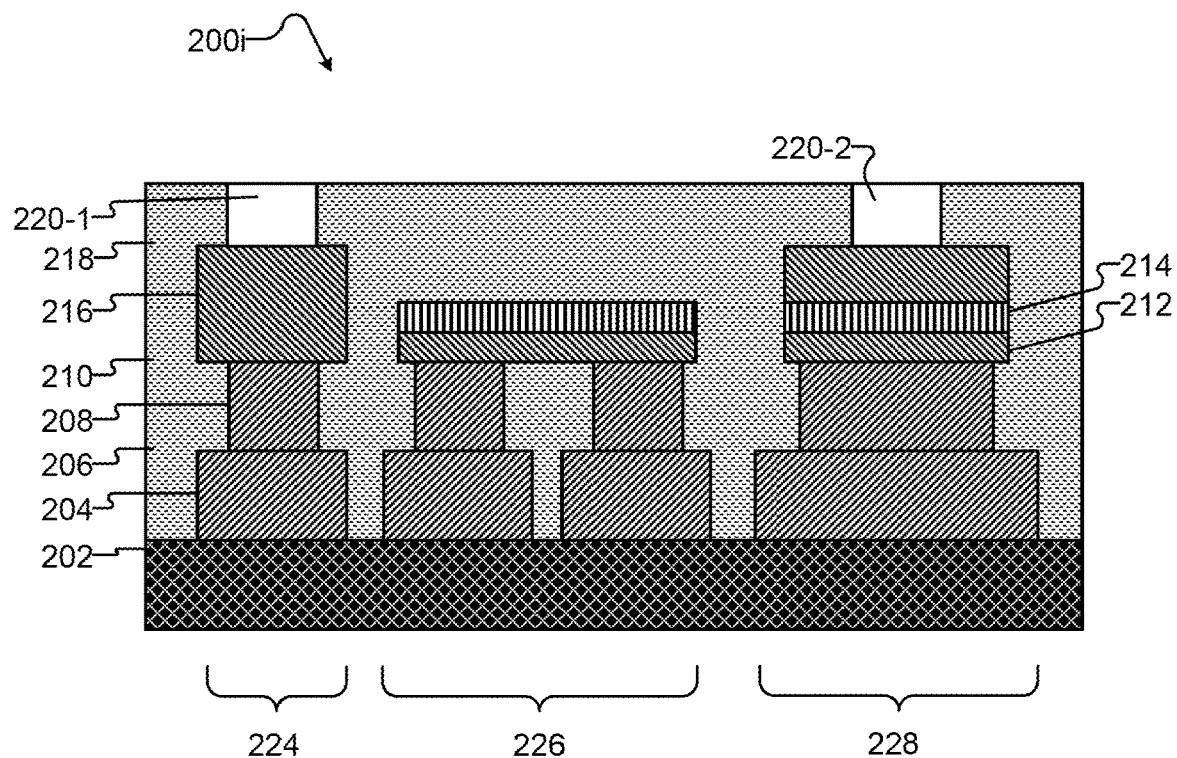

FIG. 2I is a sectional view of a portion of a superconducting circuit 200i at a subsequent stage of the fabrication process. Superconducting integrated circuit 200i can be formed from circuit 200h of FIG. 2H by depositing a fifth dielectric layer 218 (HILD3), and forming one or more holes 220 (such as holes 220-1 and 220-2 called out in FIG. 2I) in fifth dielectric layer 218 to an upper surface of second wiring layer 216. In some implementations, holes 220 can be formed by drilling holes in fifth dielectric layer 218.

Figure 2J:
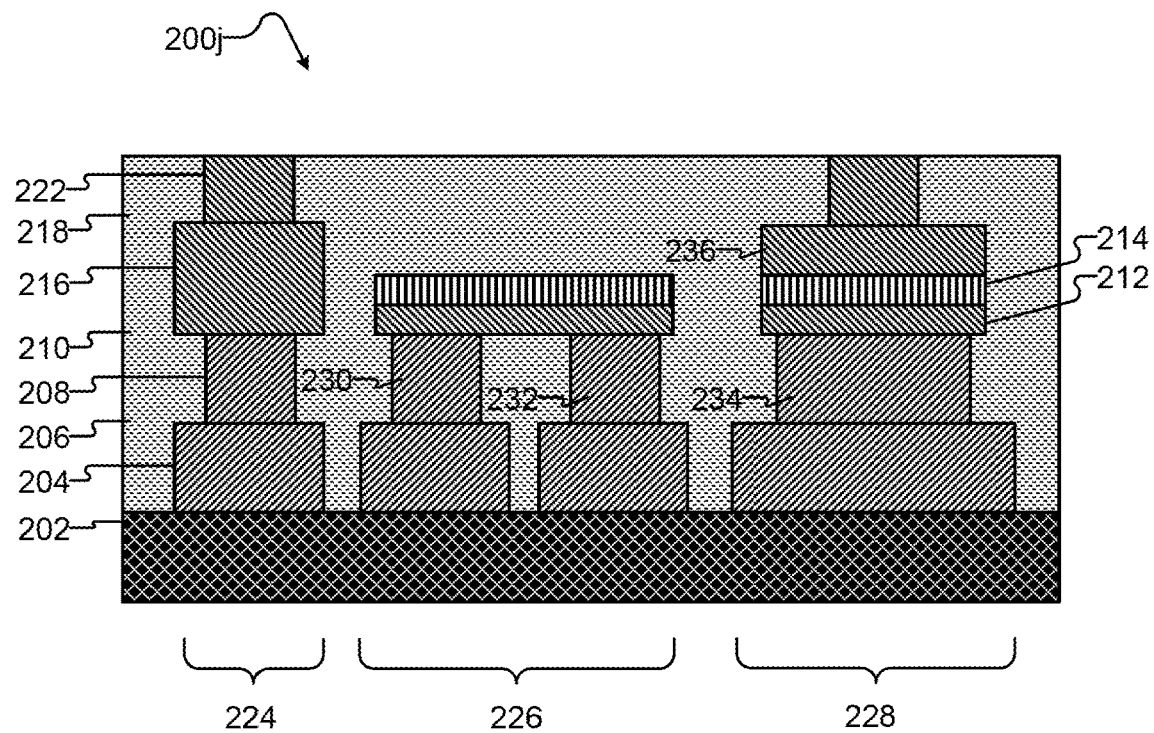

FIG. 2J is a sectional view of a portion of a superconducting circuit 200j at a subsequent stage of the fabrication process. Superconducting integrated circuit 200j can be formed from circuit 200i of FIG. 2I by depositing a fourth superconducting metal layer 222 in holes 220 to form superconducting vias to third superconducting metal layer 216. In some implementations, fourth superconducting metal layer 222 includes niobium.

In another approach, superconducting vias to the third superconducting metal layer 216 are formed using a fabrication method similar to the method described in reference to FIG. 2C. For example, an optional fifth layer of dielectric such as a thin layer of silicon dioxide (not shown in FIGS. 2A to 2J) can be deposited to provide protection to the surface of third superconducting metal layer 216.

A fourth superconducting metal layer 222 is deposited, and patterned to form a second set of superconducting stud vias. A sixth dielectric layer 218 is deposited, and polished back to an upper surface of fourth superconducting metal layer 222.

Superconducting integrated circuit 200j includes a via wall 224, a kinetic inductor 226, and a capacitor 228. Kinetic inductor 226 comprises two electrodes 230 and 232, each electrode electrically coupled to a trace formed in superconducting metal layer 204. Capacitor 228 comprises two electrodes 234 and 236. Electrode 234 is electrically coupled to a trace formed in first superconducting metal layer 204. Electrode 236 is electrically coupled to a trace formed in fourth superconducting metal layer 222. In some implementations, capacitor 228 includes at least of portion of flux storage layer 212 and at least a portion of fourth dielectric layer 214. In other implementations, capacitor 228 includes at least a portion of fourth dielectric layer 214, and does not include at least a portion of flux storage layer 212.

An advantage of the systems and methods described above with reference to FIG. 1 and FIGS. 2A to 2J is that the number of processing acts in the fabrication of a superconducting integrated circuit that includes a kinetic inductor and a capacitor can be reduced. Fewer processing acts typically results in lower fabrication costs and higher fabrication yields.

In some implementations, the high kinetic inductance layer in a kinetic inductor and the high kinetic inductance layer in a capacitor in the same superconducting integrated circuit are formed by separate acts, for example by using separate mask and etch acts for the kinetic inductor and the capacitor. For example, act 118 of FIG. 1 can include separate mask and etch for a kinetic inductor and a capacitor in the same superconducting integrated circuit.

In another approach, the kinetic inductor and the capacitor are formed in separate layers of a superconducting integrated circuit. A process for fabricating a superconducting integrated circuit including a kinetic inductor and a capacitor that are each in separate layers is illustrated in FIG. 18A to 18J.

Dual Mask for Stud Via Formation

This section describes systems and methods for using a dual mask to form a stud via. In one implementation, the stud via is a superconducting stud via in a superconducting integrated circuit.

A feature of the systems and methods described below is that a hard mask (e.g. silicon dioxide) and a soft mask (e.g. photoresist) can be used in combination as a dual mask. An advantage of the dual mask approach is that it avoids, or at least reduces, complications caused by step height in the lithography process. Another advantage is that the lower layer (which encloses the stud via) can be reduced in size, for example to 100 nm.

In the systems and methods described below, the stud via pattern and the wiring layer pattern can be defined first, and then the patterns transferred using a process that exploits differential selectivity between the hard mask material and the soft mask material. An example process is reactive ion etching.

Figure 3:
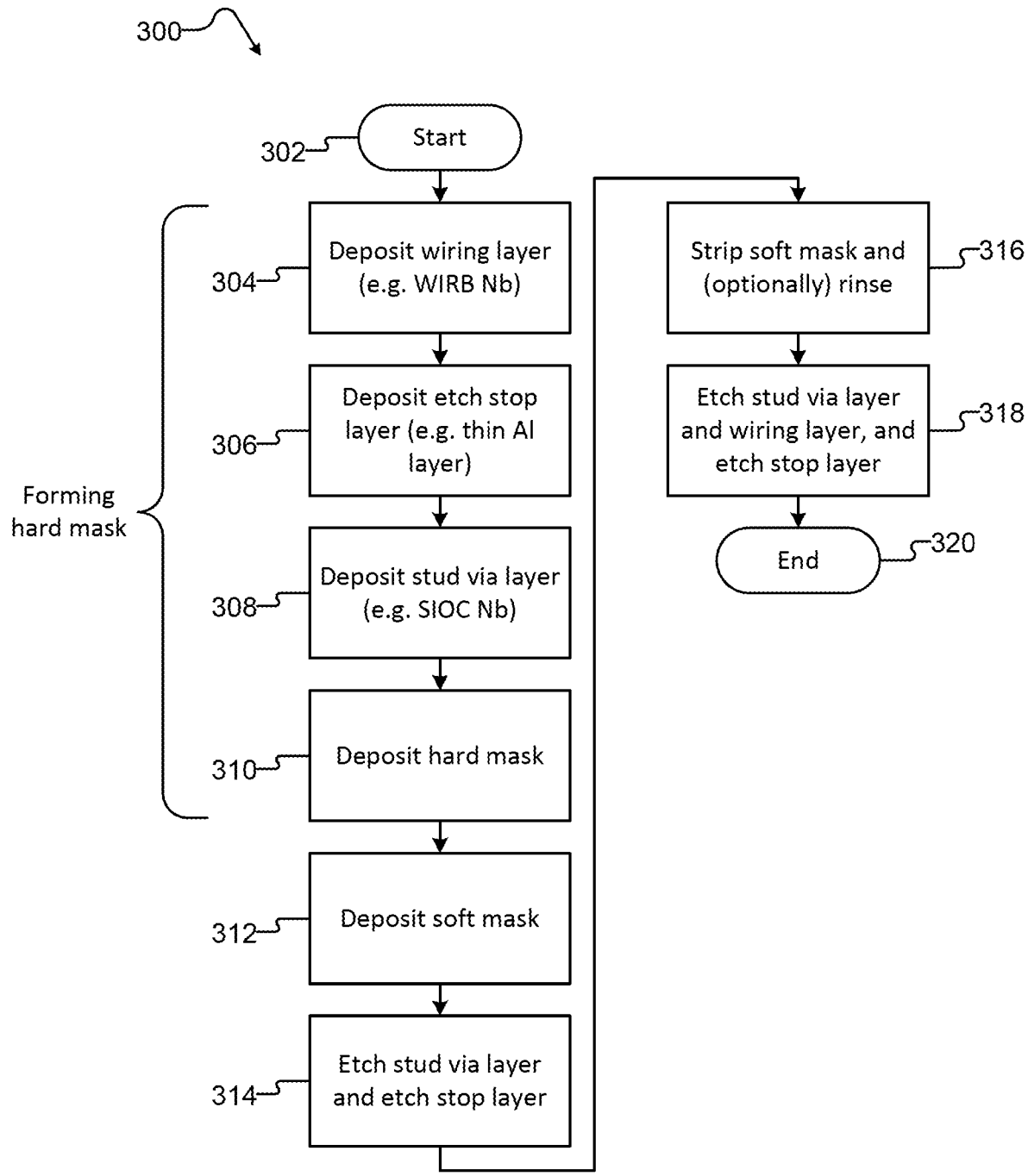
FIG. 3 is a flowchart illustrating a method for fabricating a portion of a superconducting integrated circuit, according to one illustrated embodiment of the present disclosure.

FIG. 3 is a flowchart illustrating a method 300 for fabricating a portion of a superconducting integrated circuit, according to one illustrated embodiment of the present disclosure. Method 300 includes acts 302-320, though those of skill in the art will appreciate that in alternative embodiments certain acts may be omitted and/or additional acts may be added. Those of skill in the art will appreciate that the illustrated order of the acts is shown for exemplary purposes only and may change in alterative embodiments.

Method 300 starts at 302, for example in response to an initiation of the fabrication process. At 304, a first superconducting metal layer (WIRB) is deposited to overlie a substrate. The first superconducting metal layer is superconducting in a range of temperatures. In some implementations, the first superconducting metal layer comprises niobium. The first superconducting metal layer can be a wiring layer. The wiring layer can be patterned to form one or more superconducting traces.

At 306, an etch stop layer is deposited to overlie at least a portion of the first superconducting metal layer WIRB. The etch stop layer is superconducting in a range of temperatures. In one implementation, the etch stop layer is a thin layer of aluminum.

At 308, a second superconducting metal layer is deposited to overlie at least a portion of the etch stop layer. The second superconducting metal layer is superconducting in a range of temperatures. In some implementations, the second superconducting metal layer comprises at least one of niobium and aluminum. The second superconducting metal layer is a stud via layer.

At 310, a hard mask is deposited, or transferred, to overlie a portion of the stud via layer. In one implementation, the hard mask comprises silicon dioxide. A hard mask is a material used in fabrication of an integrated circuit (e.g., a superconducting integrated circuit) as an etch mask in place of a polymer or other organic soft mask (or photoresist) material. The material of the hard mask is less vulnerable than a soft mask to etching by reactive gases such as oxygen, fluorine, or chlorine.

At 312, a soft mask is deposited to overlie at least a portion of the hard mask and at least a portion of the stud via layer. In some implementations, the soft mask comprises photoresist. A soft mask is a material used in fabrication of an integrated circuit (e.g., a superconducting integrated circuit), and is typically a polymer or other organic soft resist material. The soft mask is more easily etched than the hard mask by reactive gases during plasma etching, for example.

At 314, the exposed stud via layer and the underlying or exposed etch stop layer are etched. At 316, the soft mask is stripped, and optionally rinsed. At 318, the exposed stud via layer, wiring layer and etch stop layer are etched. At 320, method 300 ends. In some implementations, the soft mask is a photoresist and a cleaning agent can be used to rinse off the photoresist after it is stripped at 316. However, common cleaning agents such as isopropanol can corrode the wiring layer. It can be advantageous to use a non-corrosive cleaning agent, for example, EKC4000™ which is commercially available from DuPont, to rinse off the photoresist.

FIGS. 4A to 4F are sectional views of a portion of an exemplary superconducting integrated circuit which includes a stud via, at various stages of its fabrication, in accordance with the present systems and methods.

Figure 4A:
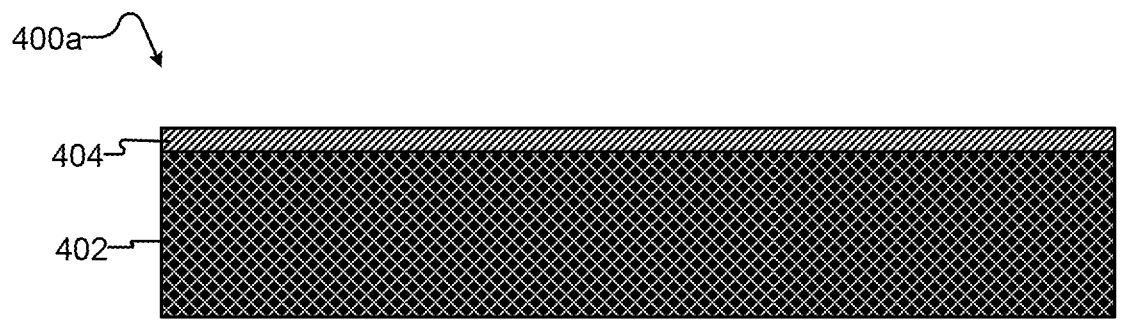
FIGS. 4A to 4F are sectional views of a portion of an exemplary superconducting integrated circuit which includes a stud via, at various stages of its fabrication, in accordance with the present systems and methods.

FIG. 4A is a sectional view of a portion of a superconducting integrated circuit 400a at a first stage of a fabrication process described by method 300 of FIG. 3. Circuit 400a comprises a first superconducting metal layer 402 and an etch stop layer 404.

In some implementations, first superconducting metal layer 402 overlies a substrate. First superconducting metal layer 402 is superconducting in a range of temperatures. In some implementations, first superconducting metal layer 402 comprises niobium. The first superconducting metal layer can be a wiring layer. The wiring layer can be patterned to form one or more superconducting traces.

Etch stop layer 404 is superconducting in a range of temperatures. In some implementations, etch stop layer 404 is a thin layer of aluminum.

Figure 4B:
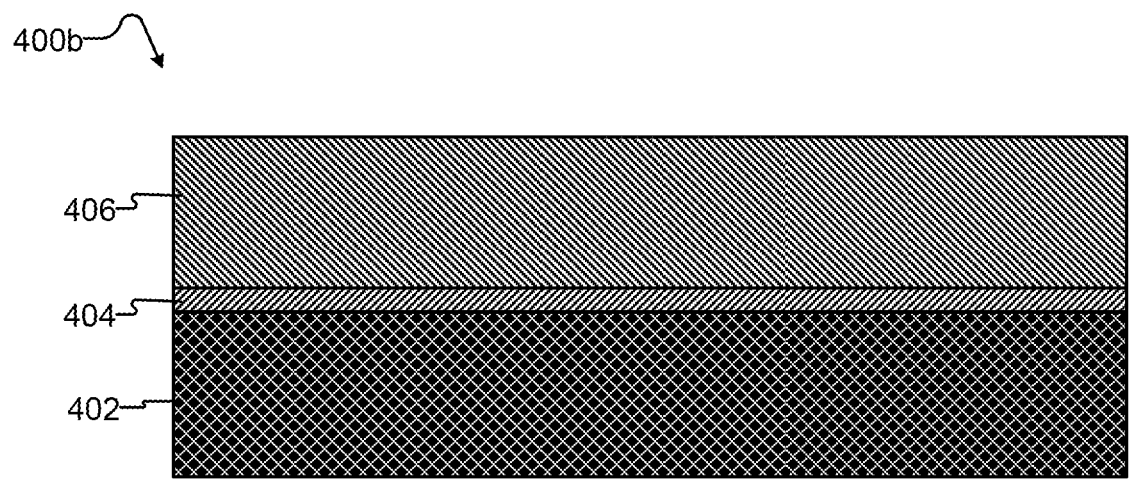

FIG. 4B is a sectional view of a portion of a superconducting integrated circuit 400b at a subsequent stage of the fabrication process. Superconducting integrated circuit 400b can be formed from circuit 400a of FIG. 4A by depositing a second superconducting metal layer 406 to overlie at least a portion of etch stop layer 404. Second superconducting metal layer 406 is superconducting in a range of temperatures. In some implementations, second superconducting metal layer 406 comprises at least one of niobium and aluminum. Second superconducting metal layer can be a stud via layer.

Figure 4C:
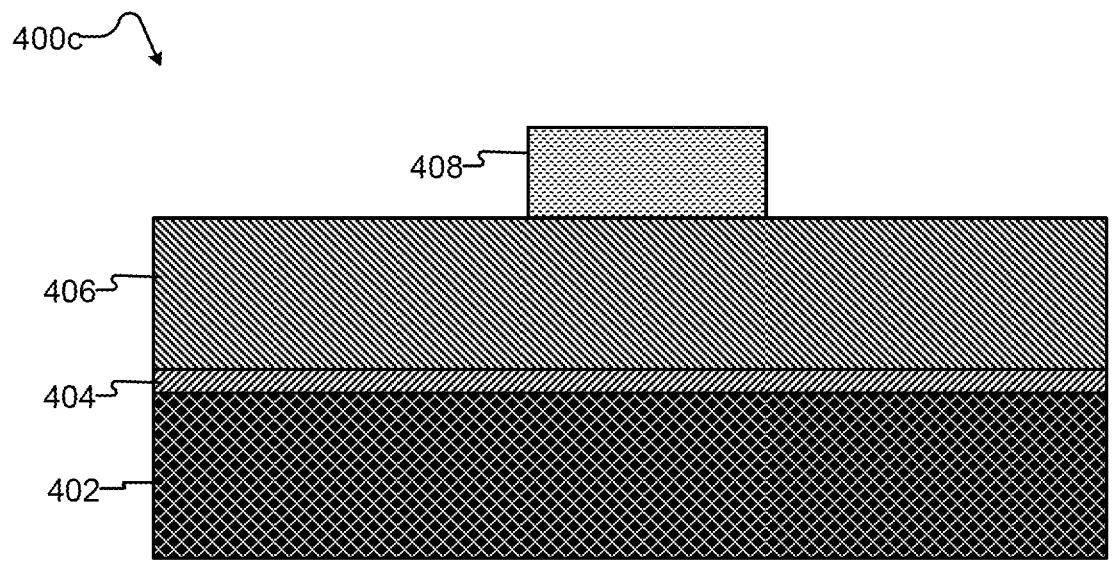

FIG. 4C is a sectional view of a portion of a superconducting circuit 400c at a subsequent stage of the fabrication process. Superconducting integrated circuit 400c can be formed from circuit 400b of FIG. 4B by depositing, or transferring, a hard mask 408. In some implementations, hard mask 408 comprises silicon dioxide.

Figure 4D:
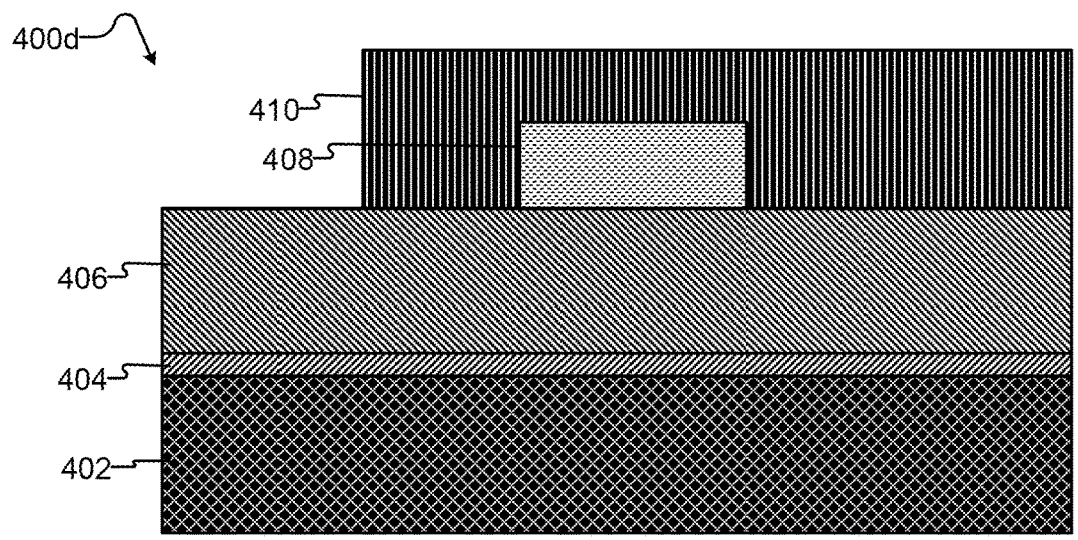

FIG. 4D is a sectional view of a portion of a superconducting circuit 400d at a subsequent stage of the fabrication process. Superconducting integrated circuit 400d can be formed from circuit 400c of FIG. 4C by depositing, or transferring, a soft mask 410 to overlie at least a portion of the hard mask and at least a portion of the stud via layer. In some implementations, the soft mask comprises photoresist.

Figure 4E:
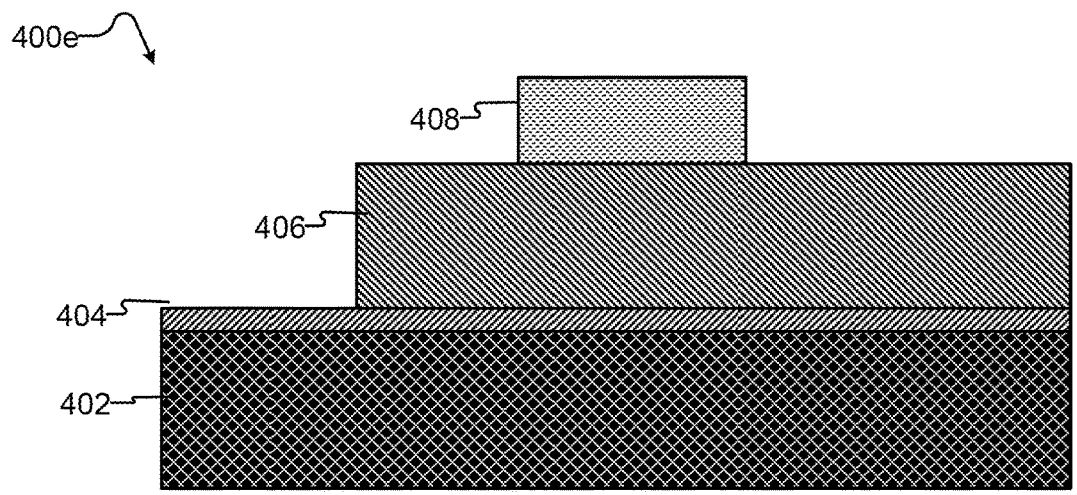

FIG. 4E is a sectional view of a portion of a superconducting circuit 400e at a subsequent stage of the fabrication process. Superconducting integrated circuit 400e can be formed from circuit 400d of FIG. 4D by etching second superconducting metal layer 406 (the stud via layer) to etch stop layer 404.

Figure 4F:
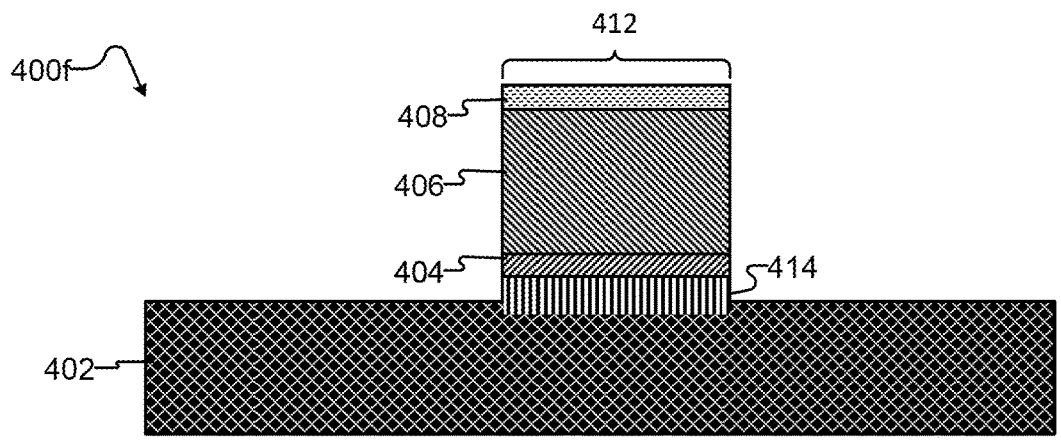

FIG. 4F is a sectional view of a portion of a superconducting circuit 400f at a subsequent stage of the fabrication process. Superconducting integrated circuit 400f can be formed from circuit 400e of FIG. 4E by etching second superconducting layer 406, etch stop layer 404, and first superconducting layer 402 to form a superconducting stud via 412.

Superconducting stud via 412 can include at least a portion of each of second superconducting layer 406, etch stop layer 404, and first superconducting layer 402. The portion of first superconducting metal layer 402 that forms part of superconducting stud via 412 is portion 414.

Figure 5A:
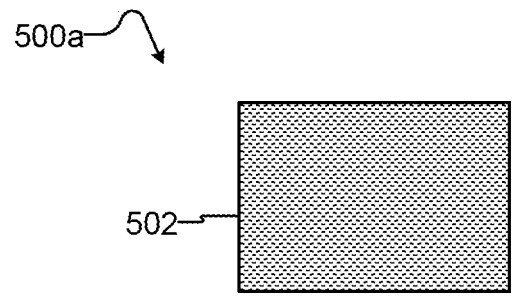
FIGS. 5A to 5E are plan views of a portion of an exemplary superconducting integrated circuit which includes a stud via, an upper wiring layer, and a lower wiring layer, in accordance with the present systems and methods.
Figure 5B:
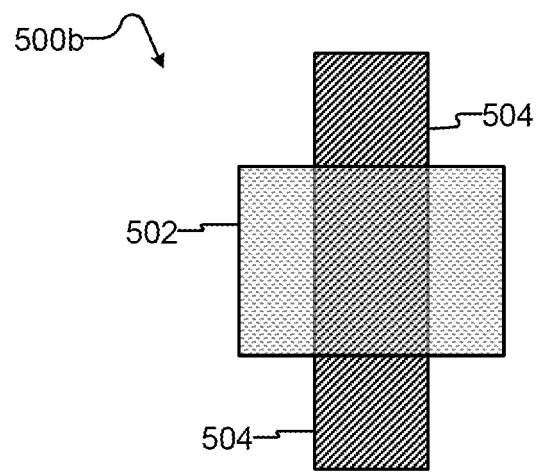
Figure 5C:
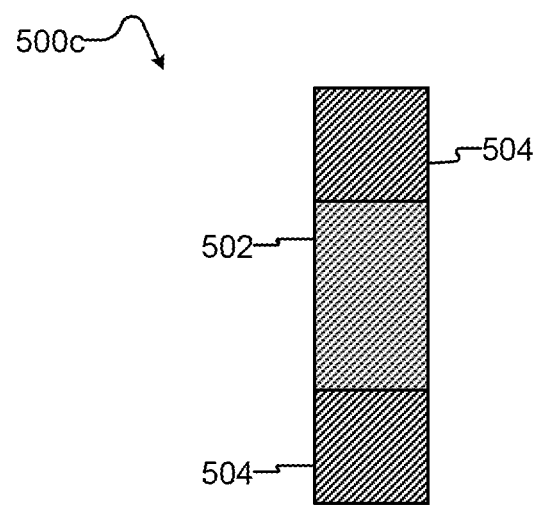

FIGS. 5A to 5C are plan views of a portion of an example superconducting circuit at a various stages of a self-aligned dual-mask process, in accordance with the present systems and methods. The self-aligned dual-mask process illustrated in FIGS. 5A to 5C can be elements of a fabrication process to form superconducting stud vias, such as the fabrication process described above with reference to FIGS. 3 and 4A to 4F.

FIG. 5A is a plan view of a portion of an example superconducting integrated circuit 500a comprising a hard mask 502. Hard mask 502 can be patterned by a first etch process. Hard mask 502 can define a stud via, for example.

FIG. 5B is a plan view of a portion of an example superconducting integrated circuit 500b comprising hard mask 502 and soft mask 504. Soft mask 504 can be deposited, or transferred, to overlie at least a portion of hard mask 502. Soft mask 504 can define a wire, for example.

FIG. 5C is a plan view of a portion of an example superconducting integrated circuit 500c comprising hard mask 502 and soft mask 504, after hard mask 502 has been etched a second time. A stud via and wire defined by hard mask 502 and soft mask 504, respectively, can be self-aligned.

Figure 5D:
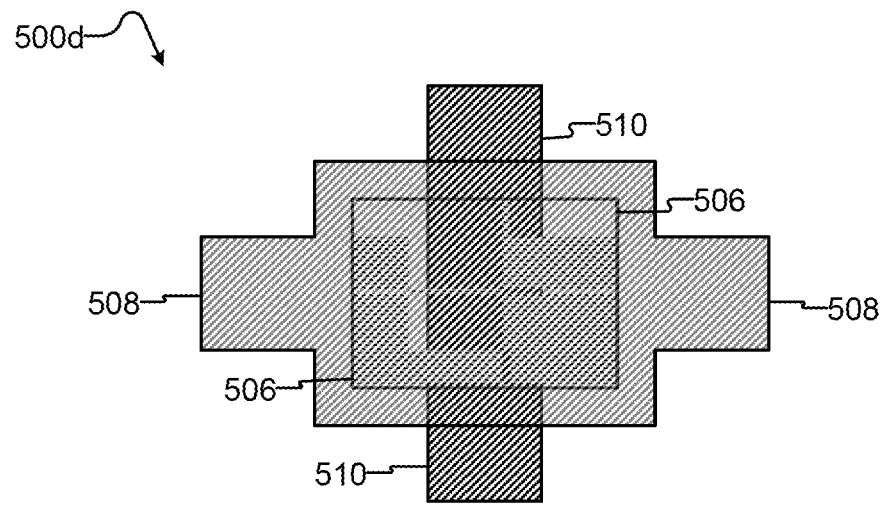

FIG. 5D is a plan view of a portion of an example superconducting integrated circuit 500d showing enclosure of a stud via 506 (defined by etched hard mask 502 of FIGS. 5A to 5C, for example) by an upper wiring layer 508. Stud via 506 can provide a superconducting electrical coupling between upper wiring layer 508 and a lower wiring layer 510. An advantage of the configuration illustrated in FIG. 5D is that the etch of upper wiring layer 508 is less likely to affect stud via 506, which may create planarization problems at a later stage in the fabrication process. In some embodiments, the enclosure is 100 nm.

Figure 5E:
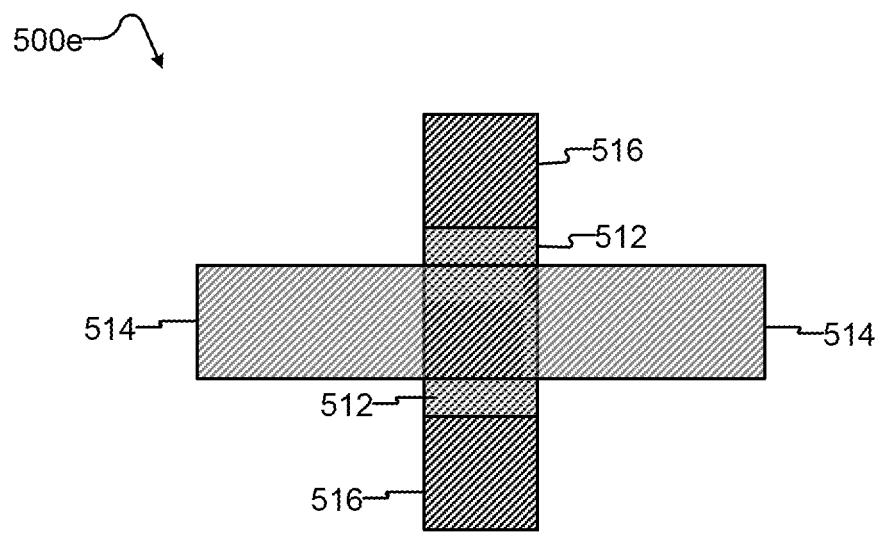

FIG. 5E is a plan view of a portion of an example superconducting integrated circuit 500e showing a stud via 512 providing electrical coupling between two wires 514 and 516 that cross each other. The cross-coupling shown in FIG. 5E can be formed by adding an etch stop layer under the wiring layer of upper wire 514. The etch stop layer can be, for example, a thin layer of aluminum. The etch stop layer can be etched away after the upper wiring layer etch.

Stud Via Formation for Superconducting Applications (with Dielectric Etch Stop Layer)

Figure 6:
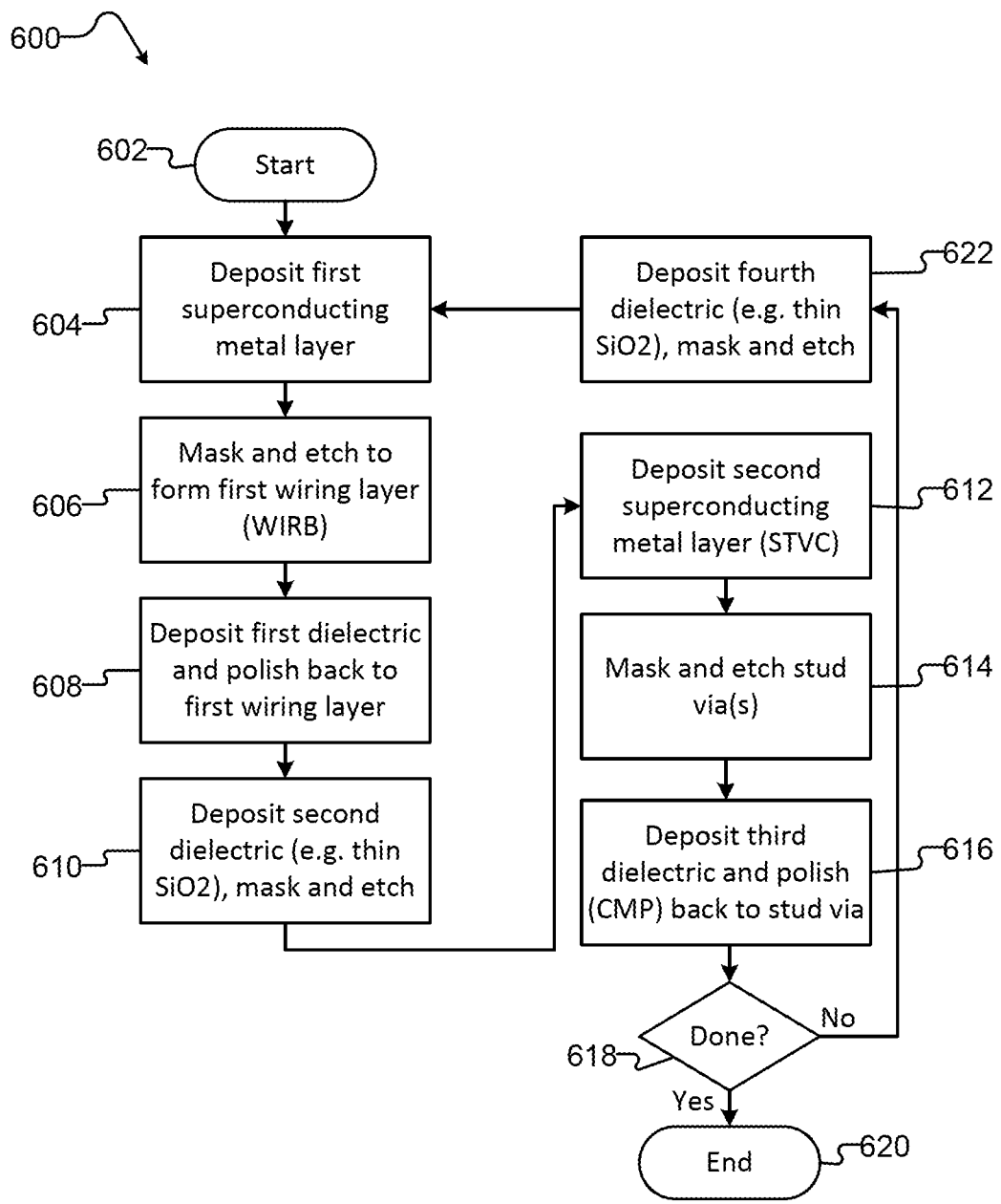
FIG. 6 is a flowchart illustrating a method for fabricating a portion of a superconducting integrated circuit including stud vias, in accordance with the present systems and methods.

FIG. 6 is a flowchart illustrating a method 600 for fabricating a portion of a superconducting integrated circuit including stud vias, in accordance with the present systems and methods. Method 600 includes acts 602-622, though those of skill in the art will appreciate that in alternative embodiments certain acts may be omitted and/or additional acts may be added. Those of skill in the art will appreciate that the illustrated order of the acts is shown for exemplary purposes only and may change in alterative embodiments.

Method 600 starts at 602, for example in response to an initiation of the fabrication process. At 604, a first superconducting metal layer is deposited to overlie a substrate. The first superconducting metal layer is superconducting in a range of temperatures. In some implementations, the first superconducting metal layer comprises niobium. The first superconducting metal layer can be a wiring layer. The wiring layer can be patterned to form one or more superconducting traces. At 606, the first superconducting metal layer is masked and etched to form the wiring layer.

At 608, a first dielectric layer is deposited to overlie at least a portion of the first superconducting metal layer, and polished back to an upper surface of the first superconducting metal layer. In some implementations, the first dielectric comprises silicon dioxide.

At 610, a second dielectric layer is deposited to overlie at least a portion of the first superconducting metal layer, and then masked and etched. In some implementations, the second dielectric layer is a thin layer of silicon dioxide.

At 612, a second superconducting metal layer is deposited to overlie at least a portion of the wiring layer. The second superconducting metal layer is superconducting in a range of temperatures. In some implementations, the second superconducting metal layer comprises at least one of niobium and aluminum. The second superconducting metal layer is a stud via layer.

At 614, the second superconducting metal is masked and etched to form one or more stud vias. At 616, a third dielectric layer is deposited, and polished back to an upper surface of at least one of the stud vias. In some implementations, polishing includes CMP. If, at 618, the fabrication of stud vias is complete because no more stud via layers are desired to be added, control of method 600 proceeds to 620 and method 600 ends.

If, at 618, another stud via layer is desired to be added, control of method 600 proceeds to 622, and a fourth dielectric layer is deposited, masked and etched. Acts 604 to 618 are repeated to add another stud via layer. In one implementation, method 600 does not include act 622 and act 618 proceeds directly to act 604.

After 618, some oxide can remain on the upper surface of a stud via. Optionally, acts can be included to at least reduce the amount of oxide remaining on the upper surface of the via. One approach is to use another mask and perform a gentle etch of the upper surface of the stud via to remove at least some of the oxide remaining after 618. Another approach is to use a reverse mask process, and replace 618 by the following: i) depositing a third dielectric layer of at least approximately the same thickness as the stud via layer, ii) masking, and then etching dielectric from at least a portion of the third dielectric layer that overlies the stud via, and iii) performing a gentle CMP (buffer) to remove at least some of the remaining dielectric that overlies the stud via after etching.

FIGS. 7A to 7G are sectional views of a portion of an exemplary superconducting integrated circuit including stud vias, at various stages of their fabrication, in accordance with the present systems and methods.

Figure 7A:
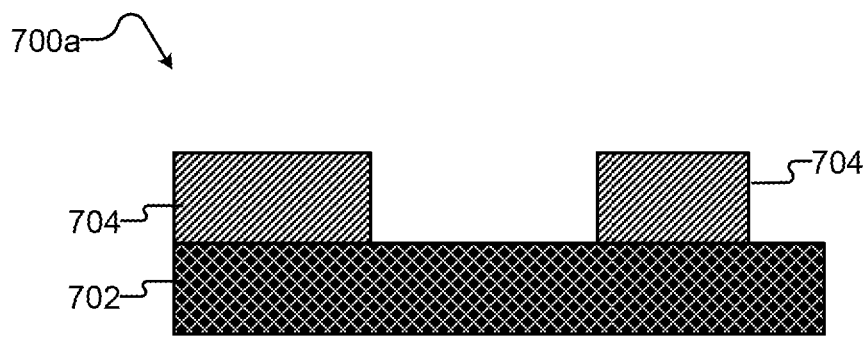
FIGS. 7A to 7H are sectional views of a portion of another exemplary superconducting integrated circuit including stud vias, at various stages of its fabrication, in accordance with the present systems and methods.

FIG. 7A is a sectional view of a portion of a superconducting integrated circuit 700a at a first stage of a fabrication process described by method 600 of FIG. 6. Circuit 700a comprises a substrate 702 and a first wiring layer 704 deposited and patterned to overlie at least a portion of substrate 702. First wiring layer 704 is superconducting in a range of temperatures. In some implementations, first wiring layer 704 comprises niobium. In other implementations, first wiring layer 704 comprises aluminum. The wiring layer comprises one or more superconducting traces.

Figure 7B:
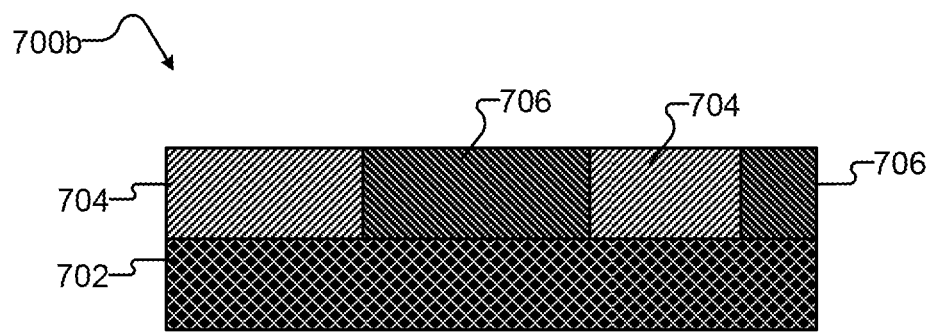

FIG. 7B is a sectional view of a portion of a superconducting integrated circuit 700b at a subsequent stage of the fabrication process. Superconducting integrated circuit 700b can be formed from circuit 700a of FIG. 7A by depositing a first dielectric layer 706 to overlie at least a portion of substrate 702 and first wiring layer 704, and polishing first dielectric layer 706 back to an upper surface of at least a portion of first wiring layer 704. In some implementations, first dielectric layer 706 comprises silicon dioxide. In some implementations, polishing first dielectric layer 706 includes CMP.

Figure 7C:
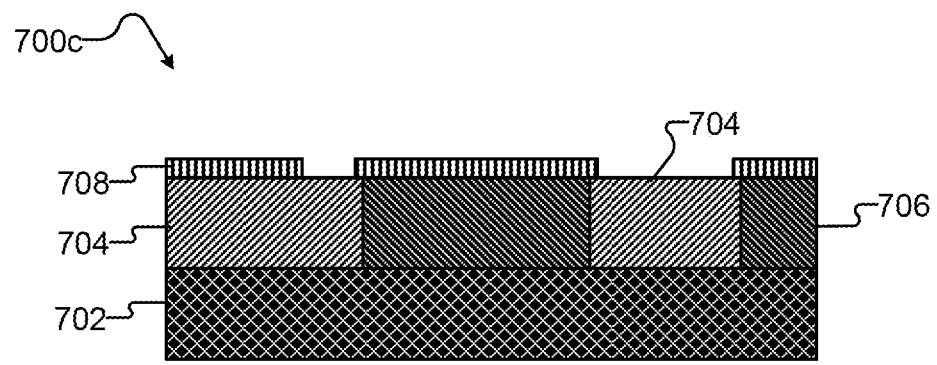

FIG. 7C is a sectional view of a portion of a superconducting circuit 700c at a subsequent stage of the fabrication process. Superconducting integrated circuit 700c can be formed from circuit 700b of FIG. 7B by depositing, then masking and etching, a second dielectric layer 708 to overlie at least a portion of first dielectric layer 706. In some implementations, second dielectric layer 708 is a thin layer of silicon dioxide.

Figure 7D:
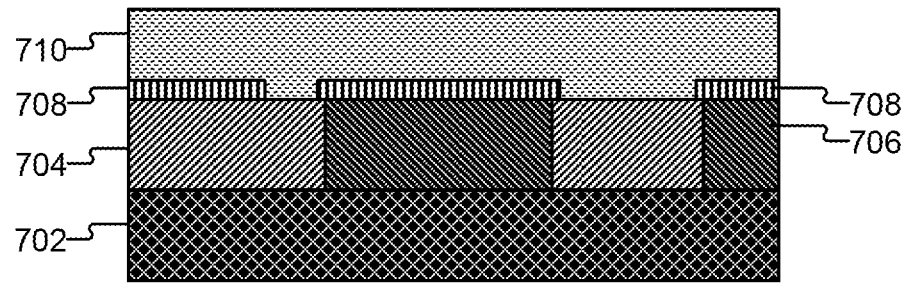

FIG. 7D is a sectional view of a portion of a superconducting circuit 700d at a subsequent stage of the fabrication process. Superconducting integrated circuit 700d can be formed from circuit 700c of FIG. 7C by depositing a second superconducting metal layer 710 to overlie at least a portion of first wiring layer 704 and second dielectric layer 708. Second superconducting metal layer 710 is superconducting in a range of temperatures. In some implementations, second superconducting metal layer 710 comprises at least one of niobium and aluminum. In one implementation, second superconducting metal layer 710 comprises aluminum with a thin niobium layer that overlies at least a portion of second superconducting metal layer 710. The thin niobium layer can function as a polish stop or protective layer. Second superconducting metal layer can be a stud via layer.

Figure 7E:
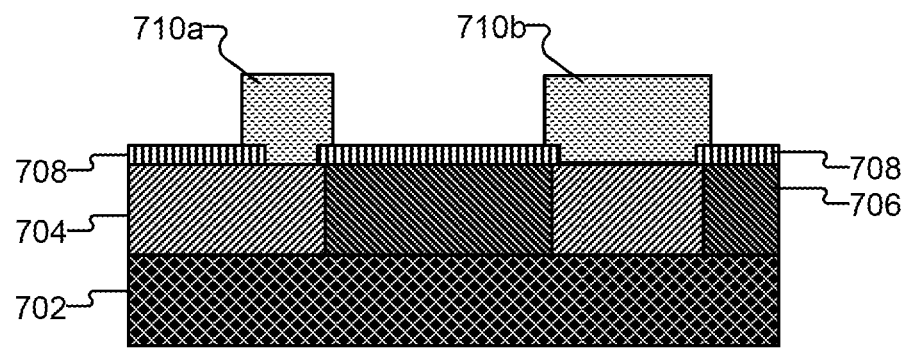

FIG. 7E is a sectional view of a portion of a superconducting circuit 700e at a subsequent stage of the fabrication process. Superconducting integrated circuit 700e can be formed from circuit 700d of FIG. 7D by masking and etching second superconducting metal layer 710 of FIG. 7D to form one or more superconducting stud vias, for example 710a and 710b of FIG. 7E.

Figure 7F:
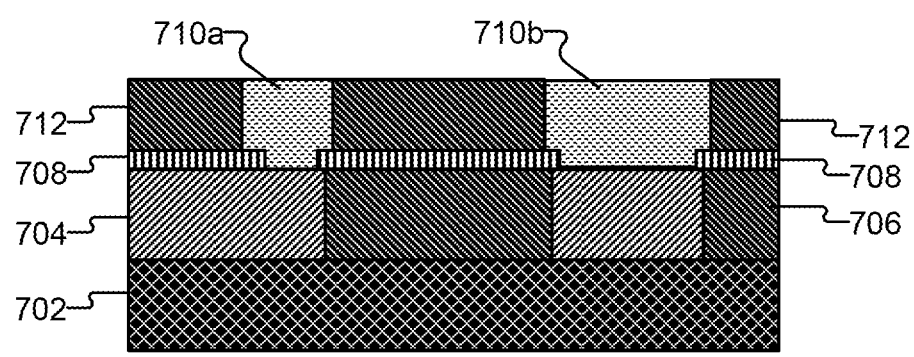

FIG. 7F is a sectional view of a portion of a superconducting circuit 700f at a subsequent stage of the fabrication process. Superconducting integrated circuit 700f can be formed from circuit 700e of FIG. 7E by depositing a third dielectric layer 712, and polishing third dielectric layer 712 back to an upper surface of at least a portion of stud vias 710a and 710b. In some implementations, third dielectric layer 712 comprises silicon dioxide. In some implementations, polishing third dielectric layer 712 includes CMP.

Figure 7G:
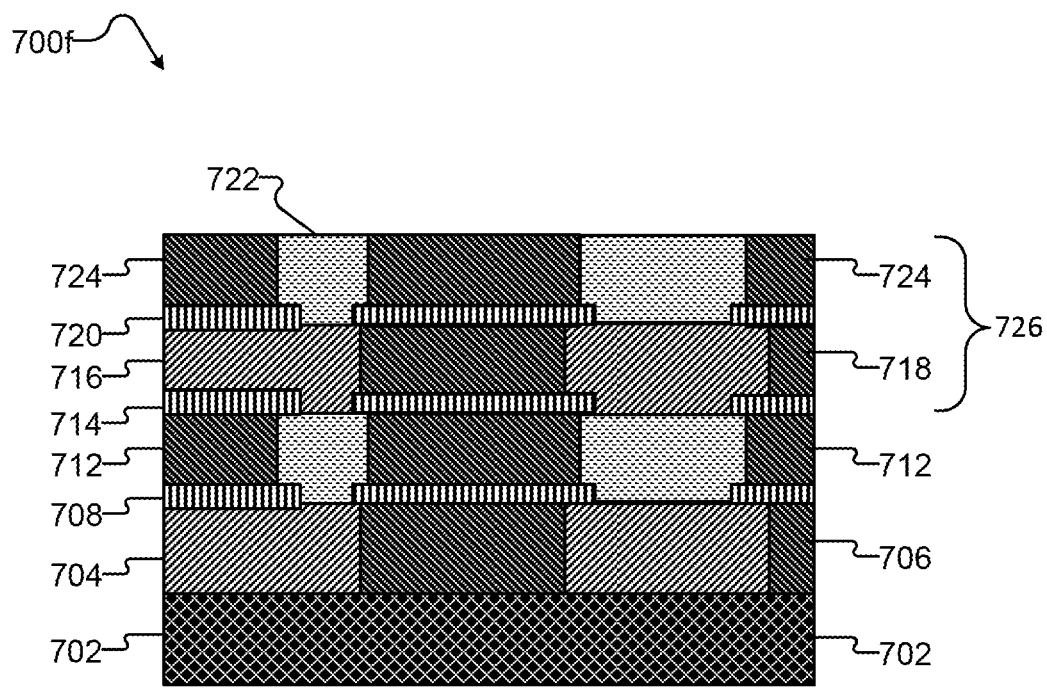

FIG. 7G is a sectional view of a portion of a superconducting circuit 700g at a subsequent stage of the fabrication process. Superconducting integrated circuit 700g can be formed from circuit 700f of FIG. 7F by adding the following:

a) a fourth dielectric layer 714 to overlie at least a portion of third dielectric layer 712 and stud vias 710a and 710b, b) a second wiring layer 716 to overlie at least a portion of fourth dielectric layer 714, c) a fifth dielectric layer 718 to overlie at least a portion of fourth dielectric layer 714, and polishing fifth dielectric layer 718 back to an upper surface of second wiring layer 716, d) a sixth dielectric layer 720 to overlie at least a portion of second wiring layer 716, e) a second stud via layer 722, and f) a seventh dielectric layer 724 to overlie at least a portion of sixth dielectric layer 720, and polishing seventh dielectric layer 718 back to an upper surface of second stud via layer 722.

In some implementations, second wiring layer 716 comprises niobium. In some implementations, second stud via layer 722 comprises at least one of niobium and aluminum. In some implementations, fifth dielectric layer 718 and seventh dielectric layer 724 comprise silicon dioxide. In some implementations, sixth dielectric layer 720 is a thin layer of silicon dioxide. In some implementations, the thickness of sixth dielectric layer 720 is in the range 50 nm to 200 nm.

The operations or acts described above with reference to FIGS. 7A to 7G may be repeated for additional dielectric and wiring layers (with additional stud via connections as desired) to provide as many layers as necessary in any specific integrated circuit design.

Figure 7H:
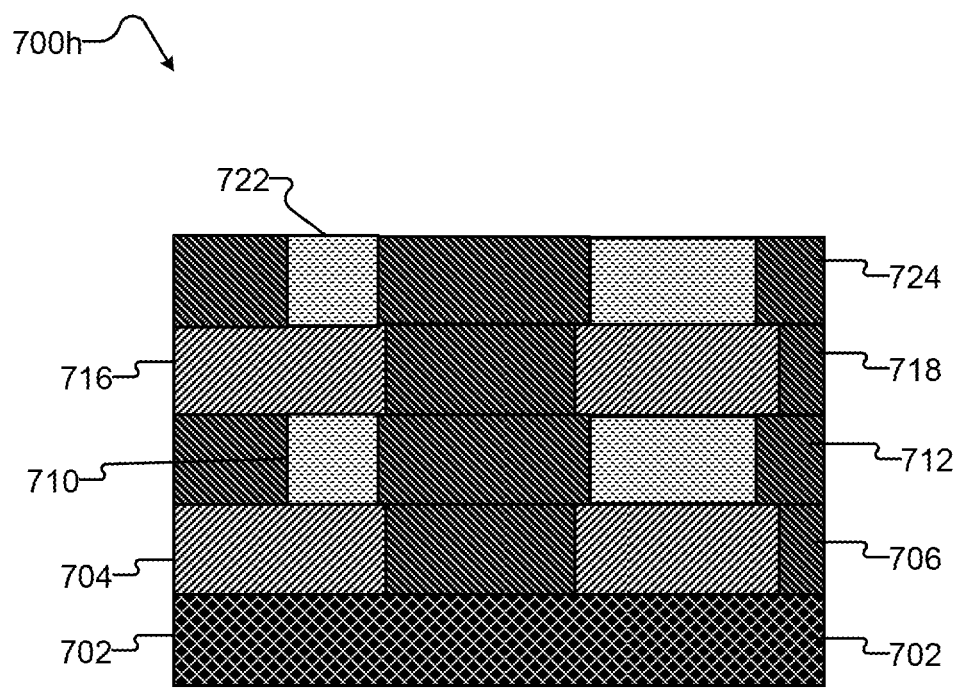

In some implementations, some of the dielectric layers illustrated in FIG. 7G may be omitted. For example, in some implementations, a process for fabricating superconducting integrated circuit including stud vias can omit at least one of the following: second dielectric layer 708, fourth dielectric layer 714, and sixth dielectric layer 720. For example, FIG. 7H is a sectional view of a portion of a superconducting circuit 700h at a subsequent stage of a fabrication process wherein:

a) first wiring layer 704 is deposited to overlie substrate 702, then masked and etched;

b) first dielectric layer 706 is deposited to overlie at least a portion of substrate and first wiring layer 704, then polished back to upper surface of first wiring layer 704;

c) stud via layer 710 is deposited to overlie at least a portion of first wiring layer 704, then masked and etched;

d) third dielectric layer 712 is deposited to overlie at least a portion of first dielectric layer 706 and polished back to an upper surface of stud via layer 710;

e) second wiring layer 716 is deposited to overlie at least a portion of second stud via layer 710, then masked and etched;

f) fifth dielectric layer 718 is deposited to overlie at least a portion of third dielectric layer 712 and polished back to an upper surface of second wiring layer 716;

g) second stud via layer 722 is deposited to overlie at least a portion of second wiring layer 716, then masked and etched;

h) seventh dielectric layer 724 is deposited to overlie fifth dielectric layer 718 and polished back to an upper surface of second stud via layer 722.

FIG. 7H illustrates one example implementation wherein second dielectric layer 708, fourth dielectric layer 714, and sixth dielectric layer 720 are omitted from superconducting integrated circuit 700g of FIG. 7G. In other implementations, one or two of: second dielectric layer 708, fourth dielectric layer 714, and sixth dielectric layer 720 can be omitted. As previously described, there can be additional dielectric and wiring layers (with additional stud via connections as desired) to provide as many layers as necessary in any specific integrated circuit design.

In some cases of superconducting integrated circuit fabrication, it can be advantageous to deposit a thin polish stop layer to overlie at least a portion of a metal layer to protect at least of portion of the metal layer from being scratched when an overlying dielectric is polished back. A process for fabricating a superconducting integrated circuit including stud via formation with a polish stop layer is illustrated in FIGS. 17A to 17G.

Electrical Verniers for Measuring Interlayer Misalignment

It can be beneficial to identify misaligned layers while screening wafers containing superconducting integrated circuits that include one or more superconducting wiring layers and one or more superconducting stud vias. The systems and methods described below may measure interlayer misalignment on superconducting integrated circuits to an accuracy of, for example, 10 nm. Optical measurements of interlayer misalignment can have shortcomings. The systems and methods described below use an electrical measurement for determining layer misalignment.

Electrical verniers can detect layer misalignment by measuring resistance during wafer-probing with a four-wire measurement. The four-wire measurement is illustrated in FIG. 8C and described in more detail below.

Figure 8A:
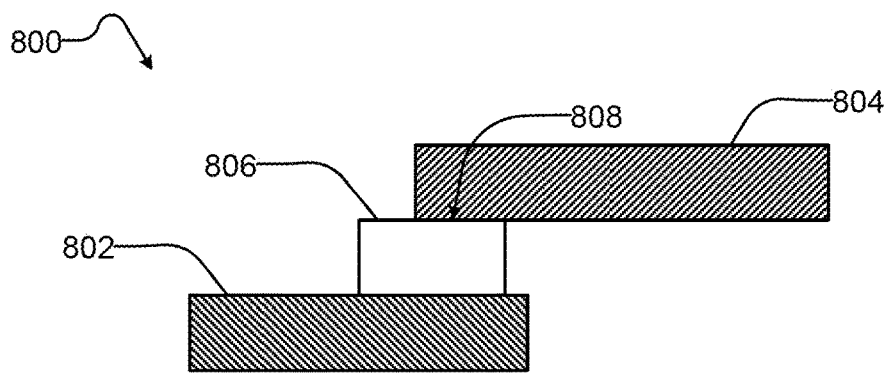
FIG. 8A is a sectional view of a portion of an exemplary superconducting integrated circuit which includes an electrical vernier, in accordance with the present systems and methods.

FIG. 8A is a sectional view of a portion of an exemplary superconducting integrated circuit which includes an electrical vernier 800, in accordance with the present systems and methods. Vernier 800 comprises a first mark 802 in a first wiring layer (e.g. WIRA), a second mark 804 in a second wiring layer (e.g. WIRB), and a stud via 806. Mark 804 overlaps stud via 806 at resistive overlap region 808. Appropriate selection of the dimensions of marks 802 and 804, and stud via 806, can cause resistive overlap region 808 to dominate a resistance measurement from the first wiring layer to the second wiring layer through the stud via. Specifically, marks 802 and 804, and stud via 806 can be selected to be large enough that they have a much lower resistance than resistive overlap region 808.

Figure 8B:
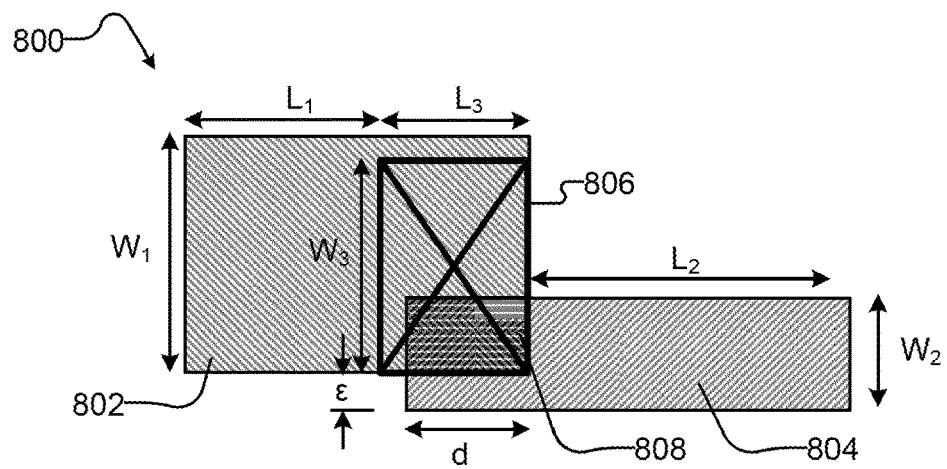
FIG. 8B is a plan view of a portion of the exemplary superconducting integrated circuit of FIG. 8A, in accordance with the present systems and methods.
Figure 8C:
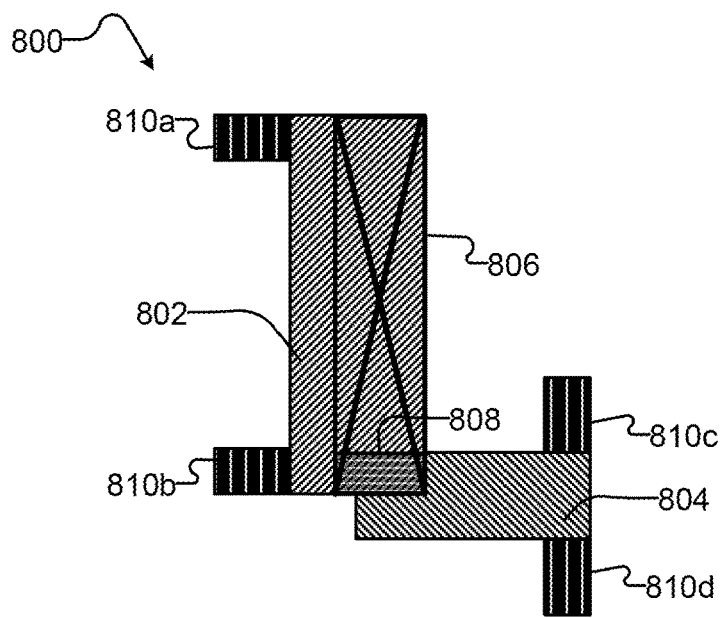
FIG. 8C is a schematic showing a portion of the exemplary superconducting integrated circuit of FIG. 8A with leads attached for a four-wire measurement, in accordance with the present systems and methods.

FIG. 8B is a plan view of a portion of the exemplary superconducting integrated circuit of FIG. 8A which includes electrical vernier 800. First mark 802 has width $W_1$, length ($L_1+L_3$), and thickness $t_{wire}$ (not shown in FIG. 8B). Second mark 804 has width $W_2$, length ($L_2+d$), and thickness $t_{wire}$. Stud via 806 has width $W_3$ and length $L_3$. Mark 804 is offset laterally from mark 802 by distance ε.

While not illustrated in the example shown in FIG. 8B, first mark 802 can be offset with respect to stud via 806 parallel to the length of first mark 802 and/or perpendicular to the length of first mark 802.

FIG. 8C is a schematic showing a portion of the exemplary superconducting integrated circuit which includes electrical vernier 800 of FIG. 8A with leads attached for a four-wire measurement. The circuit includes four leads 810a, 810b, 810c, and 810d. Two leads 810a and 810b are electrically connected to mark 802, and two leads 810c and 810d are electrically connected to mark 804. FIG. 8C illustrates a configuration that can perform an interlayer misalignment measurement using electrical vernier 800.

The resistance of a wire is $R=\rho L/A=\rho L/t \times W$, where ρ is the resistivity, L is the length of the wire, A is the area of the wire, t is the thickness of the wire, and W is the width of the wire. The total resistance for a vernier mark is the sum of contributions from the upper and lower wires, and the overlaps between the stud via and the upper and lower wires. A suitable selection of wire and stud via dimensions can cause the resistance of the overlap between the stud via and the upper wire to dominate the measured value of total resistance. Suitable values can be found, for example, by sweeping through possible geometries and, for each one, determining the change in resistance between typical misalignments. Values can be selected, for example, based on achieving a desired change in resistance for a given misalignment while maintaining a small footprint on the chip.

In one example selection, the change in resistance is determined between offsets of 0 nm and 20 nm. In one measurement scenario, a change in resistance of between 0.5% and 5% is suitable for measuring interlayer misalignment.

An example selection of wire and stud via dimensions is as follows:

$L_A=L_V=d=250$ nm
$L_B=500$ nm
$W_A=W_V=2{,}000$ nm
$W_B=250$ nm
$t_{wire}=300$ nm
$t_{via}=200$ nm For niobium wires and niobium stud via, the calculation of resistance for an offset of ε is as follows:

$$R_{total} = \rho_{Nb}\left(\frac{L_A}{t_{wire}W_A} + \frac{(t_{wire}+t_{via})}{L_V W_V} + \frac{t_{wire}}{d(W_B-\varepsilon)} + \frac{L_B}{t_{wire}W_B}\right)$$

The fractional change in resistance for a change of offset from 0 nm to $\varepsilon_0$ nm is:

$$\frac{\Delta R_{total}}{R_{total}} = \frac{\rho_{Nb}t_{wire}}{dW_B R_{total}}\left(\frac{W_B}{(W_B-\varepsilon_0)}-1\right)$$

For $\rho_{Nb}=152$ nΩm, the fractional change expressed as a percentage is 3.2% when $\varepsilon_0=20$ nm, and 0.8% when $\varepsilon_0=5$ nm.

Figure 9:
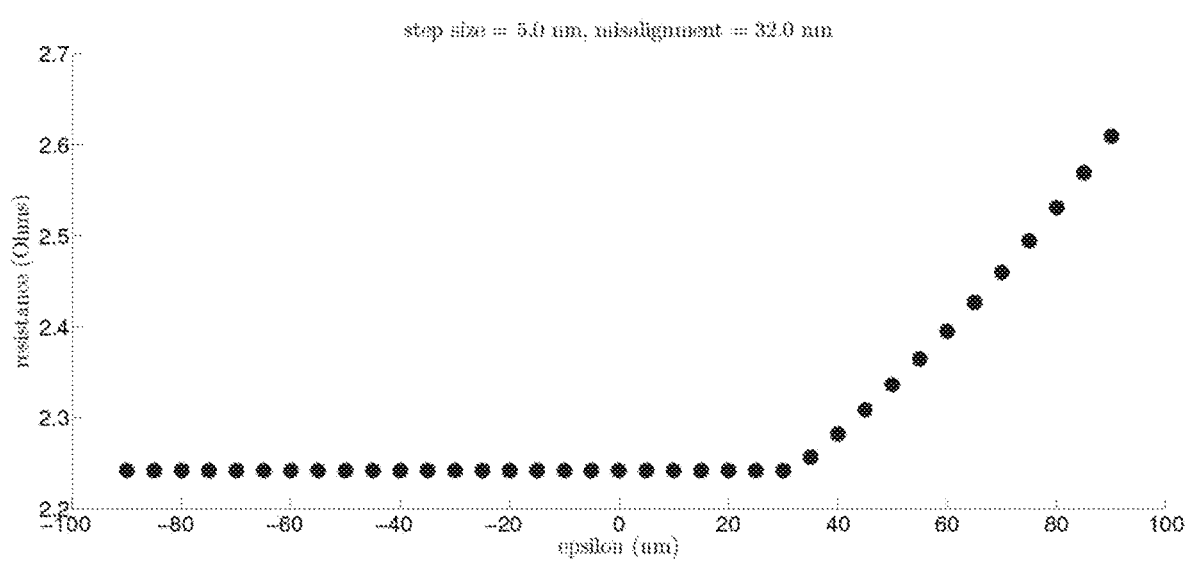
FIG. 9 is an example plot illustrating a variation of resistance (in ohms) as a function of a lateral offset (in nm) of an edge of a top wiring layer from an edge of a stud via in the exemplary superconducting integrated circuit of FIGS. 8A to 8C, in accordance with the present systems and methods.

FIG. 9 is an example plot illustrating a variation of resistance (in ohms) as a function of a lateral offset ε (in nm) of an edge of a top wiring layer from an edge of a stud via in the exemplary superconducting integrated circuit of FIGS. 8A to 8C, in accordance with the present systems and methods. Each point on the graph of FIG. 9 is a measurement of resistance for a different vernier mark. In the example shown in FIG. 9, there are measurements for 37 vernier marks, each having a respective offset, the offsets in the range −90 nm to +90 nm with a step size of 5 nm. The misalignment can be inferred from the position along the horizontal axis of the knee of the curve in FIG. 9. The example shown in FIG. 9 is for an interlayer misalignment of 32 nm. The knee of the curve occurs at 32 nm on the horizontal axis.

In some implementations, overetch of the stud via layer can occur when etching the wire layer above it. In some implementations, the overetch is in the range 120 nm to 200 nm. The interlayer misalignment can be measured in the presence of overetch using an electrical vernier such as vernier 800 of FIG. 8A.

In some implementations, there can be an overetch of the stud via layer when etching the upper wire layer (e.g. overetch of STVB when etching WIRB). In some situations, there can be a complete overetch of the stud via layer, in which case the stud via no longer extends beyond the boundaries of the upper wire layer. An advantage of a complete overetch is that the measured misalignment between layers is a direct measurement of the misalignment between the upper and lower layers.

With complete overetch, the fractional change in resistance for a change of offset from 0 nm to $\varepsilon_0$ nm is:

$$\frac{\Delta R_{total}}{R_{total}} = \frac{\rho_{Nb}(t_{wire} + t_{via})}{dW_B R_{total}} \left( \frac{W_B}{(W_B - \varepsilon_0)} - 1 \right)$$

For $\rho_{Nb}$=152 nΩm, and $W_B$=500 nm, the fractional change expressed as a percentage is 1.6% when $\varepsilon_0$=20 nm, and 0.4% when $\varepsilon_0$=5 nm.

The selection of dimensions for the vernier marks can be generalized to an overetch between no overetch and complete overetch as follows:

With an overetch of E, the fractional change in resistance for a change of offset from 0 nm to $\varepsilon_0$ nm is:

$$\frac{\Delta R_{total}}{R_{total}} = \frac{\rho_{Nb}(t_{wire} + E)}{dW_B R_{total}} \left( \frac{W_B}{(W_B - \varepsilon_0)} - 1 \right)$$

For $\rho_{Nb}$=152 nΩm, $L_B$=250 nm, $L_V$=500 nm, $W_A$=1,000 nm, $W_B$=500 nm, E=120 nm, the fractional change expressed as a percentage is approximately 2% when $\varepsilon_0$=20 nm, and approximately 0.5% when $\varepsilon_0$=5 nm. As the overetch increases, the overlap region becomes more dominant, and the overetch increases total resistance at least approximately linearly.

In one implementation of electrical verniers to measure interlayer misalignment, the stud via layer (STVB) can be misaligned in fabrication relative to the lower wiring layer (WIRA) by up to 100 nm in the along-wire dimension and the across-wire dimension (e.g., either case denominated as "within plane" misalignment). The upper wiring layer (WIRB) can be misaligned in fabrication relative to WIRA by up to 100 nm in the along-wire dimension and the across-wire dimension (e.g., either case either case denominated as "within plane" misalignment). In the same implementation, STVB is larger than the overlap of WIRA and WIRB by at least 100 nm in the along-wire direction, and STVB is larger than the overlap of WIRA and WIRB by at least 225 nm in the across-wire direction. The distance between edges of the STVB is at least 1,000 nm. In some implementations, the overlap of WIRA and WIRB is 250 nm×250 nm.

Figure 15A:
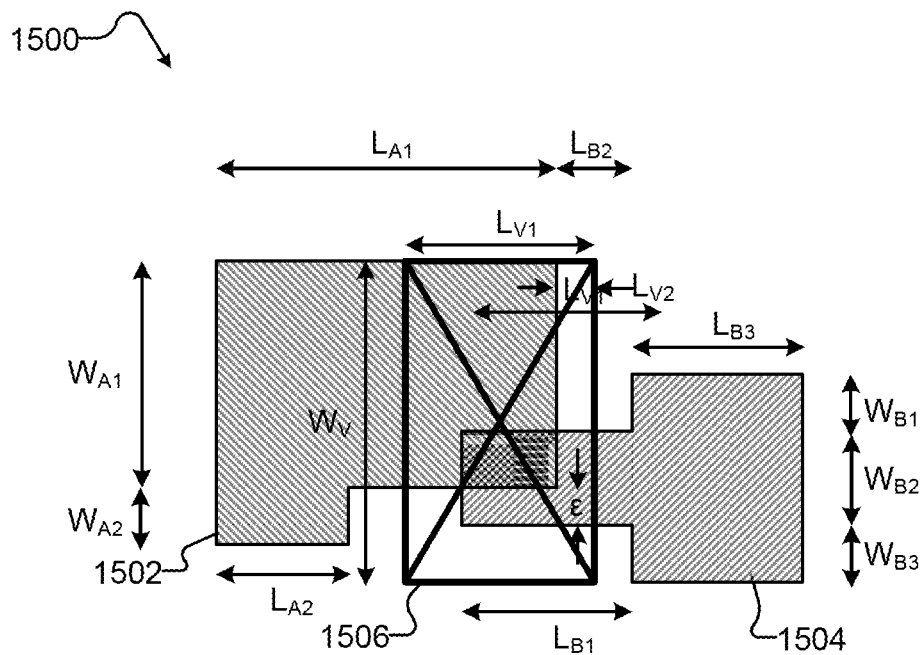
FIGS. 15A and 15B are views of an exemplary superconducting integrated circuit which includes overetch of a stud via layer, in accordance with the present systems and methods.
Figure 15B:
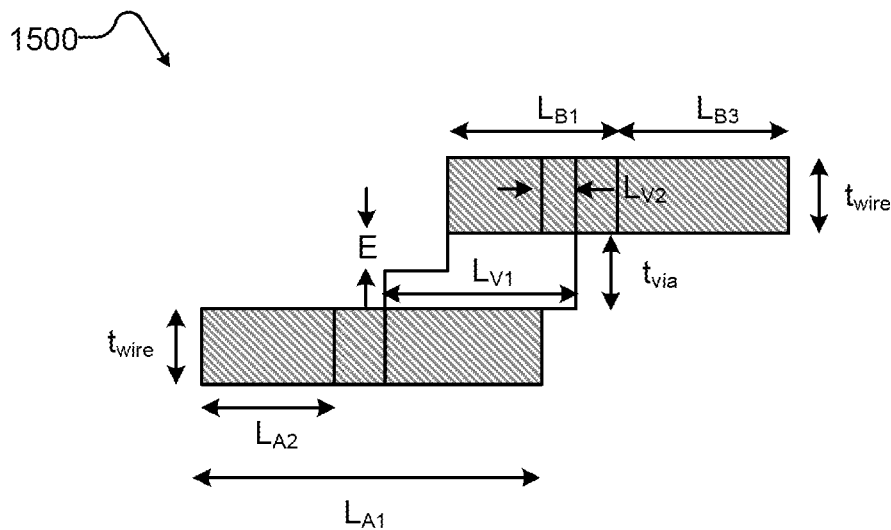

FIGS. 15A and 15B are views of an exemplary superconducting integrated circuit 1500 which includes overetch of a stud via layer. FIGS. 15A and 15B label the dimensions of circuit 1500, including upper and lower wires, and a stud via. FIG. 15A is a plan view and FIG. 15B is a sectional view.

Example dimensions for one implementation are listed in Table 1 below.

TABLE 1

| Example Dimensions | |
|---|---|
| Name | Example dimension |
| $L_{A1}$ | 875 nm |
| $L_{A2}$ | 375 nm |
| $W_{A1}$ | 500 nm |
| $W_{A2}$ | 125 nm |
| $L_{V1}$ | 450 nm |
| $L_{V2}$ | 100 nm |
| $W_V$ | 750 nm |
| $L_{B1}$ | 500 nm |
| $L_{B2}$ | 250 nm |
| $W_{B1}$ | 125 nm |
| $W_{B2}$ | 250 nm |
| $W_{B3}$ | 125 nm |

The above described implementations and dimensions are examples. Other dimensions and overlaps can be used. A person of ordinary skill in the art will appreciate that other dimensions and combinations can be used to measure interlayer misalignment using electrical verniers.

In some implementations, some electrical verniers are constructed using offsets of WIRA with respect to STVB, and other electrical verniers are constructed using offsets of WIRB with respect to STVB. These verniers can be used to separate the combined effects of interlayer misalignment between WIRA and STVB, and WIRB and STVB.

Electrical Verniers for Measuring Interlayer Misalignment (Chains and Wheatstone Bridge)

One approach to measuring interlayer misalignment is to use a chain of electrical verniers. This approach can overcome some of the challenges of measuring low resistances. One challenge is the heating that can be caused by currents flowing in the wires. For example, a current of more than 1 mA through 250 nm wires can cause sufficient heating to distort the resistance measurement.

One approach for addressing this challenge is to lower the current flowing through the wire. However, some measurement instruments do not allow an adjustment to be made to lower the current. Also, lowering the current can affect the precision of the measurements.

A better approach for mitigating heating caused by current flow, and one that can be applied to most measurement instruments, is to increase the resistance of the electrical verniers, for example by constructing a chain of electrical verniers. In some implementations, a chain of up to, for example, 1,000 electrical verniers can be used to measure interlayer misalignment. The dimensions of the electrical verniers can be selected to provide a desired measurement sensitivity.

Figure 10A:
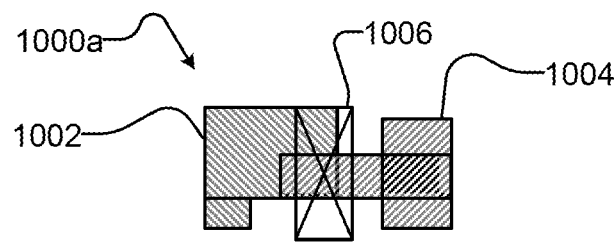
FIG. 10A is a plan view of a portion of an exemplary superconducting integrated circuit which includes an electrical vernier, in accordance with the present systems and methods.

FIG. 10A is a plan view of a portion of an exemplary superconducting integrated circuit which includes an electrical vernier 1000a, in accordance with the present systems and methods. Vernier 1000*a* comprises a first mark 1002, a second mark 1004, and a stud via 1006.

Figure 10B:
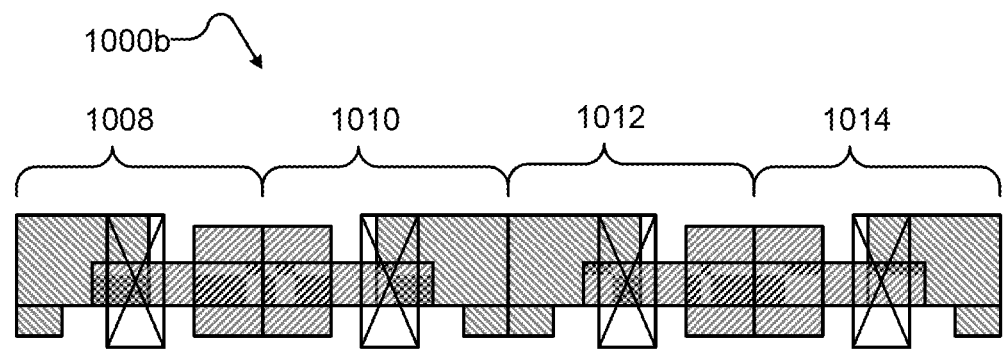
FIG. 10B is a plan view of a portion of an exemplary superconducting integrated circuit which includes an example implementation of a chain of electrical verniers, in accordance with the present systems and methods.

FIG. 10B is a plan view of a portion of an exemplary superconducting integrated circuit which includes an example implementation of a chain of electrical verniers 1000*b*, in accordance with the present systems and methods. Chain 1000*b* comprises four electrically connected electrical verniers 1008, 1010, 1012, and 1014.

Figure 10C:
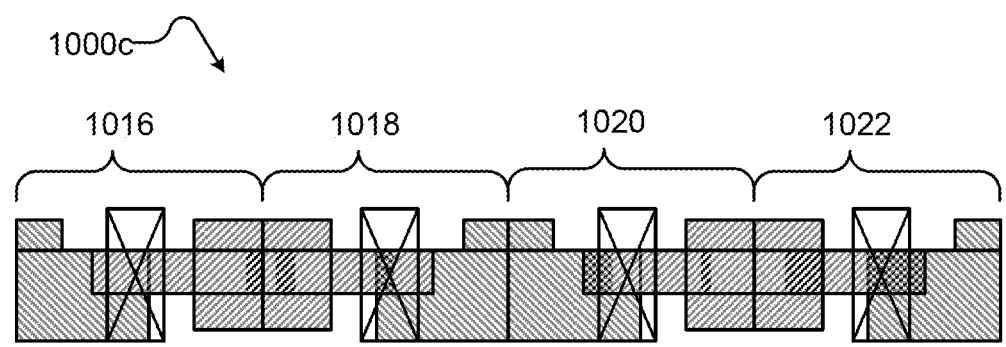
FIG. 10C is a plan view of a portion of an exemplary superconducting integrated circuit which includes another example implementation of a chain of electrical verniers, in accordance with the present systems and methods.

FIG. 10C is a plan view of a portion of an exemplary superconducting integrated circuit which includes another example implementation of a chain of electrical verniers 1000*c*, in accordance with the present systems and methods. Chain 1000*c* comprises four electrically connected electrical verniers 1016, 1018, 1020, and 1022. Chain 1000*c* is a mirror image of chain 1000*b* in the vertical direction. Chains 1000*b* and 1000*c* are example implementations having different configurations of electrical verniers. Though chains 1000*b* and 1000*c* each comprise four verniers, other implementations can include a suitable number of verniers. As previously mentioned, in some implementations, a chain can include, for example, 1,000 verniers.

The total resistance of the chain of verniers can be selected by adjusting the chain length. The resistance can be selected to be in a suitable range for the wafer-probing system. In one example implementation, a resistance of 2,500 ohm can be selected. With a probe able to measure resistances to within 0.2%, interlayer misalignments as small as 2 nm can be detected. In another example implementation, resistance is measured for a chain of 3,200 verniers, the total resistance being approximately 6,000 ohm.

Figure 11:
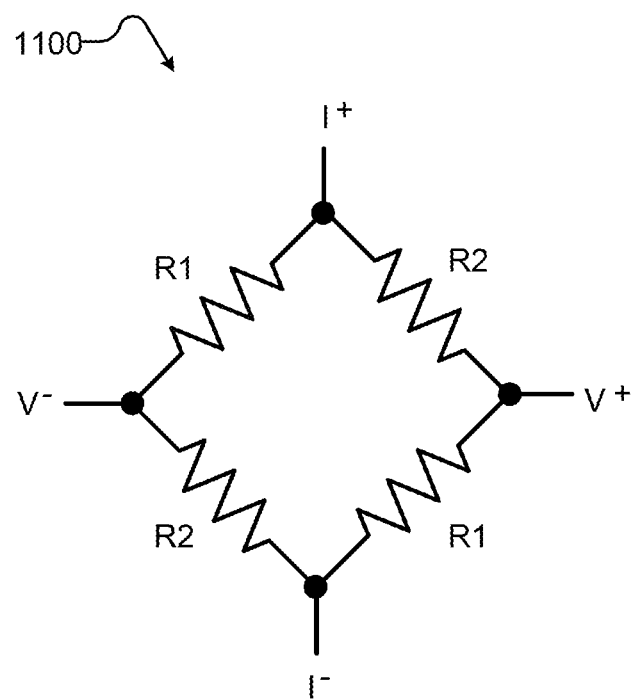
FIG. 11 is a schematic of an example implementation of a Wheatstone bridge, in accordance with the present systems and methods.

Another approach for increasing the signal due to a small change in resistance is to use a bridge circuit, such as a Wheatstone bridge. The Wheatstone bridge is a four-wire measurement of four similarly-valued resistors. FIG. 11 is a schematic of an example implementation of a Wheatstone bridge 1100, showing an arrangement of four resistors. In the example shown in FIG. 11, two arms of the bridge consist of chains in the orientation shown in FIG. 10B, each providing a respective resistance of R1. The opposite two arms of the bridge consist of the same chains mirrored in the vertical direction as shown in FIG. 10C, each providing a respective resistance of R2.

When the upper metal layer is aligned with the lower metal layer, R1 and R2 are equal, and a zero voltage is measured across the bridge. In a first instance, where the upper metal layer is misaligned relative to the lower metal layer, the overlap area on R1 is the same, and the resistance is unchanged. In the mirrored arrangement R2, the overlap area is smaller as a result of the misalignment of the upper and the lower layers. Consequently, resistance R2 is higher than when the layers are aligned, resulting in a non-zero voltage across the bridge. In a second instance, a misalignment in the opposite direction causes R1 to increase in resistance, and R2 to stay the same resistance. The resulting non-zero voltage across the bridge can have an opposite sign to the first instance.

Figure 12:
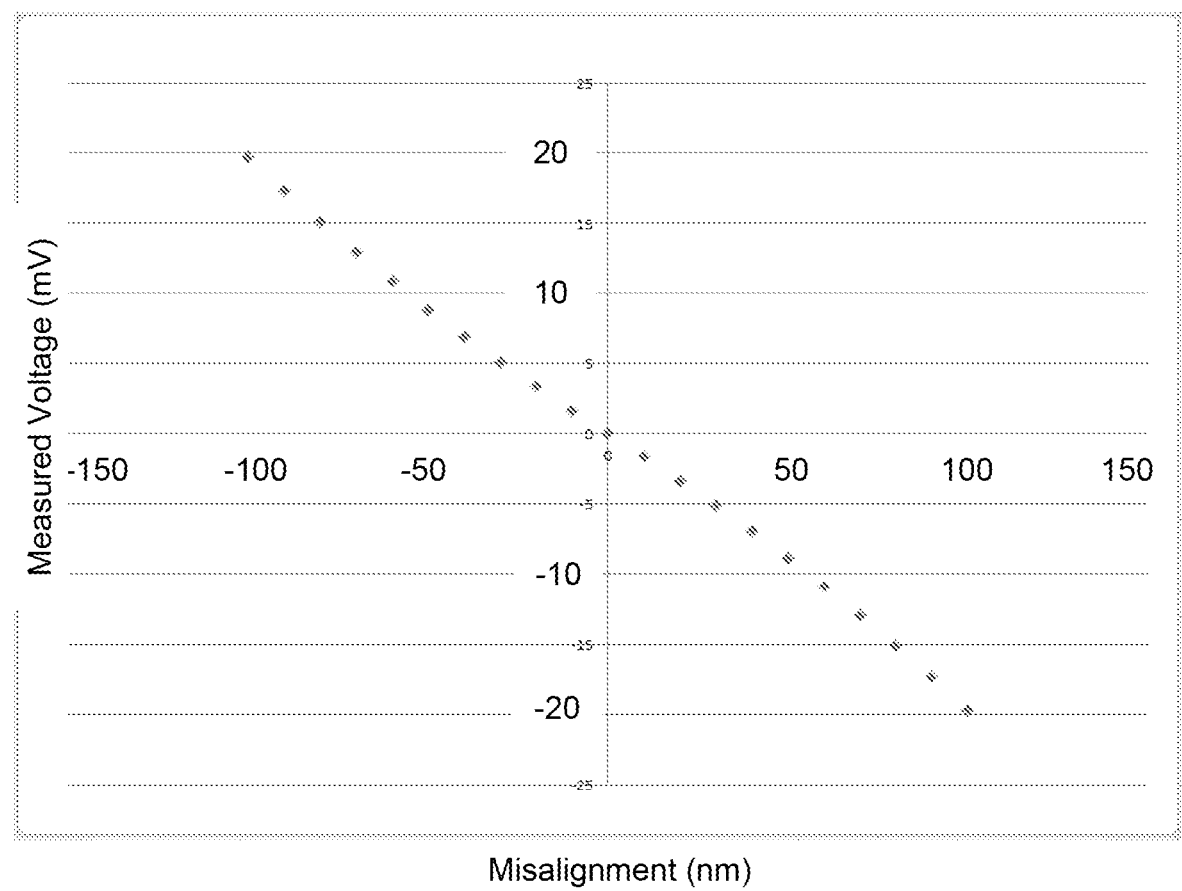
FIG. 12 is an example plot illustrating a variation of measured voltage (in mV) as a function of misalignment (in nm), in accordance with the present systems and methods.

FIG. 12 is an example plot illustrating a variation of measured voltage (in mV) as a function of misalignment (in nm), in accordance with the present systems and methods. A measured voltage can be used to determine an interlayer misalignment. Values of the bridge can be selected to provide a suitable sensitivity to interlayer misalignment.

In the example plot of FIG. 12, the measured voltage is zero if there is no interlayer misalignment. In the example shown, there is an approximately linear relationship between interlayer misalignment and measured voltage, in the voltage range shown. A positive misalignment can cause a negative measured voltage. For example, a measured voltage of −20 mV can result from an interlayer misalignment of approximately 100 nm. With an applied signal of 1 V, and a resolution on a measurement device of a few micro-volts, bridge 1100 of FIG. 11 can measure sub-nm interlayer misalignments.

Enclosed Matched On-Chip Transmission Line for 3-Layer (or Higher) Superconducting Integrated Circuits On-chip transmission lines are ideally designed to be fully enclosed (except at the point of coupling) and 50 ohm matched. Impedance matching ensures that minimal, or at least reduced, signal distortion occurs. Enclosing the transmission line ensures minimal, or at least reduced, coupling to box modes or on-chip structures. Additionally, the shield enclosing the transmission line can at least partially isolate an on-chip device (for example, a qubit) from high-frequency noise propagating on the line.

There can be challenges in implementing a 50 ohm transmission line in a 3-layer (or higher) superconducting integrated circuit. For example, there can be an undesirably large capacitance between the center line and the ground in a fabrication stack, in particular where the dielectric thickness is low and the wire width is too large. A higher capacitance can result in a lower characteristic impedance.

Figure 13A:
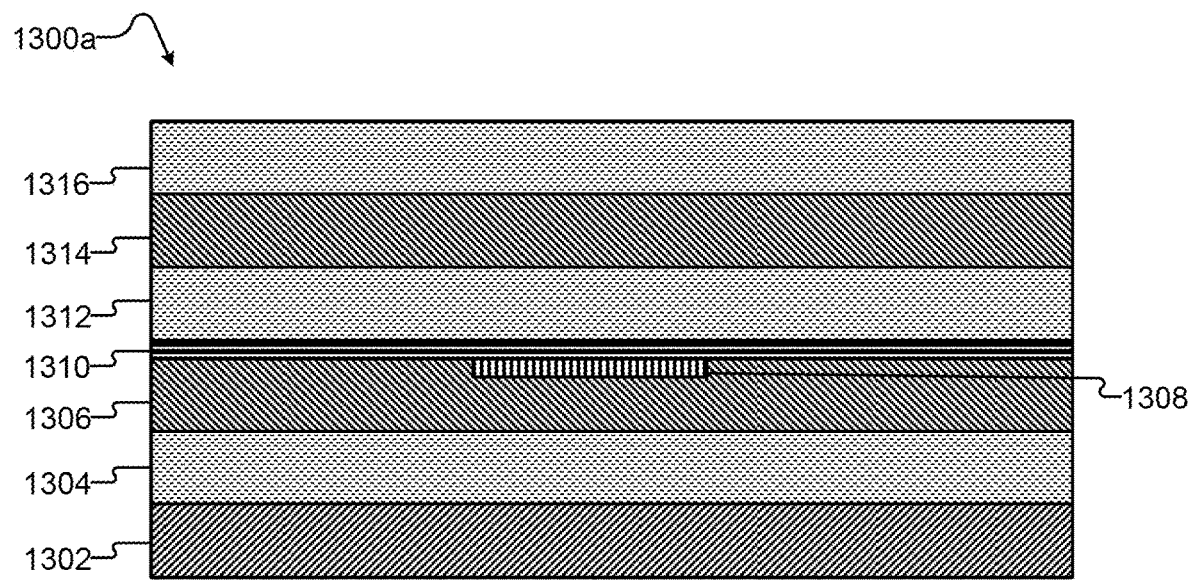
FIG. 13A is a sectional view of a portion of an exemplary superconducting integrated circuit which includes an on-chip transmission line, in accordance with the present systems and methods.
Figure 13B:
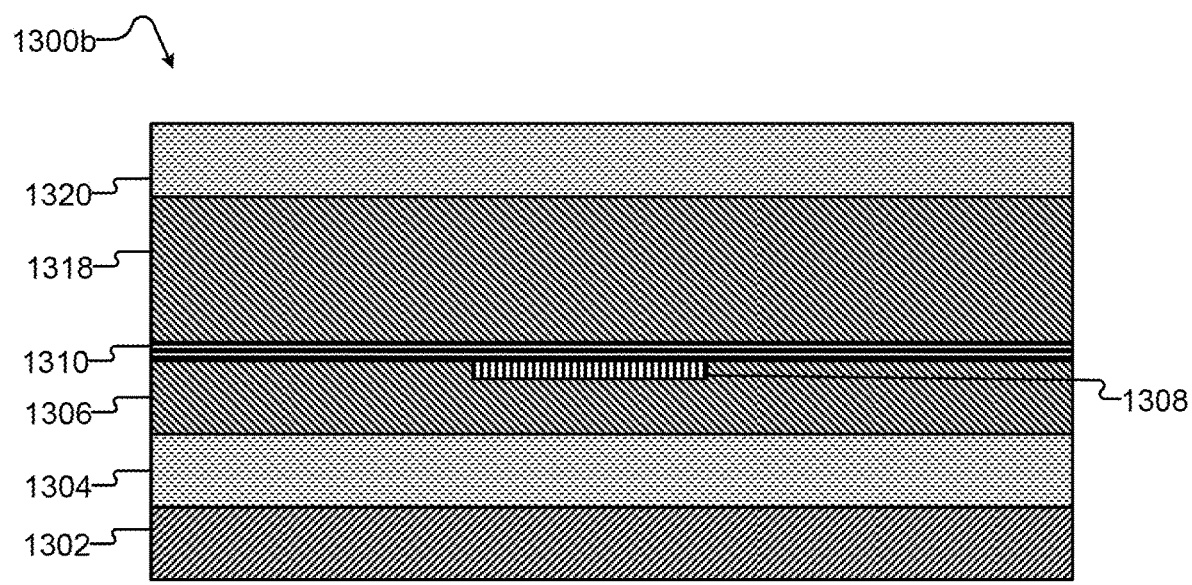
FIG. 13B is a sectional view of a portion of another exemplary superconducting integrated circuit which includes an on-chip transmission line, in accordance with the present systems and methods.

The systems and methods described below with reference to FIGS. 13A and 13B include a transmission line with a center conductor having a large kinetic inductance. For example, the center conductor of the transmission line can include titanium nitride (TiN). A higher inductance of the center line can compensate for a higher capacitance between the center line and ground. This approach can be used to form a fully-enclosed, 50 ohm transmission line in as few as three metal layers in the fabrication stack. FIGS. 13A and 13B show two illustrative embodiments of the approach.

FIG. 13A is a sectional view of a portion of an exemplary superconducting integrated circuit 1300*a* which includes an on-chip transmission line, in accordance with the present systems and methods. Circuit 1300*a* comprises a substrate 1302 and a first superconducting metal layer 1304 deposited to overlie at least a portion of substrate 1302. In some implementations, substrate 1302 includes silicon. First superconducting metal layer 1304 is superconducting in a range of temperatures. In some implementations, first superconducting metal layer 1304 includes niobium. In some implementations, first superconducting metal layer 1304 has a thickness of 300 nm. In some implementations, first superconducting metal layer 1304 is a wiring layer. First superconducting metal layer 1304 can be patterned to form a first set of one or more superconducting traces.

Circuit 1300*a* further comprises a first dielectric layer 1306 overlying at least a portion of first superconducting metal layer 1304, and a high kinetic inductance layer 1308 overlying at least a portion of first dielectric layer 1306. In some implementations, circuit 1300*a* further comprises a passivation layer 1310 overlying at least a portion of high kinetic inductance layer 1308 and first dielectric layer 1306. Passivation layer 1310 may be a diffusion barrier to at least reduce oxygen diffusion into high kinetic inductance layer 1308, the diffusion resulting, for example, from the use of oxygen plasma to strip photoresist. In other implementations, passivation layer 1310 is omitted from the fabrication stack.

As described above in the description of FIGS. 1 and 2A to 2J, kinetic inductance refers to the equivalent series inductance of mobile charge carriers in alternating electric fields, and is typically observed in high carrier mobility conductors such as superconductors. High kinetic inductance layer 1308 can comprise a superconducting material selected for its high carrier mobility. High kinetic inductance layer 1308 can be selected to provide an equivalent series inductance suitable for operation of circuit 1300a. The kinetic inductance of a superconducting wire is proportional to its length, and inversely proportional to its cross-sectional area, and inversely proportional to the density of Cooper pairs.

The London penetration depth is an inherent property of a superconductor, and characterizes the distance to which a magnetic field penetrates into a superconductor. Typically, a superconductor having a larger London penetration depth has larger kinetic inductance for the same physical dimensions. In some implementations, high kinetic inductance layer 1308 comprises a material that has a penetration depth at least three times the penetration depth of the superconducting metal forming first superconducting metal layer 1304.

The penetration depth is related to the density of Cooper pairs. For the same current, Cooper pairs in a superconductor having a lower density of Cooper pairs travel faster and hence have greater kinetic energy, i.e., a larger proportion of energy is stored in the kinetic energy (kinetic inductance) than in the magnetic field (magnetic inductance) than for a superconductor with a higher density of Cooper pairs.

In one implementation of circuit 1300a, in which a kinetic inductor is formed from high kinetic inductance layer 1308, the kinetic inductor has length 1,000 nm, width 1,000 nm, and thickness 50 nm. The kinetic inductance is approximately 5 pH. The inductance of a similarly dimensioned lower kinetic inductance wire would be approximately 0.5 pH.

The high kinetic inductance layer 1308 can be patterned to form a first set of one or more high kinetic inductance structures or traces. In some implementations, first dielectric layer 1306 includes silicon dioxide. In some implementations, first dielectric layer 1306 has a thickness of 200 nm. High kinetic inductance layer 1308 is superconducting in a range of temperatures. In some implementations, high kinetic inductance layer 1308 includes titanium nitride (TiN). In other implementations, high kinetic inductance layer 1308 includes niobium nitride (NbN). In yet other implementations, high kinetic inductance layer 1308 includes at least one of TiN, NbN, niobium titanium nitride (NbTiN), molybdenum nitride (MoN), and tungsten silicide (WSi).

In some implementations, high kinetic inductance layer 1308 has a thickness of 50 nm. In some implementations, passivation layer 1310 includes silicon nitride (SiN). In some implementations, passivation layer 1310 has a thickness of 50 nm.

Circuit 1300a further comprises a second superconducting metal layer 1312 deposited to overlie at least a portion of high kinetic inductance layer 1308 (and optional passivation layer 1310). Second superconducting metal layer 1312 is superconducting in a range of temperatures. In some implementations, second superconducting metal layer 1312 includes niobium. In some implementations, second superconducting metal layer 1312 has a thickness of 300 nm. In some implementations, second superconducting metal layer 1312 is a wiring layer. Second superconducting metal layer 1312 can be patterned to form a second set of one or more superconducting traces.

Circuit 1300a further comprises a second dielectric layer 1314 overlying second superconducting metal layer 1312. In some implementations, second dielectric layer 1314 includes silicon dioxide. In some implementations, second dielectric layer 1314 has a thickness of 200 nm.

Circuit 1300a further comprises a third superconducting metal layer 1316 deposited to overlie at least a portion of second dielectric layer 1314. Third superconducting metal layer 1316 is superconducting in a range of temperatures. In some implementations, third superconducting metal layer 1316 includes niobium. In some implementations, third superconducting metal layer 1316 has a thickness of 300 nm. In some implementations, third superconducting metal layer 1316 is a wiring layer. Third superconducting metal layer 1316 can be patterned to form a third set of one or more superconducting traces.

The materials and geometry of each of the layers in circuit 1300a can be selected in combination with a center line width to achieve a desired 50 ohm impedance.

FIG. 13B is a sectional view of a portion of another exemplary superconducting integrated circuit 1300b which includes an on-chip transmission line, in accordance with the present systems and methods. Circuit 1300b comprises a substrate 1302 and a first superconducting metal layer 1304 deposited to overlie at least a portion of substrate 1302. In some implementations, substrate 1302 includes silicon. First superconducting metal layer 1304 is superconducting in a range of temperatures. In some implementations, first superconducting metal layer 1304 includes niobium. In some implementations, first superconducting metal layer 1304 has a thickness of 300 nm. In some implementations, first superconducting metal layer 1304 is a wiring layer. First superconducting metal layer 1304 can be patterned to form a first set of one or more superconducting traces.

Circuit 1300b further comprises a first dielectric layer 1306 overlying at least a portion of first superconducting metal layer 1304, and a high kinetic inductance layer 1308 overlying at least a portion of first dielectric layer 1306. In some implementations, circuit 1300b further comprises a passivation layer 1310 overlying at least a portion of high kinetic inductance layer 1308 and first dielectric layer 1306. In other implementations, passivation layer 1310 is omitted from the fabrication stack.

In some implementations, first dielectric layer 1306 includes silicon dioxide. In some implementations, first dielectric layer 1306 has a thickness of 200 nm. High kinetic inductance layer 1308 is superconducting in a range of temperatures. In some implementations, high kinetic inductance layer 1308 includes titanium nitride (TiN). In some implementations, high kinetic inductance layer 1308 has a thickness of 50 nm. In some implementations, passivation layer 1310 includes silicon nitride (SiN). In some implementations, passivation layer 1310 has a thickness of 50 nm.

Circuit 1300b further comprises a second dielectric layer 1318 overlying passivation layer 1310. In some implementations, second dielectric layer 1318 includes silicon dioxide. In some implementations, second dielectric layer 1318 has a thickness of 200 nm.

Circuit 1300b further comprises a second superconducting metal layer 1320 deposited to overlie at least a portion of second dielectric layer 1318. Second superconducting metal layer 1320 is superconducting in a range of temperatures. In some implementations, second superconducting metal layer 1320 includes niobium. In some implementations, first superconducting metal layer 1320 has a thickness of 300 nm. In some implementations, second superconducting metal layer 1320 is a wiring layer. Second superconducting metal layer 1320 can be patterned to form a second set of one or more superconducting traces.

The materials and geometry of each of the layers in circuit 1300b can be selected in combination with a center line width to achieve a desired 50 ohm impedance.

Two ground planes can be formed by the lowermost and uppermost wiring layers in FIGS. 13A and 13B. The two ground planes can be connected by vias. In some implementations, the two ground planes can be connected by superconducting stud vias. In some implementations, a continuous via wall is used to connect the two ground planes. In some implementations, the vias can be separated from the center line on each side by three times the width of the centerline. An advantage of providing this separation is that the impact of the stud vias on the impedance can be eliminated, or at least reduced.

Figure 13C:
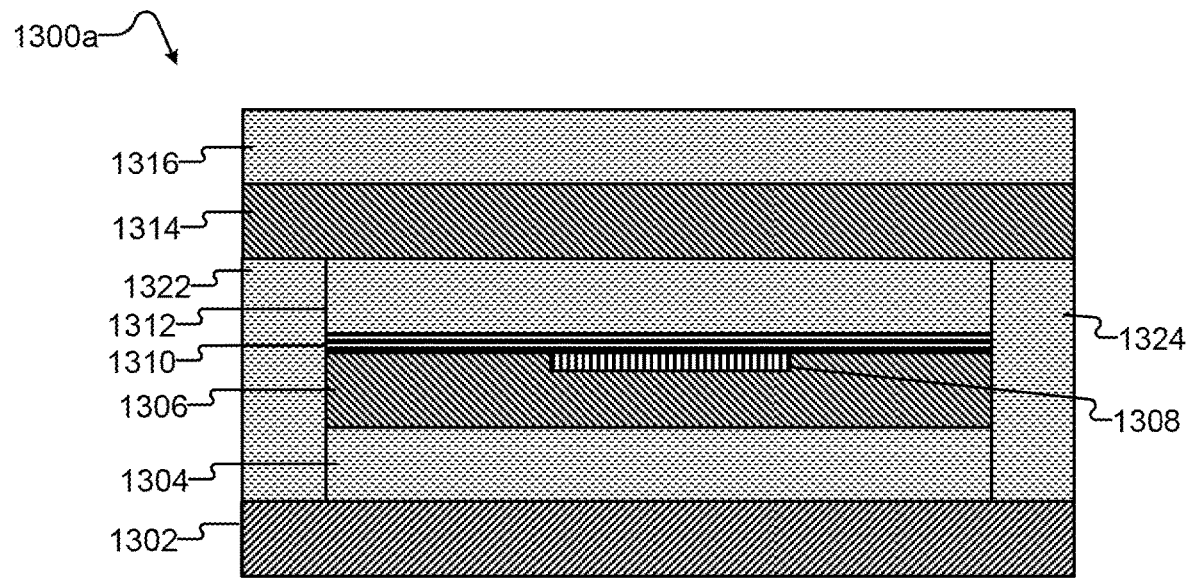
FIG. 13C is a sectional view of a portion of an exemplary superconducting integrated circuit which includes an on-chip transmission line and connected ground planes, in accordance with the present systems and methods.

FIG. 13C is a sectional view of a portion of an exemplary superconducting integrated circuit 1300c which includes an on-chip transmission line and connected ground planes, in accordance with the present systems and methods.

Figure 13D:
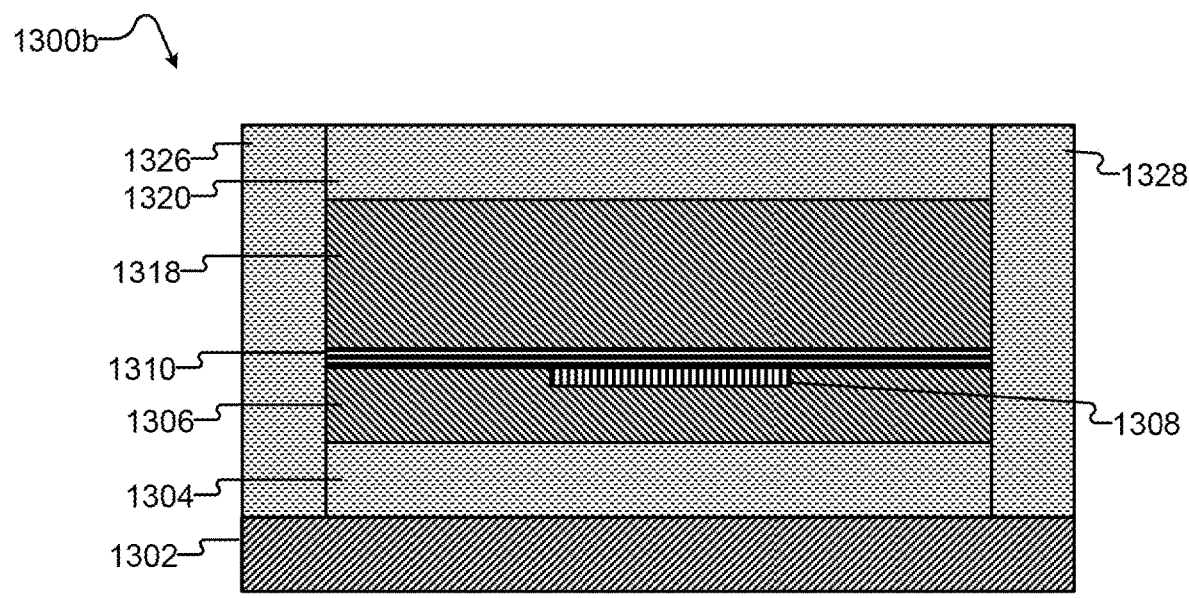
FIG. 13D is a sectional view of a portion of another exemplary superconducting integrated circuit which includes an on-chip transmission line and connected ground planes, in accordance with the present systems and methods.

FIG. 13D is a sectional view of a portion of another exemplary superconducting integrated circuit 1300d which includes an on-chip transmission line and connected ground planes, in accordance with the present systems and methods.

Referring to FIG. 13C, first superconducting layer 1304 and second superconducting layer 1312 are connected by vias 1322 and 1324. Referring to FIG. 13D, first superconducting layer 1304 and second superconducting layer 1320 are connected by vias 1326 and 1328. Vias 1322 and 1324 can be formed by etching a trench in passivation layer 1310 and first dielectric layer 1306, and depositing superconducting metal to form second superconducting layer 1312 and vias 1322 and 1324 at the same time. Similarly, vias 1326 and 1328 can be formed by etching a trench in passivation layer 1310, first dielectric layer 1306, and second dielectric layer 1318, and depositing superconducting metal to form second superconducting layer 1320 and vias 1326 and 1328 at the same time.

Encapsulation of Metal Wiring Layers for Superconducting Applications

Encapsulation of a patterned metal wiring layer with another conductive material can be desirable for various applications, for example to enhance noise performance of a superconducting integrated circuit. Encapsulation can present challenges in superconductor fabrication. The systems and methods described below with reference to FIGS. 16, and 14A to 14C are a novel technology for encapsulating a patterned metal wiring layer.

One approach includes: a) forming and patterning a superconducting metal wiring layer with a first mask, b) depositing an encapsulation layer, and c) patterning the encapsulation layer with a second mask. To encapsulate the wiring layer, the patterning of the encapsulation layer can be aligned to the first mask. The alignment error between the first and the second masks can limit how finely a feature and/or separation gap between two features can be sized. The superconducting metal wiring layer can include niobium, for example.

The systems and methods described below use a self-aligned approach to encapsulate the patterned superconducting metal wiring layer without the use of a second mask. The self-alignment can eliminate, or at least reduce, alignment error, and consequently eliminate, or at least reduce, limitations that may arise from alignment error.

Figure 16:
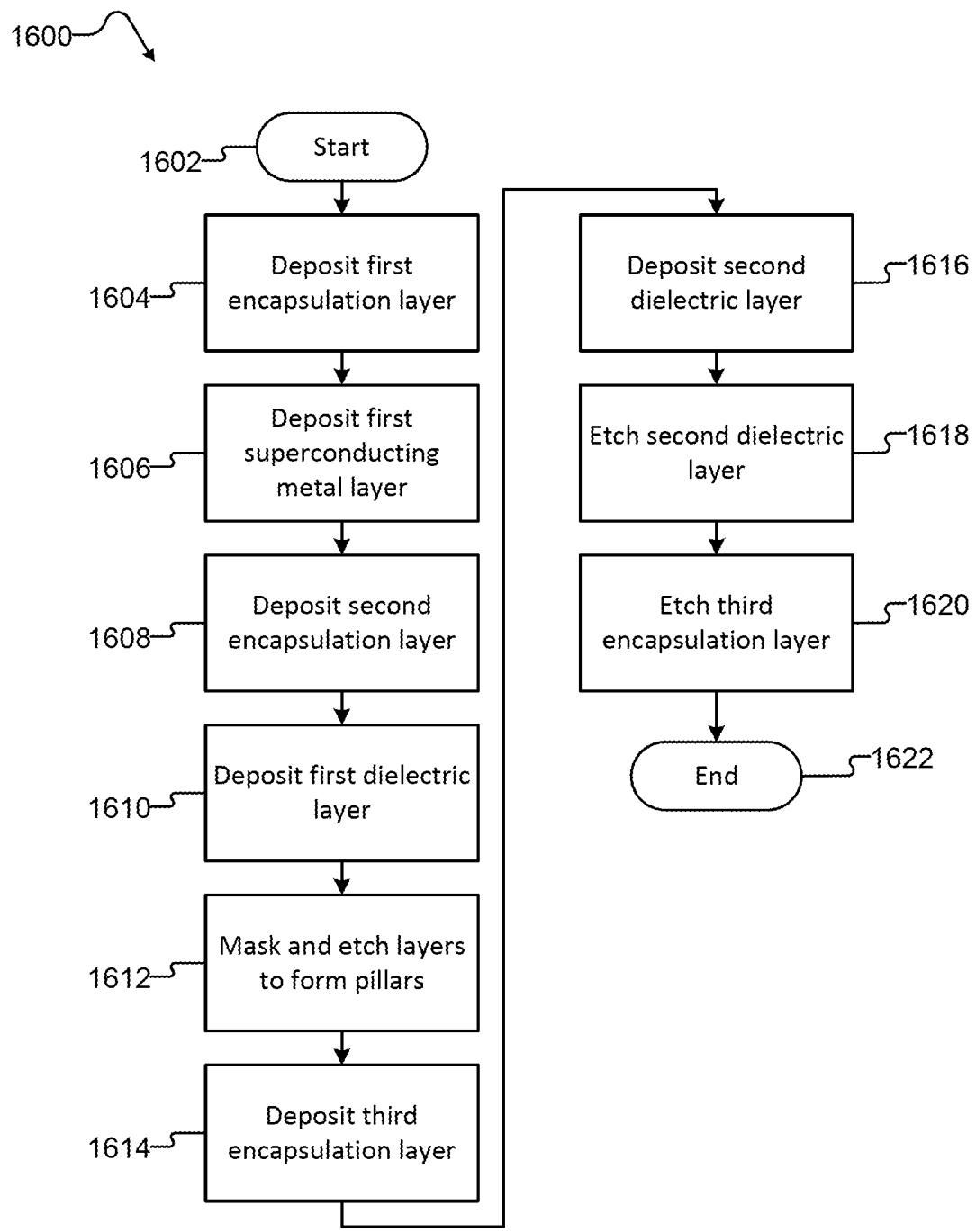
FIG. 16 is a flowchart illustrating a method for fabricating a portion of a superconducting integrated circuit which includes a wiring layer, in accordance with the present systems and methods.

FIG. 16 is a flowchart 1600 illustrating a method for fabricating a portion of a superconducting integrated circuit which includes a wiring layer, in accordance with the present systems and methods. Method 1600 includes acts 1602-1622, though those of skill in the art will appreciate that in alternative embodiments certain acts may be omitted and/or additional acts may be added. Those of skill in the art will appreciate that the illustrated order of the acts is shown for exemplary purposes only and may change in alterative embodiments.

Method 1600 starts at 1602, for example in response to an initiation of the fabrication process. At 1604, a first encapsulation layer is deposited on a substrate. In some implementations, the substrate is silicon. In some implementations, the first encapsulation layer includes or consists of aluminum, and is superconducting in a range of temperatures. In other implementations, the first encapsulation layer includes or consists of titanium nitride (TiN), and is superconducting in a range of temperatures. At 1606, a first superconducting metal layer is deposited to overlie at least a portion of the first encapsulation layer. In some implementations, the first superconducting metal layer includes niobium. At 1608, a second encapsulation layer is deposited to overlie at least a portion of the first superconducting metal layer. In some implementations, the second encapsulation layer includes the same material as the first encapsulation layer. In some implementations, the second encapsulation layer includes aluminum. In other implementations, the second encapsulation layer includes TiN. At 1610, a first dielectric layer is deposited to overlie at least a portion of the second encapsulation layer. In some implementations, the first dielectric layer includes silicon dioxide.

At 1612, the first and the second encapsulation layers, the first superconducting metal layer, and the first dielectric layer may be patterned to form one or more pillars or stacks. Patterning the layers can include masking and etching the layers. In some implementations, more than one layer can be masked and etched in the same act.

At 1614, a third encapsulation layer is deposited to overlie at least a portion of the first dielectric layer, and to encapsulate the pillars. The third encapsulation layer can be deposited on an upper surface of each pillar, on the lateral surfaces of each pillar, and on the substrate at the base of each pillar. In some implementations, the third encapsulation layer includes the same material as the first or the second encapsulation layers. In some implementations, the third encapsulation layer includes aluminum. In other implementations, the third encapsulation layer includes TiN.

At 1616, the second dielectric layer is etched, and at 1618 the third encapsulation layer is etched. At 1620, method 1600 ends.

Figure 14A:
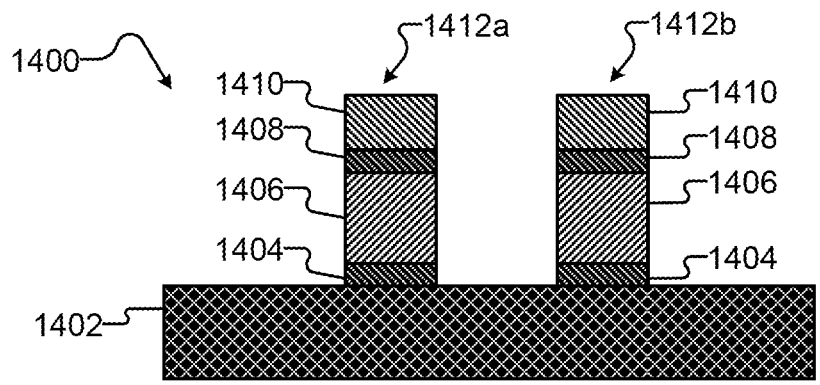
FIGS. 14A to 14C are sectional views of an exemplary superconducting integrated circuit which includes a wiring layer, at various stages of fabrication, in accordance with the present systems and methods.
Figure 14B:
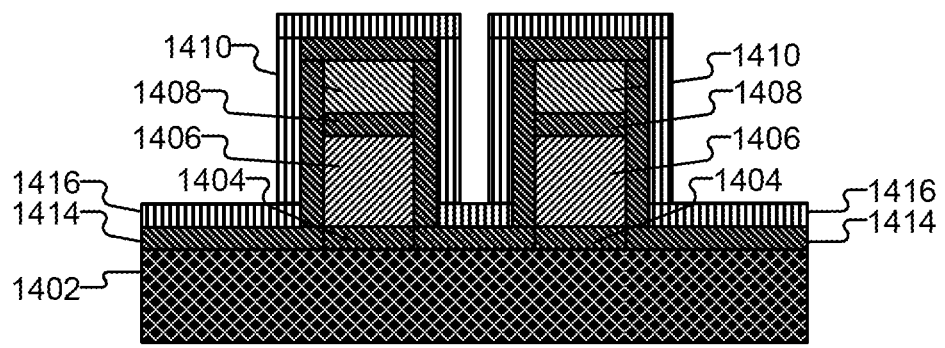
Figure 14C:
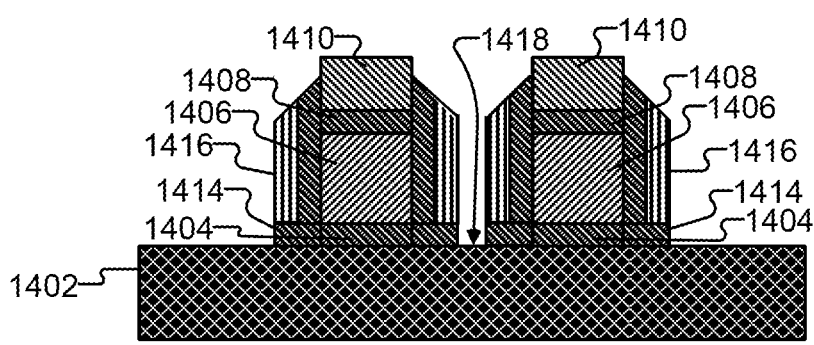

FIGS. 14A to 14C are sectional views of an exemplary superconducting integrated circuit which includes a wiring layer, at various stages of fabrication, in accordance with the present systems and methods.

FIG. 14A is a sectional view of an exemplary superconducting integrated circuit 1400a which includes a wiring layer, at an initial stage of fabrication, in accordance with the present systems and methods. Circuit 1400a comprises a substrate 1402, a first encapsulation layer 1404 overlying at least a portion of substrate 1402, and a superconducting metal wiring layer 1406 overlying at least a portion of first encapsulation layer 1404. In some implementations, substrate 1402 includes silicon. In some implementations, substrate 1402 is a dielectric layer, for example a layer of silicon dioxide. In some implementations, first encapsulation layer is superconducting in a range of temperatures. In some implementations, first encapsulation layer 1404 includes aluminum. In other implementations, first encapsulation layer 1404 includes TiN. Superconducting metal wiring layer 1406 is superconducting in a range of temperatures. In some implementations, superconducting metal wiring layer 1406 includes niobium.

Circuit 1400a further comprises a second encapsulation layer 1408 overlying superconducting metal wiring layer 1406, and a first dielectric layer 1410 overlying second encapsulation layer 1408. In some implementations, second encapsulation layer 1408 is superconducting in a range of temperatures. In some implementations, second encapsulation layer 1408 includes aluminum. In other implementations, second encapsulation layer 1408 includes TiN. In some implementations, first dielectric layer 1410 includes silicon dioxide.

Layers 1404, 1406, 1408, and 1410 are masked and etched to form one or more stacks or pillars such as 1412a and 1412b of FIG. 14A. Systems and methods described above with reference to earlier figures can be used to form the superconducting stud vias.

FIG. 14B is a sectional view of an exemplary superconducting integrated circuit 1400b which includes a wiring layer, at a subsequent stage of fabrication, in accordance with the present systems and methods. Circuit 1400b comprises a third encapsulation layer 1414 and a second dielectric layer 1416. In some implementations, third encapsulation layer 1414 is superconducting in a range of temperatures. In some implementations, third encapsulation layer 1414 includes aluminum. In other implementations, third encapsulation layer 1414 includes TiN. In some implementations, second dielectric layer 1416 includes silicon dioxide.

FIG. 14C is a sectional view of an exemplary superconducting integrated circuit 1400c which includes a wiring layer, at a subsequent stage of fabrication, in accordance with the present systems and methods. Circuit 1400c can be formed from circuit 1400b of FIG. 14B by a) a blank anisotropic etch of second dielectric layer 1416, and b) an etch of second encapsulation layer 1414 which removes unwanted electrical coupling of the wires (for example, at location 1418 of FIG. 14).

In some instances, and in particular when an oxygen plasma is used to etch the photoresist, oxide can be present on surfaces of a patterned wiring layer (e.g. superconducting metal wiring layer 1406 of FIG. 14A), and it can be desirable to at least reduce the amount of oxide prior to encapsulation of the patterned wiring layer. One approach is to use $CF_4$, $NF_3$, or another suitable fluorine chemistry, or another suitable non-fluorine chemistry, to remove oxide from the surfaces. Removal of oxide can be performed in the same chamber as the chamber used to strip the photoresist. Removal of oxide can cause some etching of the superconducting metal in the patterned wiring layer, and the etching can be compensated for in the circuit design (e.g., by increasing wire thickness in the design).

It can be desirable in the fabrication of a superconducting integrated circuit to at least reduce oxygen diffusion in a superconducting metal (e.g. niobium) in a superconducting via during subsequent stages of fabrication. One approach is to use a combination of nitrogen and argon gases to create a nitrogen plasma prior to dielectric deposition. Nitrogen plasma can react with a metal wiring layer to form a protective skin which protects the metal wiring layer from being oxidized during dielectric deposition which typically uses oxygen plasma. For example, a nitrogen plasma formed from flowing nitrogen and argon can grow a thin protective niobium nitride layer on a niobium wiring layer. Another approach is to use a nitrogen-containing gas such as ammonia to create the plasma that forms the niobium nitride layer.

The systems and methods described above for encapsulating a superconducting wire can be used to encapsulate superconducting metal forming a via. Encapsulation of superconducting metal (e.g. niobium) forming the via can at least reduce oxygen diffusion during subsequent stages of fabrication.

Stud Via Formation for Superconducting Applications (with Superconducting Metal Polish Stop Layer)

In some cases of superconducting integrated circuit fabrication such as the method described by FIGS. 7A to 7H, material used for a wiring layer or stud via layer can comprise a soft metal, and the soft metal can be vulnerable to scratching during a polishing process such as CMP. Therefore, it can be advantageous to deposit a thin polish stop layer that comprises a comparatively hard metal on top of the wiring layer or stud via layer to protect the wiring layer or stud via layer from being scratched.

FIG. 17A to FIG. 17G are sectional views of a portion of an exemplary superconducting integrated circuit including stud vias and a superconducting metal polish stop layer.

Figure 17A:
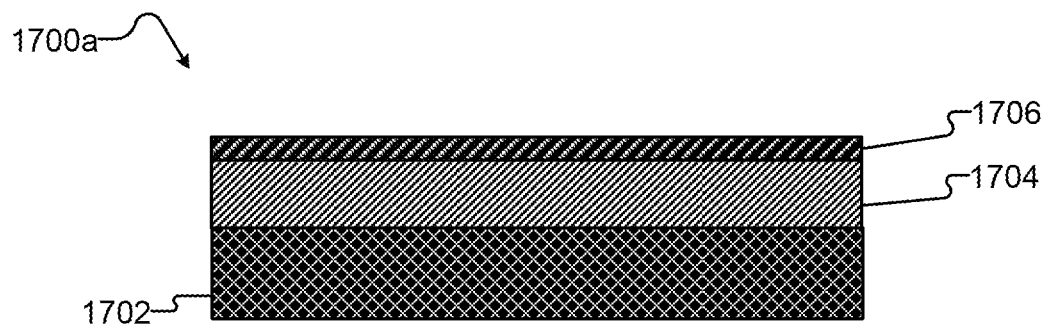
FIGS. 17A to 17G are sectional views of a portion of an exemplary superconducting integrated circuit including stud vias and a superconducting metal polish stop layer, in accordance with the present systems and methods.

FIG. 17A is a sectional view of a portion of a superconducting integrated circuit 1700a at a first stage of a fabrication process. Circuit 1700a comprises a substrate 1702, a first superconducting layer 1704 that overlies at least a portion of substrate 1702, and a thin first polish stop layer 1706 that overlies at least a portion of first superconducting metal layer 1704. First superconducting metal layer can be a wiring layer. First superconducting metal layer 1704 and first polish stop layer 1706 can be superconducting in a range of temperatures. First polish stop layer 1706 can be thinner than first superconducting metal layer 1704. In one implementation, first superconducting metal layer 1704 comprises aluminum and first polish stop layer 1706 comprises niobium.

Figure 17B:
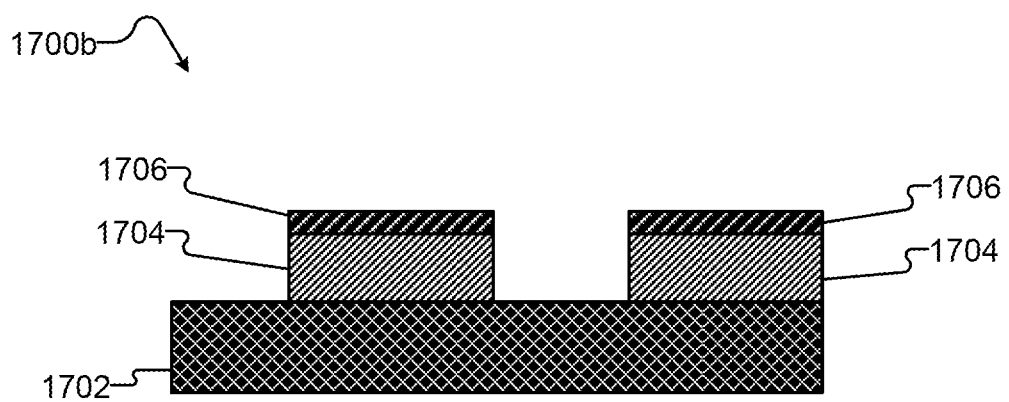

FIG. 17B is a sectional view of a portion of a superconducting integrated circuit 1700b at a subsequent stage of a fabrication process. Superconducting circuit 1700b can be formed from circuit 1700a of FIG. 17A by masking and etching at least of portion of first superconducting metal layer 1704 and at least a portion of first polish stop layer 1706.

Figure 17C:
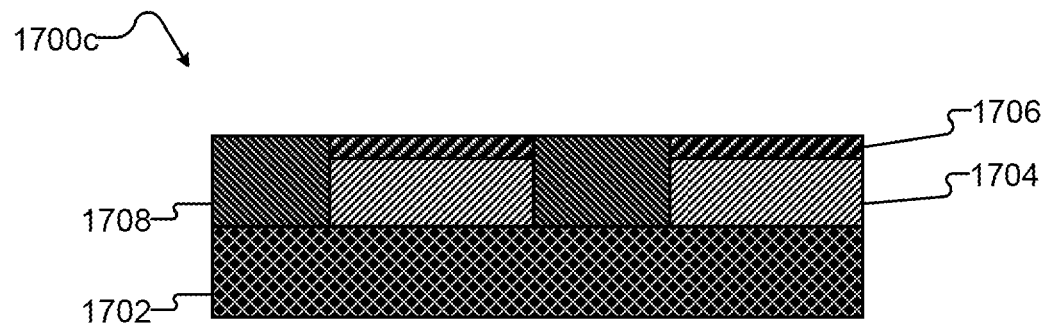

FIG. 17C is a sectional view of a portion of a superconducting integrated circuit 1700c at a subsequent stage of a fabrication process. Superconducting integrated circuit 1700c can be formed from superconducting integrated circuit 1700b of FIG. 17B by depositing a first dielectric layer 1708 to overlie at least a portion of substrate 1702 and at least a portion of first polish stop layer 1708, and then polishing first dielectric layer 1708 back to an upper surface of at least a portion of first polish stop layer 1706. In one implementation, polishing first dielectric layer 1708 includes CMP.

Figure 17D:
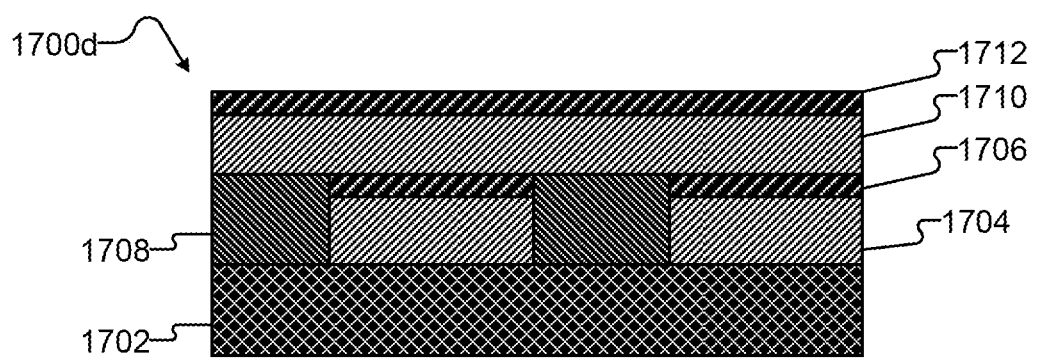

FIG. 17D is a sectional view of a portion of superconducting integrated circuit 1700d at a subsequent stage of the fabrication process. Superconducting integrated circuit 1700d can be formed from circuit 1700c of FIG. 17C by depositing a second superconducting metal layer 1710 to overlie at least a portion of first dielectric layer 1708 and at least a portion of first polish stop layer 1706, and by then depositing a second polish stop layer 1712 to overlie at least a portion of second superconducting metal layer 1710. Second superconducting metal layer 1710 and second polish stop layer 1712 can be superconducting in a range of temperatures. Second superconducting metal layer 1710 can be a stud via layer. Second polish stop layer 1712 can be thinner than second superconducting metal layer 1710. In one implementation, second superconducting metal 1710 comprises aluminum and second polish stop layer 1712 comprises niobium. In another implementation, second superconducting metal layer 1710 comprises niobium and second polish stop layer 1712 comprises niobium.

Figure 17E:
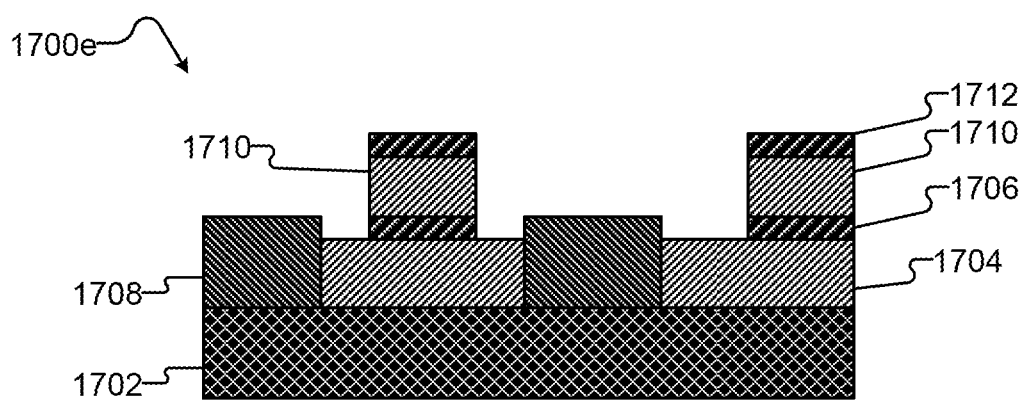

FIG. 17E is a sectional view of a portion of superconducting integrated circuit 1700e at a subsequent stage of the fabrication process. Superconducting integrated circuit 1700e can be formed from circuit 1700d of FIG. 17D by masking and etching at least a portion of each of second polish stop layer 1712, second superconducting metal layer 1710, and first polish stop layer 1706. In one implementation, etching can stop on first superconducting metal layer 1704.

Figure 17F:
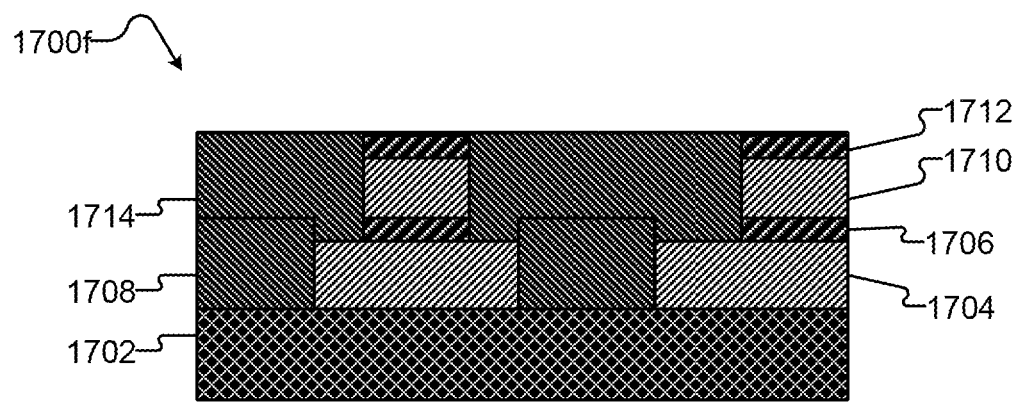

FIG. 17F is a sectional view of a portion of superconducting integrated circuit 1700f at a subsequent stage of the fabrication process. Superconducting integrated circuit 1700f can be formed from circuit 1700e of FIG. 17E by depositing a second dielectric layer 1714 to overlie at least a portion of each of second polish stop layer 1712, second superconducting metal layer 1710, first dielectric layer 1708, and first superconducting metal layer 1704, and then by polishing second dielectric layer 1714 back to second polish stop layer 1712. In one implementation, polishing second dielectric layer 1714 includes CMP.

Figure 17G:
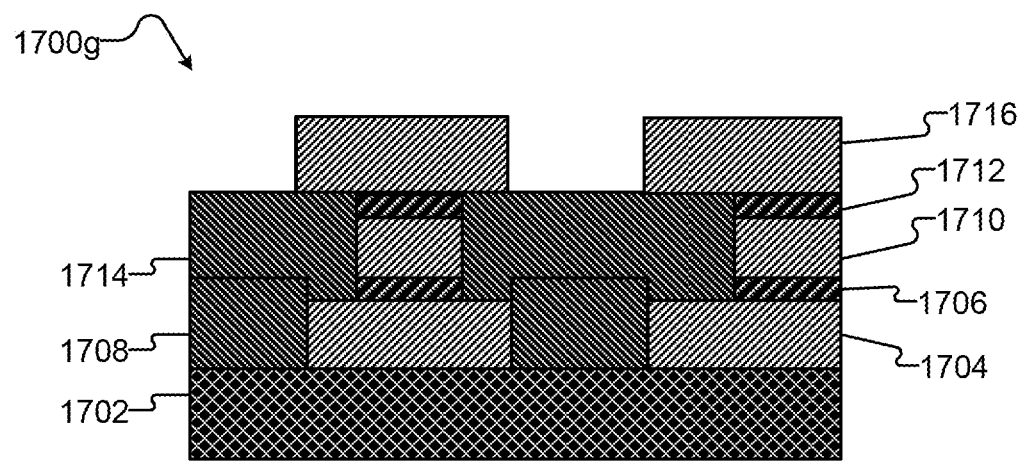

FIG. 17G is a sectional view of a portion of superconducting integrated circuit 1700f at a subsequent stage of the fabrication process. Superconducting integrated circuit 1700g can be formed from circuit 1700f of FIG. 17F by depositing a third superconducting metal layer 1716 to overlie at least a portion of each of second dielectric layer 1714 and second polish stop layer 1712, and then by masking and etching at least a portion of third superconducting metal layer 1716. Third superconducting metal layer 1716 can be a wiring layer. Third superconducting metal layer 1716 can be superconducting in a range of temperatures. In one implementation, third superconducting metal layer 1716 comprises aluminum. In some implementations, one of first polish stop layer 1706 and second polish stop layer 1712 is omitted in the fabrication process illustrated in FIGS. 17A to 17G.

Integrated Process for Fabricating a Kinetic Inductor and a Capacitor in Separate Layers The systems and methods illustrated in FIG. 1 and FIGS. 2A to 2J describe an integrated process for fabricating a kinetic inductor and a capacitor in the same layer of a superconducting integrated circuit. FIGS. 2E and 2F describe masking and etching a flux storage layer, and then masking and etching a dielectric layer to form a kinetic inductor and a capacitor in the same layer. It can be advantageous to fabricate the kinetic inductor and the capacitor in separate layers to mitigate risk of unwanted electrical or communicative coupling between the kinetic inductor and the capacitor, for example.

FIGS. 18A to 18J are sectional views of a portion of a superconducting circuit including a kinetic inductor and a capacitor fabricated in separate layers at successive stages of fabrication.

Figure 18A:
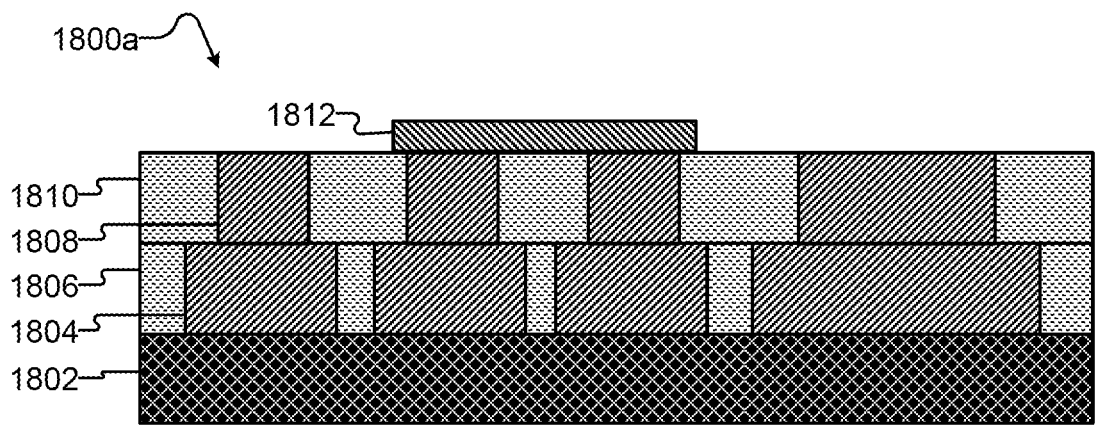
FIGS. 18A to 18J are sectional views of a portion of a superconducting circuit including a kinetic inductor and a capacitor fabricated in separate layers, in accordance with the present systems and methods.

FIG. 18A is a sectional view of a portion of a superconducting integrated circuit 1800a at an intermediate stage of a fabrication process. For example, circuit 1800a can be a stage subsequent to the stages of a fabrication process in accordance with the systems and methods illustrated in FIGS. 2A to 2D. Circuit 1800a can be formed from, for example, circuit 200d of FIG. 2D by patterning high kinetic inductance layer 212 to form a high kinetic inductance element 1812. (High kinetic inductance layer 212 is also referred to in the present application with reference to FIGS. 2A to 2D as flux storage layer 212.)

Circuit 1800a can also comprise a substrate 1802, a first superconducting metal layer 1804 that overlies at least a portion of substrate 1802, a first dielectric layer 1806 that overlies at least a portion of substrate 1802, a second superconducting metal layer 1808 that overlies at least a portion of first wiring layer 1804, a second dielectric layer 1810 that overlies at least a portion of first wiring layer 1804 and first dielectric layer 1806.

High kinetic inductance element 1812 overlies at least a portion of second superconducting metal layer 1808. Patterning high kinetic inductance layer 212 to form high kinetic inductance element 1812 can include masking and etching at least a portion of high kinetic inductance layer 212. In some implementations, high kinetic inductance element 1812 comprises TiN. In some implementations, high kinetic inductance element 1812 comprises NbN. In some implementations, high kinetic inductance element 1812 has a thickness of approximately 50 nm.

Figure 18B:
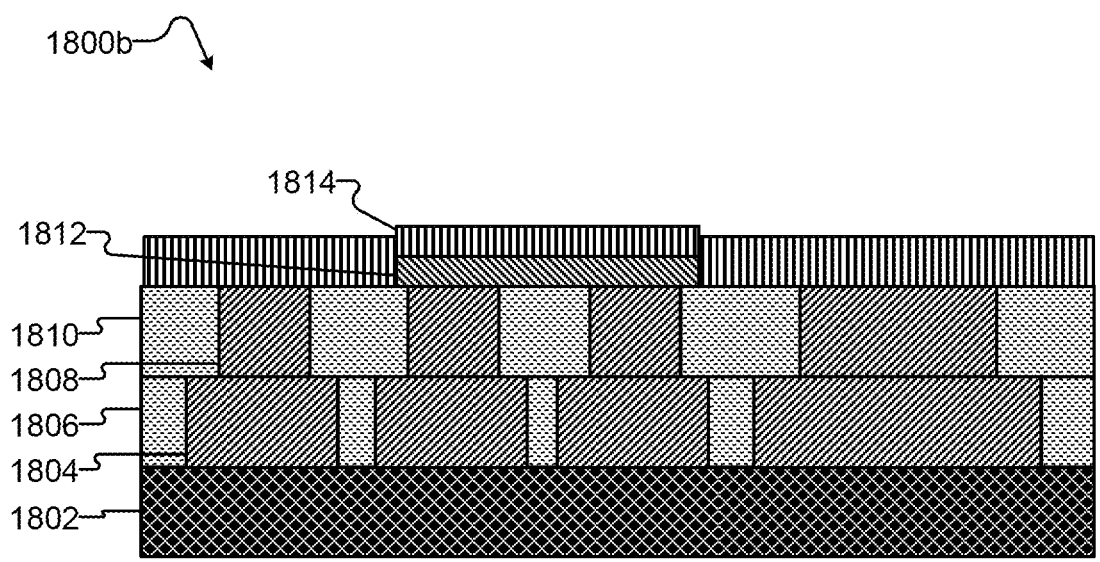

FIG. 18B is a sectional view of a portion of a superconducting integrated circuit 1800b at a subsequent stage of a fabrication process. Circuit 1800b can be formed from circuit 1800a of FIG. 18A by depositing a third dielectric layer 1814 to overlie at least a portion of each of high kinetic inductance element 1812, second dielectric layer 1810, and second superconducting metal layer 1808. In one implementation, depositing third dielectric layer 1814 includes in-situ deposition. In some implementations, third dielectric layer 1814 is a high-quality dielectric such as silicon nitride (SiN). Third dielectric layer 1814 can function as a passivation insulating layer to protect high kinetic inductance element 1812.

Figure 18C:
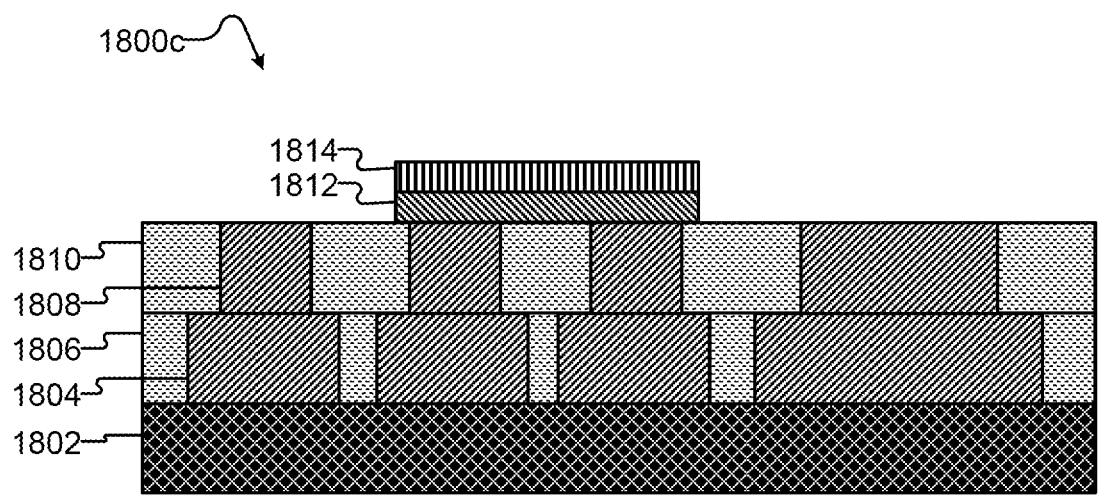

FIG. 18C is a sectional view of a portion of superconducting integrated circuit 1800c at a subsequent stage of a fabrication process. Circuit 1800c can be formed from circuit 1800b of FIG. 18B by etching at least a portion of each of third dielectric layer 1814 and high kinetic inductance element 1812. Third dielectric layer 1814 can be etched such that third dielectric layer 1814 has little or no contact with second superconducting metal layer 1808 and/or second dielectric layer 1810.

Figure 18D:
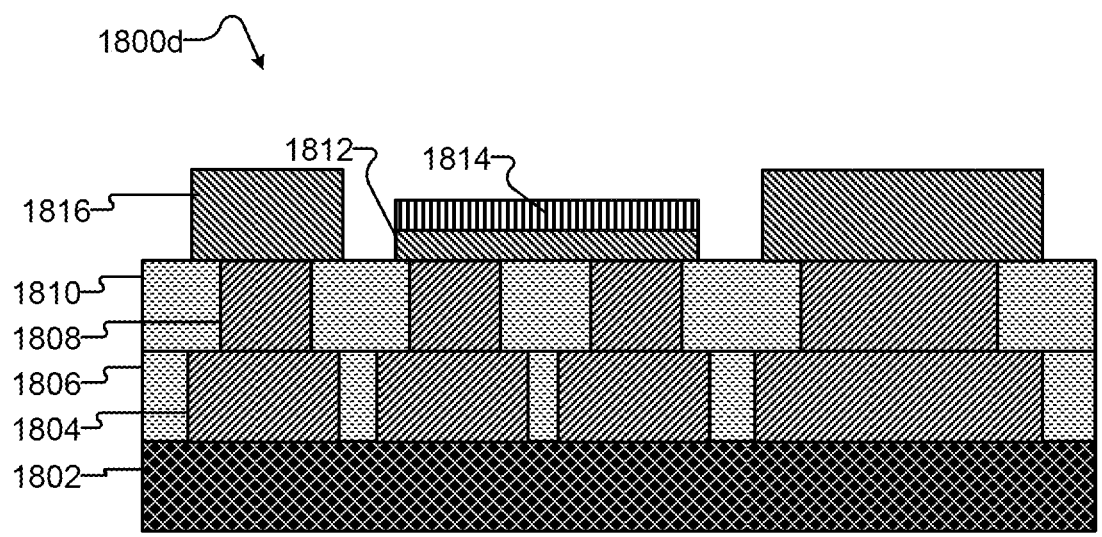

FIG. 18D is a sectional view of a portion of superconducting integrated circuit 1800d at a subsequent stage of a fabrication process. Circuit 1800d can be formed from circuit 1800c of FIG. 18C by depositing a third superconducting metal layer 1816 to overlie at least a portion of second superconducting metal layer 1808, and then masking and etching at least a portion of third superconducting metal layer 1816. Third superconducting metal layer 1816 can be a wiring layer. In some implementations, third superconducting metal layer 1816 can comprise niobium.

Figure 18E:
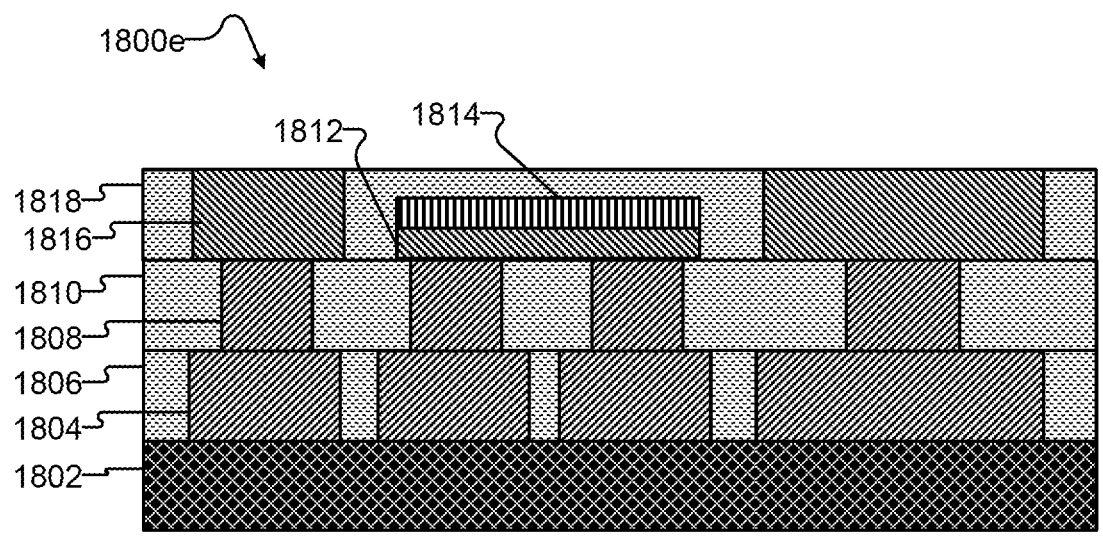

FIG. 18E is a sectional view of a portion of superconducting integrated circuit 1800e at a subsequent stage of a fabrication process. Circuit 1800e can be formed from circuit 1800d of FIG. 18D by depositing a fourth dielectric layer 1818 to overlie at least a portion of each of third superconducting metal layer 1816, third dielectric layer 1814, and second dielectric layer 1810, and then by polishing fourth dielectric layer 1818 back to an upper surface of third superconducting metal layer 1816.

In one implementation, third dielectric layer 1814 comprises SiN, and high kinetic inductance element 1812 comprises at least one of TiN and NbN to form part of kinetic inductor 1834. In one implementation, first superconducting metal layer 1804 and second superconducting metal layer

1808 comprise at least one of niobium and aluminum. In one implementation, fourth dielectric layer 1818 comprises silicon dioxide.

Figure 18F:
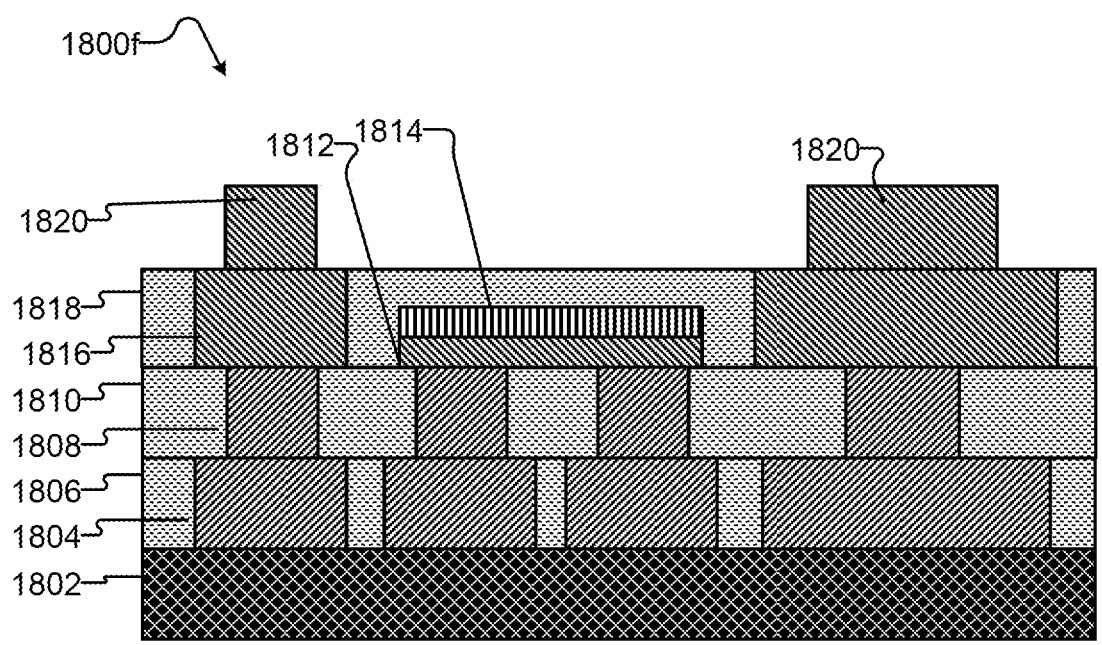

FIG. 18F is a sectional view of a portion of superconducting integrated circuit 1800f at a subsequent stage of a fabrication process. Circuit 1800f can be formed from circuit 1800e of FIG. 18E by depositing a fourth superconducting metal layer 1820 to overlie at least a portion of third superconducting metal layer 1816, and then masking and etching at least a portion of fourth superconducting metal layer 1820. Fourth superconducting metal layer 1820 can comprise at least one of niobium and aluminum.

Optionally, a thin dielectric layer (not shown) can be deposited on third superconducting metal layer 1816 as a protective layer, and the thin dielectric layer can be masked and etched to create one or more vias through which third superconducting metal layer 1816 and fourth superconducting metal layer 1820 can be electrically coupled.

Figure 18G:
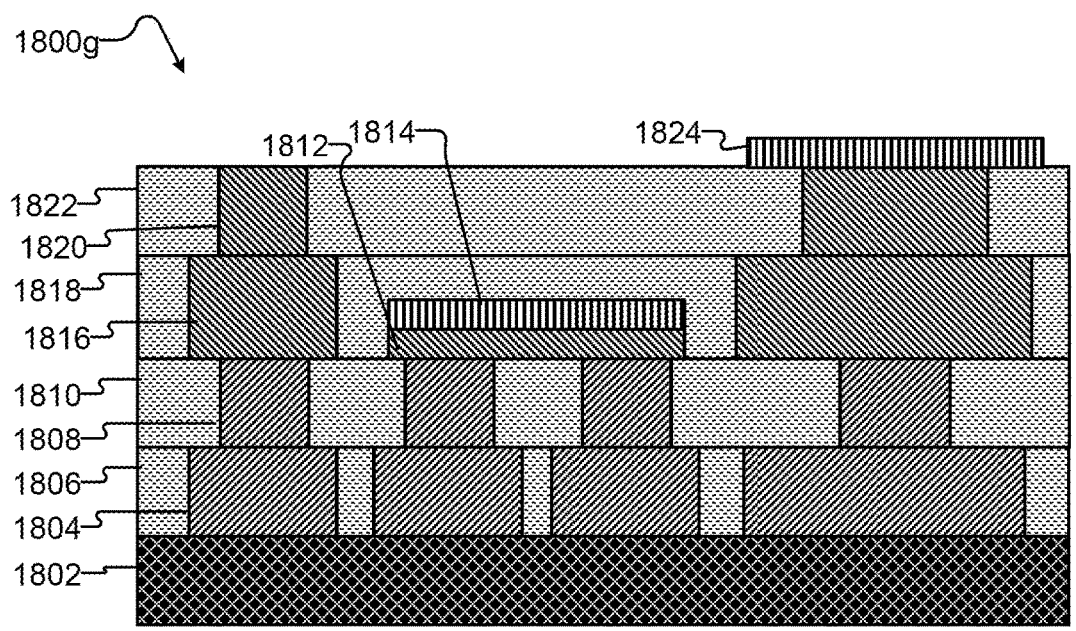

FIG. 18G is a sectional view of a portion of superconducting integrated circuit 1800g at a subsequent stage of a fabrication process. Circuit 1800g can be formed from circuit 1800f of FIG. 18F by a) depositing a fifth dielectric layer 1822 to overlie at least a portion of each of fourth dielectric layer 1818, third superconducting metal layer 1816, and fourth superconducting metal layer 1820; b) polishing fifth dielectric layer back to an upper surface of at least a portion of fourth superconducting metal layer 1820; c) depositing a sixth dielectric layer 1824 to overlie at least a portion of each of fourth superconducting metal layer 1820 and fifth dielectric layer 1822; and d) masking and etching at least a portion of sixth dielectric layer 1824. In one implementation, sixth dielectric layer 1824 is a high-quality dielectric such as SiN. In some implementations, sixth dielectric layer 1824 has a thickness in the range of approximately 50 nm to 70 nm. In some implementations, sixth dielectric layer 1824 is an element of a capacitor. In some implementations, fifth dielectric layer 1822 comprises silicon dioxide.

In some implementations, fabrication of a superconducting integrated circuit can include depositing an additional flux storage layer to overlie at least of portion of fourth superconducting metal layer 1820, and masking and etching the additional flux storage layer to form at least one flux storage element (not illustrated in FIG. 18G). In some of the implementations that include an additional flux storage layer, one of the flux storage elements formed from the additional flux storage layer can form at least part of a capacitor. In other implementations that include an additional flux storage layer, one of the flux storage elements formed from the additional flux storage layer can form at least part of a kinetic inductor.

Figure 18H:
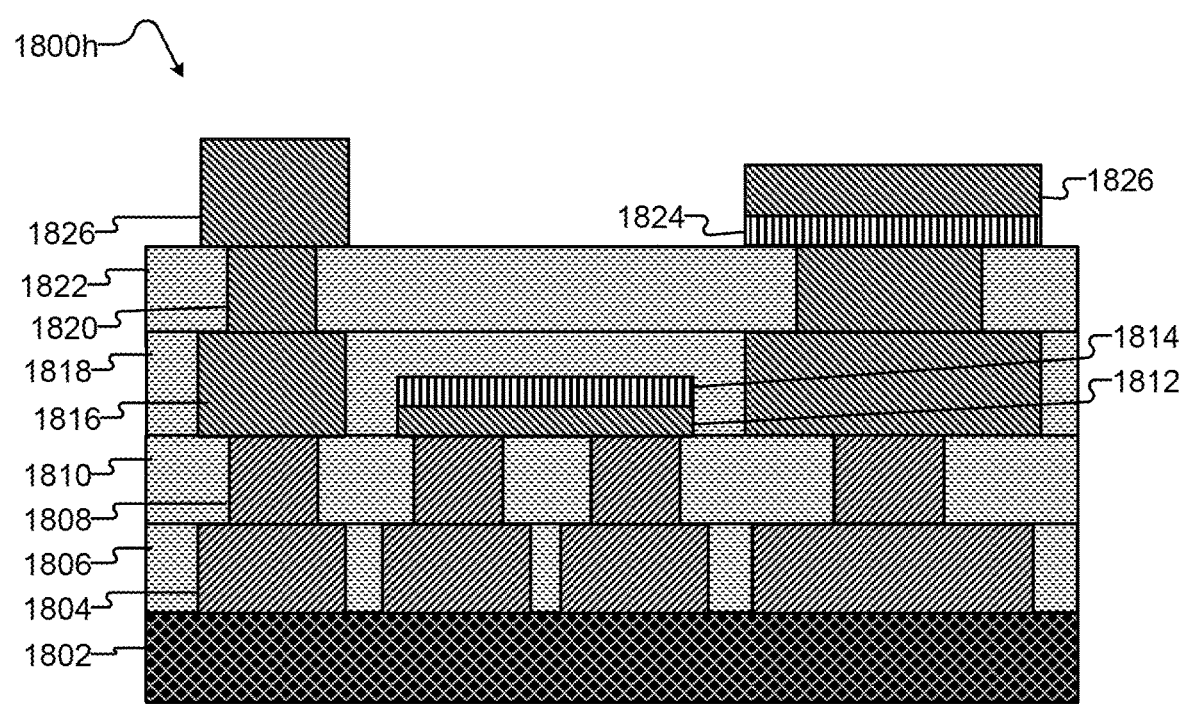

FIG. 18H is a sectional view of a portion of superconducting integrated circuit 1800h at a subsequent stage of a fabrication process. Circuit 1800h can be formed from circuit 1800g of FIG. 18G by depositing a fifth superconducting metal layer 1826 to overlie at least a portion of each of fourth superconducting metal layer 1820 and sixth dielectric layer 1824, and then by masking and etching at least a portion of fifth superconducting metal layer 1826. Fifth superconducting metal layer 1826 can be a wiring layer. Fifth superconducting metal layer 1826 can be etched such that little or no contact is made with fourth superconducting metal layer 1820. Fifth superconducting metal layer 1826 can include one or more superconducting traces.

Figure 18I:

FIG. 18I is a sectional view of a portion of superconducting integrated circuit 1800i at a subsequent stage of a fabrication process. Circuit 1800i can be formed from circuit 1800h of FIG. 18H by depositing a seventh dielectric layer 1828 to overlie at least a portion of each of fifth dielectric layer 1822, fifth superconducting metal layer 1826, and sixth dielectric layer 1824, then polishing seventh dielectric layer 1828 back to an upper surface of fifth superconducting metal layer 1826. In some implementations, seventh dielectric layer 1828 comprises silicon dioxide.

A via wall 1830 can be formed from at least a portion of each of first superconducting metal layer 1804, second superconducting metal layer 1808, third superconducting metal layer 1816, fourth superconducting metal layer 1820, and fifth superconducting metal layer 1826. A kinetic inductor 1832 can be formed from at least a portion of each of third dielectric layer 1814, high kinetic inductance element 1812. Two electrodes can be formed from at least a portion of each first superconducting metal layer 1804 and second superconducting metal layer 1808.

A capacitor 1834 can be formed from at least a portion of sixth dielectric layer 1824, and two electrodes formed from at least a portion of each of fifth superconducting metal layer 1826 and fourth superconducting metal layer 1820. Capacitor 1834 can optionally include at least a portion of an additional flux storage layer. In one implementation, fifth superconducting metal layer 1826 can comprise at least one of niobium and aluminum. In some implementations, sixth dielectric layer 1824 can comprise SiN.

Figure 18J:
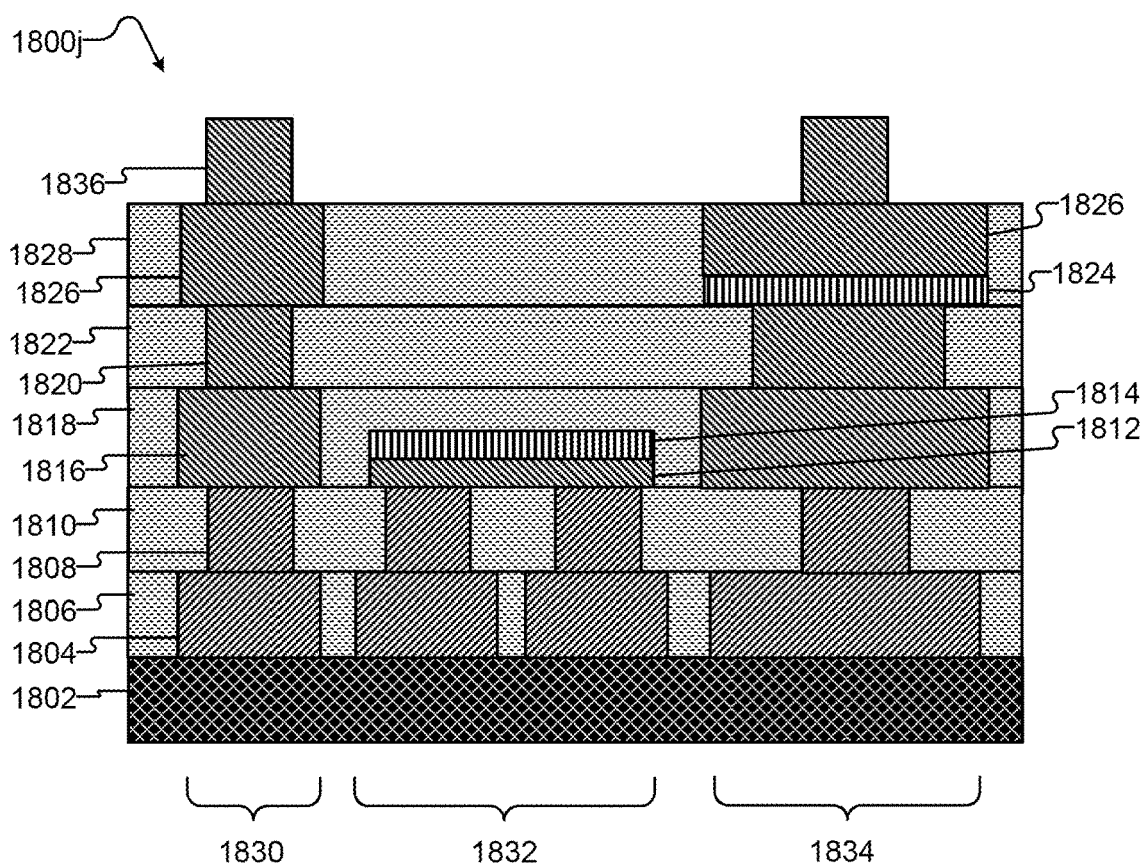

FIG. 18J is a sectional view of a portion of superconducting integrated circuit 1800j at a subsequent stage of a fabrication process. Circuit 1800j can be formed from circuit 1800i of FIG. 18I by depositing a sixth superconducting metal layer 1836 to overlie at least a portion of fifth superconducting metal layer 1826, and then masking and etching at least a portion of sixth superconducting metal layer 1836.

At least a portion of sixth superconducting metal layer 1836 can form a part of via wall 1830. Sixth superconducting metal layer 1836 can comprise at least one of niobium and aluminum.

Optionally, a thin dielectric layer (not shown) can be deposited on fifth superconducting metal layer 1826 as a protective layer, and the thin dielectric layer can be masked and etched to create one or more vias through which fifth superconducting metal layer 1826 and sixth superconducting metal layer 1836 can be electrically coupled.

While FIGS. 18A to 18J illustrate fabrication of an example implementation of a superconducting integrated circuit including a kinetic inductor at one level in the stack, and a capacitor at a higher level in the stack, other implementations can include a kinetic inductor at one level in the stack, and a capacitor at a lower level in the stack. In some implementations, a superconducting integrated circuit can include one or more kinetic inductors at one level in the stack, and one or more capacitors at a higher or lower level in the stack. Some implementations include one or more kinetic inductors and one or more capacitors at the same level in the stack. Thus, the kinetic inductor and capacitor can be in the same layer (FIG. 2), in different layers (FIG. 18), and in either of those implementations the capacitor can include or not include (omit) a flux storage layer.

Diffusion Assisted Oxidation

One approach to fabricating a Josephson junction in a superconducting integrated circuit, for example, is to use a trilayer construction such as a superconductor-insulator-superconductor (SIS) trilayer. In one implementation, the SIS trilayer is a Nb/Al—AlO$_x$/Nb trilayer, with superconducting upper and lower layers comprising niobium, and an intermediate layer comprising aluminum and a thin barrier layer of aluminum oxide. Trilayer Josephson junctions are described in more detail in U.S. Pat. No. 6,753,546, for example.

It can be desirable to have at least approximately uniform thickness of the barrier layer of aluminum oxide ($Al_2O_3$). The product of the normal state resistance of a Josephson junction and its area is referred to herein as the RnA. The RnA can be correlated with thickness of the barrier layer. Measurements of RnA across a wafer containing superconducting integrated circuits can exhibit a variability indicative of non-uniform thickness of the barrier layer.

The intermediate layer of the trilayer can be formed by depositing a layer of aluminum on the lower superconducting layer, and oxidizing the surface of the aluminum in an oxidation chamber to form a thin barrier layer of $Al_2O_3$. Non-uniform thickness of the barrier layer can result from uneven distribution of gaseous oxygen entering the oxidation chamber. More even distribution of oxygen in the oxidation chamber, and across each wafer, can improve the evenness of the thickness of $Al_2O_3$.

One or more gas diffusers in the oxygen supply to the oxidation chamber can be used to provide a more even distribution of oxygen, for example by adjusting the viscous and molecular flow characteristics of the gas. A gas diffuser may, for example, increase the area over which the gas is distributed once the supply reaches the oxidation chamber. A gas diffuser may, for example, reduce the directionality of flow of the oxygen gas as it enters the oxidation chamber. A gas diffuser may, for example, contribute to a more homogeneous distribution of oxygen in the oxidation chamber.

In one implementation, multiple wafers are stacked vertically in a wafer cassette in the oxidation chamber. One or more gas diffusers can be used to configure oxygen flow to the wafers to cause the barrier layer to have more uniform thickness across each wafer and/or between wafers, for example.

Fabrication of Long-Range Couplers

In some implementations such as implementations described in U.S. patent application Ser. No. 15/418,497, a superconducting integrated circuit can include one or more couplers. Some couplers provide communicative coupling between local or neighbouring qubits. Local or neighbouring qubits may belong to the same subtopology of a topology of qubits and associated couplers. Other couplers are long-range couplers that provide communicative coupling between qubits situated farther apart than local or neighbouring qubits. Long-range couplers may provide communicative coupling between qubits belonging to different subtopologies in the topology.

A long-range coupler can be fabricated in a superconducting integrated circuit using one or more fabrication layers dedicated to the long-range coupler.

One advantage of using dedicated fabrication layers for the long-range coupler is that intersections between the long-range coupler and other couplers such as local couplers are more readily avoided. Adding fabrication layers for the long-range coupler increases the effective dimensionality of the superconducting integrated circuit which can provide greater topological flexibility, in particular for greater connectivity, for example.

Another advantage of using dedicated fabrication layers for the long-range coupler is that materials used in fabrication of the long-range coupler can be different to those used in fabrication of qubits and/or local couplers. For example, there can be a performance benefit to using a dielectric surrounding the superconducting metal layers of the long-range coupler that has a lower dielectric constant than the dielectric constant of the dielectric surrounding the superconducting metal layers of other devices such as qubits and/or local couplers.

In one implementation, qubits and/or local couplers are fabricated using niobium superconducting metal layers surrounded by a low-temperature, high-density plasma chemical vapor deposited SiOx dielectric. The dielectric constant of this first dielectric can be in the range $5.5\varepsilon_0$ to $6\varepsilon_0$. The first dielectric is selected at least in part to be a low-noise dielectric since noise can affect performance of devices such as qubits.

In the same implementation, a long-range coupler is fabricated using niobium superconducting metal layers surrounded by a second dielectric with a dielectric constant of $<4\varepsilon_0$. While the second dielectric may be more noisy, a benefit of a lower dielectric constant is that it can decrease device capacitance—in this case, capacitance of the long-range coupler—and thereby increase the potential range of the long-range coupler.

Certain aspects of the present systems and methods may be realized at room temperature, and certain aspects may be realized at a superconducting temperature. Thus, throughout this specification and the appended claims, the term "superconducting" when used to describe a physical structure such as a "superconducting metal" is used to indicate a material that is capable of behaving as a superconductor at an appropriate temperature. A superconducting material may not necessarily be acting as a superconductor at all times in all embodiments of the present systems and methods.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other superconductive circuits and structures, not necessarily the exemplary superconductive circuits and structures generally described above.

The various embodiments described above can be combined to provide further embodiments. To the extent that they are not inconsistent with the specific teachings and definitions herein, all of the U.S. patents, U.S. patent application publications, U.S. patent applications, U.S. Provisional Patent Application No. 62/453,358, foreign patents, foreign patent applications assigned D-Wave Systems Inc. referred to in this specification and/or listed in the Application Data Sheet, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for fabricating a superconducting integrated circuit, the method comprising:

depositing a first superconducting metal layer on a substrate, the first superconducting metal layer which is superconductive in a respective range of temperatures;

patterning the first superconducting metal layer to form a first wiring layer, the first wiring layer comprising a first set of one or more superconducting traces;

depositing a second superconducting metal layer to overlie at least a portion of the first wiring layer, the second superconducting metal layer which is superconductive in a respective range of temperatures;

patterning the second superconducting metal layer to form a first plurality of superconducting stud vias in the second superconducting metal layer, each superconducting stud via of the first plurality of superconducting stud vias electrically coupled to at least one of the traces in the first set of one or more superconducting traces;

depositing a kinetic inductance layer to overlie at least two of the first plurality of superconducting stud vias, wherein the kinetic inductance layer comprises a material superconductive in a respective range of temperatures, the material which causes a larger proportion of energy stored in the kinetic inductance layer to be stored as kinetic inductance than magnetic inductance, and patterning the kinetic inductance layer to form a kinetic inductor comprising two electrodes, each electrode formed by a respective superconducting stud via of the first plurality of superconducting stud vias, and each electrode electrically coupled to at least one of the traces in the first set of one or more superconducting traces.

2. The method of claim 1 wherein depositing a first superconducting metal layer on a substrate includes depositing a first superconducting metal layer on a substrate comprising silicon.

3. The method of claim 1 wherein depositing a first superconducting metal layer includes depositing a first superconducting metal layer comprising at least one of niobium and aluminum.

4. The method of claim 1 wherein depositing a first superconducting metal layer includes depositing a first superconducting metal layer consisting of niobium.

5. The method of claim 1 wherein depositing a second superconducting metal layer includes depositing a second superconducting metal layer comprising at least one of aluminum and niobium.

6. The method of claim 1 wherein depositing a kinetic inductance layer includes depositing a kinetic inductance layer comprising at least one of titanium nitride (TiN), niobium nitride (NbN), niobium titanium nitride (NbTiN), molybdenum nitride (MoN), and tungsten silicide (WSi).

7. The method of claim 6 wherein depositing a kinetic inductance layer comprising at least one of titanium nitride (TiN), niobium nitride (NbN), niobium titanium nitride (NbTiN), molybdenum nitride (MoN), and tungsten silicide (WSi) includes depositing a kinetic inductance layer with a thickness in the range of 25 nm to 100 nm.

8. The method of claim 1 wherein depositing a kinetic inductance layer includes depositing a kinetic inductance layer consisting of titanium nitride (TiN).

9. The method of claim 1 further comprising depositing a first passivation layer to overlie at least a portion of the kinetic inductor.

10. The method of claim 9 wherein depositing a first passivation layer includes depositing a first passivation layer comprising silicon nitride (SiN).

11. The method of claim 9, further comprising:
depositing a third superconducting metal layer to overlie at least a portion of the first passivation layer, the third superconducting metal layer which is superconductive in a respective range of temperatures; and patterning the third superconducting metal layer to form a second wiring layer, the second wiring layer comprising a second set of one or more superconducting traces.

12. The method of claim 11 wherein depositing a third superconducting metal layer includes depositing a third superconducting metal layer comprising niobium.

13. The method of claim 11 wherein patterning the third superconducting metal layer includes patterning the third superconducting metal layer to electrically couple at least one of the traces in the second set of one or more superconducting traces to at least one of the traces in the first set of one or more superconducting traces by a respective superconducting stud via of the first plurality of stud vias.

14. The method of claim 11 wherein patterning the third superconducting metal layer includes patterning the third superconducting metal layer to form a capacitor, the capacitor comprising:

a first electrode formed by a superconducting stud via of the first plurality of superconducting stud vias; and a second electrode formed by at least a portion of one of the traces in the second set of one or more superconducting traces, wherein the first and the second electrodes are separated by at least a portion of the first passivation layer, and by at least a portion of the kinetic inductance layer.

15. The method of claim 11, further comprising:
depositing a fourth superconducting metal layer to overlie at least a portion of the second wiring layer, the fourth superconducting metal layer which is superconductive in a respective range of temperatures; and patterning the fourth superconducting metal layer to form a second plurality of superconducting stud vias, each superconducting stud via of the second plurality of superconducting stud vias electrically coupled to at least one of the traces in the second set of one or more superconducting traces.

16. The method of claim 15, further comprising:
depositing a second passivation layer to overlie at least a portion of the fourth superconducting metal layer, either with or without an intermediary layer;

depositing a fifth superconducting metal layer to overlie at least a portion of the second passivation layer, the fifth superconducting metal layer which is superconductive in a respective range of temperatures; and patterning the fifth superconducting metal layer to form a third wiring layer, the third wiring layer comprising a third set of one or more superconducting traces.

17. The method of claim 16 wherein depositing a fifth superconducting metal layer includes depositing a fifth superconducting metal layer comprising at least one of niobium and aluminum.

18. The method of claim 17 wherein patterning the fifth superconducting metal layer includes patterning the fifth superconducting metal layer to electrically couple at least one of the traces in the third set of one or more superconducting traces to at least one of the traces in the second set of one or more superconducting traces by a respective superconducting stud via of the second plurality of stud vias.

19. The method of claim 17 wherein patterning the fifth superconducting metal layer includes patterning the fifth superconducting metal layer to form a capacitor, the capacitor comprising:
- a first electrode formed by at least a portion of one of the traces in the third set of one or more superconducting traces; and
- a second electrode formed by a superconducting stud via of the second plurality of superconducting vias, wherein the first and the second electrodes are separated by at least a portion of the second passivation layer.

20. A superconducting integrated circuit comprising:
- a first wiring layer comprising a first set of one or more superconducting traces overlying a substrate, the first wiring layer which is superconductive in a respective range of temperatures;
- a kinetic inductor, the kinetic inductor comprising at least two electrodes and a kinetic inductance layer, each of the at least two electrodes comprising a respective superconducting stud via of a first plurality of superconducting stud vias, the superconducting stud vias which are superconductive in a respective range of temperatures, each superconducting stud via of the first plurality of superconducting stud vias electrically coupled to one or more superconducting traces in the first set of one or more superconducting traces, and the kinetic inductance layer overlying the superconducting stud vias of the at least two electrodes
wherein the kinetic inductance layer comprises a material superconductive in a respective range of temperatures, the material which causes a larger proportion of energy stored in the kinetic inductance layer to be stored as kinetic inductance than magnetic inductance.

21. The superconducting integrated circuit of claim 20 wherein the kinetic inductance layer comprises titanium nitride (TiN).

22. The superconducting integrated circuit of claim 20 further comprising a passivation layer overlying at least a portion of the kinetic inductance layer.

23. The superconducting integrated circuit of claim 22 wherein the passivation layer comprises silicon nitride (SiN).

24. The superconducting integrated circuit of claim 20, further comprising a second wiring layer, the second wiring layer comprising a second set of one or more superconducting traces, the one or more superconducting traces of the second wiring layer which are superconductive in a respective range of temperatures, wherein at least one of the superconducting traces in the second set of one or more superconducting traces is electrically coupled to at least one of the superconducting traces in the first set of one or more superconducting traces by at least one of the superconducting stud vias of the first plurality of superconducting stud vias.

25. The superconducting integrated circuit of claim 20, further comprising a second wiring layer, the second wiring layer comprising a second set of one or more superconducting traces, the one or more superconducting traces of the second wiring layer which are superconductive in a respective range of temperatures; and
- a capacitor, the capacitor comprising:
  - a first electrode formed by at least a portion of one of the traces in the first set of one or more superconducting traces; and
  - a second electrode formed by at least a portion of one of the traces in the second set of one or more superconducting traces, wherein the first and the second electrodes are separated by at least a portion of the passivation layer.

* * * * *